United States Patent
Hara et al.

(10) Patent No.: US 11,971,681 B2
(45) Date of Patent: Apr. 30, 2024

(54) COUPLING STRUCTURE OF SHEET METALS IN IMAGE FORMING APPARATUS

(71) Applicant: CANON KABUSHIKI KAISHA, Tokyo (JP)

(72) Inventors: Yoshiaki Hara, Chiba (JP); Motoki Koshigaya, Saitama (JP); Manabu Hada, Tokyo (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 17/939,207

(22) Filed: Sep. 7, 2022

(65) Prior Publication Data

US 2023/0101172 A1  Mar. 30, 2023

(30) Foreign Application Priority Data

Sep. 17, 2021  (JP) ................... 2021-151976

(51) Int. Cl.
  *G03G 21/00* (2006.01)
  *F16B 5/00* (2006.01)
  (Continued)

(52) U.S. Cl.
  CPC .......... *G03G 21/1652* (2013.01); *F16B 5/02* (2013.01); *G03G 15/80* (2013.01); *H05K 5/0052* (2013.01);
  (Continued)

(58) Field of Classification Search
  CPC ............... G03G 15/80; G03G 21/1652; G03G 2215/00978; G03G 2221/166; F16B 5/02;
  (Continued)

(56) References Cited

U.S. PATENT DOCUMENTS

| | | | | |
|---|---|---|---|---|
| 4,023,882 A | * | 5/1977 | Pettersson | ................ H01R 4/26 439/587 |
| 2007/0193985 A1 | | 8/2007 | Howard et al. | |

(Continued)

FOREIGN PATENT DOCUMENTS

| | | | | |
|---|---|---|---|---|
| DE | 102005010044 A1 | * | 9/2006 | ............... H01R 4/34 |
| JP | 2003283154 A | * | 10/2003 | |

(Continued)

OTHER PUBLICATIONS

Extended European search report issued in European Appln. No. 22194333.5 dated Feb. 15, 2023.

*Primary Examiner* — Robert B Beatty
(74) *Attorney, Agent, or Firm* — ROSSI, KIMMS & McDOWELL LLP

(57) ABSTRACT

A coupling structure is provided in an image forming apparatus that forms an image on a recording material and constituted to couple a first sheet metal and a second sheet metal having an insulative layer on a surface of a metal layer, respectively. The coupling structure includes a first conductive portion, a second conductive portion and a coupling portion. The metal layer of the first conductive portion is exposed by the insulative layer being exfoliated by laser working in the first sheet metal. The metal layer of the second conductive portion is exposed by the insulative layer being exfoliated by laser working in the second sheet metal. The coupling portion couples the first sheet metal and the second sheet metal in a state in which at least a part of the first conductive portion and at least a part of the second conductive portion are contacted with each other.

19 Claims, 42 Drawing Sheets

(51) Int. Cl.
    *F16B 5/02* (2006.01)
    *G03G 15/00* (2006.01)
    *G03G 21/16* (2006.01)
    *H05K 5/00* (2006.01)
    *B41J 29/02* (2006.01)

(52) U.S. Cl.
    CPC ........... *B41J 29/02* (2013.01); *F16B 2200/93* (2023.08); *G03G 21/1619* (2013.01); *G03G 2221/166* (2013.01)

(58) Field of Classification Search
    CPC . F16B 2043/008; F16B 2200/93; H05K 5/02; H05K 5/0008; H05K 5/0052; H05K 5/0073; H05K 9/0039
    USPC .......................................................... 399/90
    See application file for complete search history.

(56) References Cited

U.S. PATENT DOCUMENTS

| | | | |
|---|---|---|---|
| 2011/0116893 A1 | 5/2011 | Hayashi et al. | |
| 2012/0307411 A1* | 12/2012 | Horie | G03G 21/1652 361/212 |
| 2023/0089894 A1* | 3/2023 | Tomono | G03G 15/80 324/133 |

FOREIGN PATENT DOCUMENTS

| | | | | |
|---|---|---|---|---|
| JP | 2007073758 A | | 3/2007 | |
| JP | 2009150478 A | * | 7/2009 | |
| JP | 2017228624 A | | 12/2017 | |
| WO | WO-2018171895 A1 | * | 9/2018 | .............. F16B 43/00 |

\* cited by examiner (a)

(b)

(a)

(b)

(a)

(b)

(a)

(b)

(a)

(b)

(a)

(b)

(a)

(b)

(c) (d)

(a)

(b)

(a)

(b)

(a)

(b)

COUPLING STRUCTURE OF SHEET METALS IN IMAGE FORMING APPARATUS

FIELD OF THE INVENTION AND RELATED ART

The present invention relates to a coupling structure which couples sheet metals which are used in an image forming apparatus.

Conventionally, in image forming apparatuses including communication devices such as fax machines and photocopiers as well as various electronic devices, conductive metal parts such as sheet metal are used to assemble a framework which is a base of a device casing. In recent years, various communication standards (Ethernet, WiFi, Bluetooth Bluetooth, USB, etc.) are prepared, and EMI (Electro-Magnetic Interference) factors of electronic circuit boards operating at various frequencies, such as higher CPU operating frequencies, etc., are becoming increasingly complex. These improvements in information processing and communication functions lead to an increase in power consumption, and lower voltage of power sources for electronic circuits are widespread in order to achieve power savings. However, circuits which operate at low voltages have low signal amplitude voltages, and applying even static electricity, which is not a problem conventionally, may cause malfunctions, and effects of ESD (Electro-Static Discharge) are relatively large. As described above, EMI and ESD countermeasures for electronic circuit boards, which are achieving higher functionality in recent years, become very difficult, and it is essential to take countermeasures not only for electronic circuit boards but also for an entire apparatus system, including conductive metal parts such as sheet metal.

Sheet metal is constituted of layered structure to increase rigidity and processability, and current sheet metal for conductive metal parts is mostly steel sheet (chrome-free steel sheet) with a resin coated layer. The resin coated layer is an insulating film of several micrometers, and therefore the sheet metal is corrosion resistant such as rustproofing. On the other hand, the insulating film impairs conductivity when connecting sheet metal to sheet metal (or sheet metal to an electronic circuit board), and is one factor preventing stable grounding. Therefore, even if the device is apparently covered with sheet metal, radiated noise may leak out and ESD immunity may be degraded.

Even in a case that such chrome-free steel plates are used, to achieve stable grounding, a technique is used to ground by sliding a leading end of one sheet metal to scrape off the resin coated layer of the other sheet metal to expose a metal inside when the sheet metals are joined by screw members (Japanese Laid-Open Patent Application (JP-A) 2007-73758).

However, in a coupling structure in which the resin coated layer is scraped off by sliding and metal portions are connected as in JP-A 2007-73758 which is described above, conduction may be unstable since a degree of conduction varies depending on unevenness of thickness of the resin coated layer. This may prevent stable grounding by coupling.

A object of the present invention is to provide a coupling structure and an image forming apparatus which is capable of achieving electrically stable grounding in a coupling structure between sheet metals which are used in the image forming apparatus.

SUMMARY OF THE INVENTION

A coupling structure of the present invention is provided in an image forming apparatus that forms an image on a recording material and constituted to couple a first sheet metal and a second sheet metal having an insulative layer on a surface of a metal layer which is made of metal, respectively, the coupling structure comprising, a first conductive portion of which the metal layer is exposed by the insulative layer being exfoliated by laser working in the first sheet metal, a second conductive portion of which the metal layer is exposed by the insulative layer being exfoliated by laser working in the second sheet metal and a coupling portion constituted to couple the first sheet metal and the second sheet metal in a state in which at least a part of the first conductive portion and at least a part of the second conductive portion are contacted with each other.

Further a coupling structure of the present invention is provided in an image forming apparatus that forms an image on a recording material and constituted to couple a first sheet metal and a second sheet metal having an insulative layer on a surface of a metal layer which is made of metal, respectively, the coupling structure comprising, a first through hole formed in the first sheet metal, a second through hole formed in the second sheet metal; and a screw member includes a head portion having a seat surface and a screw portion inserted into the first through hole and the second through hole, and constituted to fasten the first sheet metal and the second sheet metal, wherein a diameter of the first through hole is smaller than a diameter of the head portion, a diameter of the second through hole is smaller than the diameter of the first through hole, the first sheet metal includes a conductive portion formed around the first through hole and exposing the metal layer by the insulative layer being exfoliated by laser working, and the screw portion of the screw member is screwed in the second through hole so that the seat surface comes in contact with the conductive portion.

Further, a coupling structure of the present invention is provided in an image forming apparatus that forms an image on a recording material and constituted to couple a sheet metal member having an insulative layer on a surface of a metal layer which is made of metal and a control board, the coupling structure comprising, a first conductive portion from which the insulative layer is exfoliated by laser working in the sheet metal and of which the metal layer is exposed, a second conductive portion formed on the control board, and a coupling portion constituted to couple the sheet metal member and the control board in a state in which at least a part of the first conductive portion and at least a part of the second conductive portion are contacted with each other.

Further features of the present invention will become apparent from the following description of exemplary embodiments with reference to the attached drawings.

Figure 5:
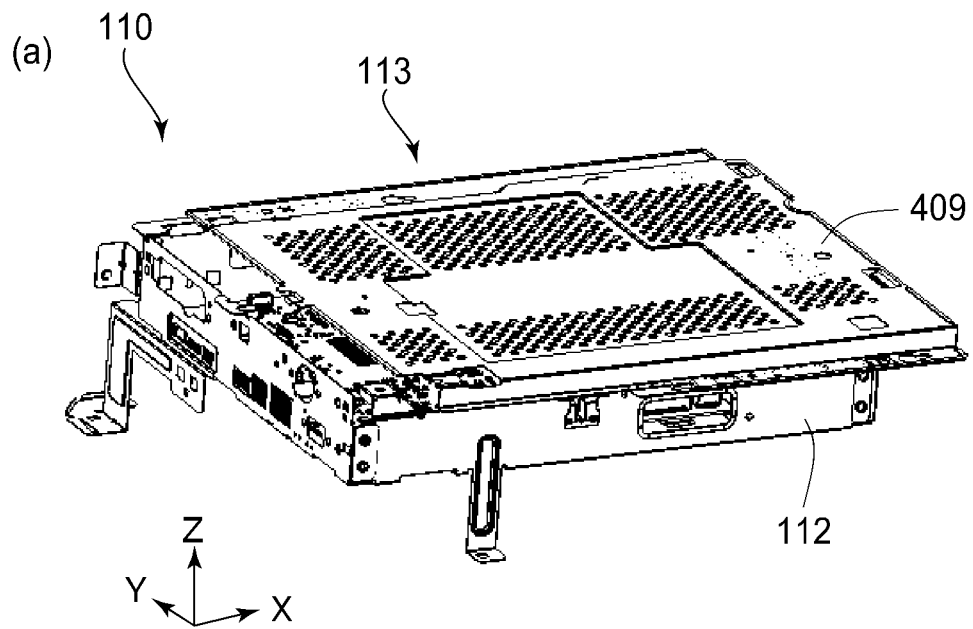
Figure 5:
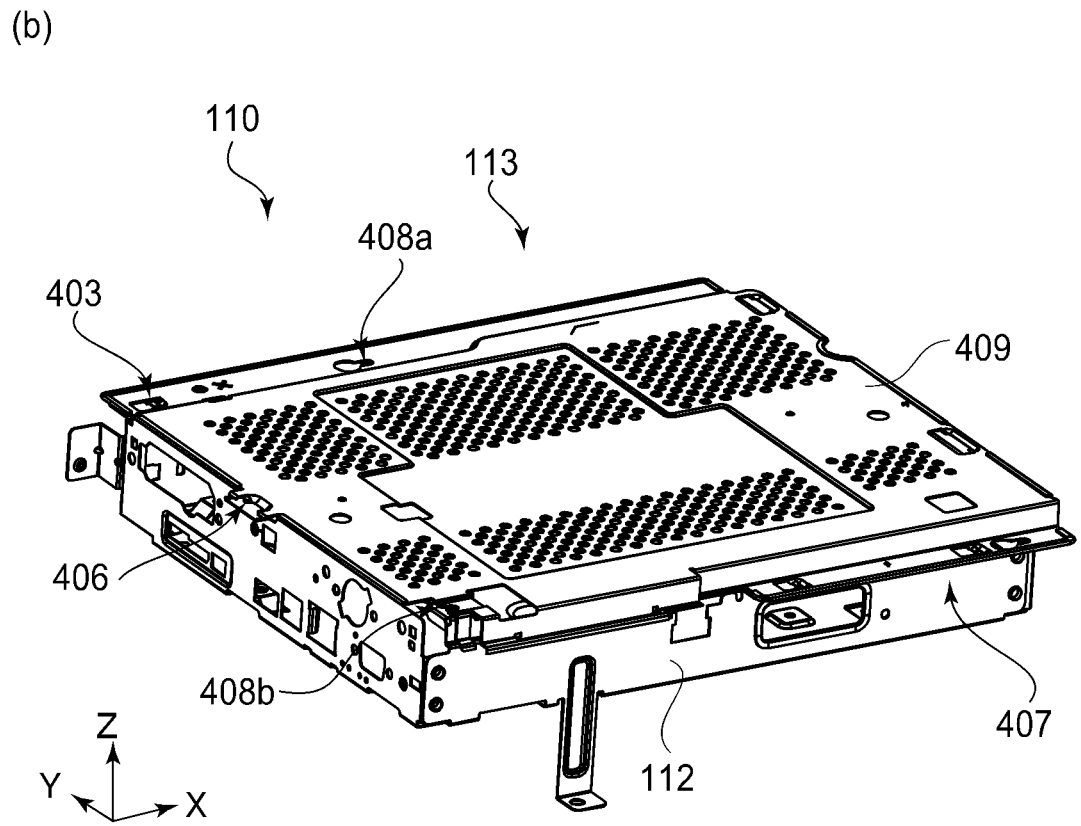

Part (a) and part (b) of FIG. 5 are perspective views showing the box shaped sheet metal and the top plate according to the first embodiment of the present invention, part (a) of FIG. 5 is a state of a mounting process, and part (b) of FIG. 5 is in a state after mounting.

Figure 6:
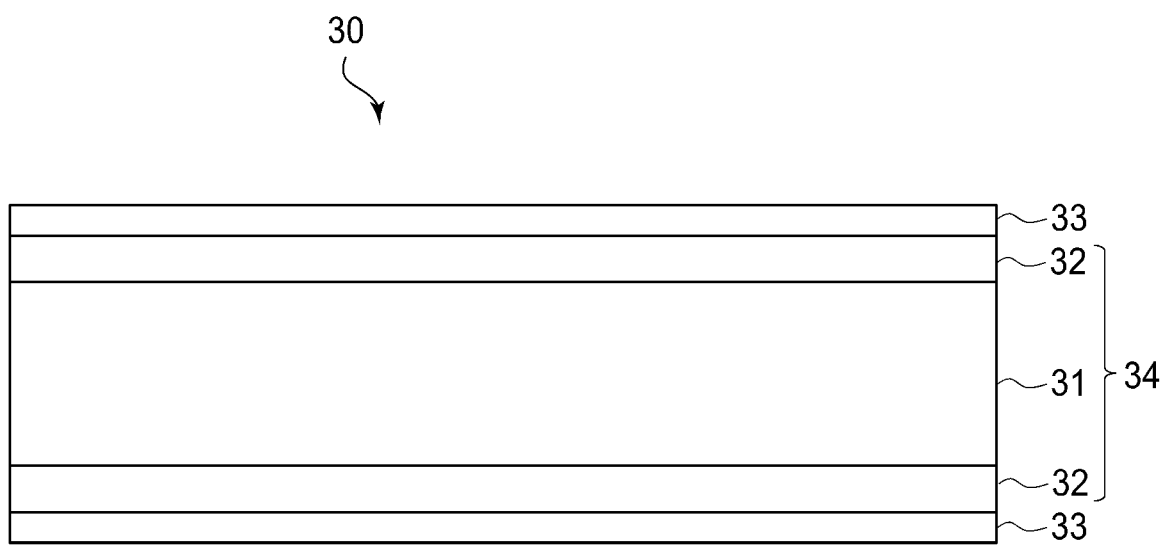

FIG. 6 is a sectional view of an electrogalvanized steel plate which is used in the first embodiment of the present invention.

Figure 7:
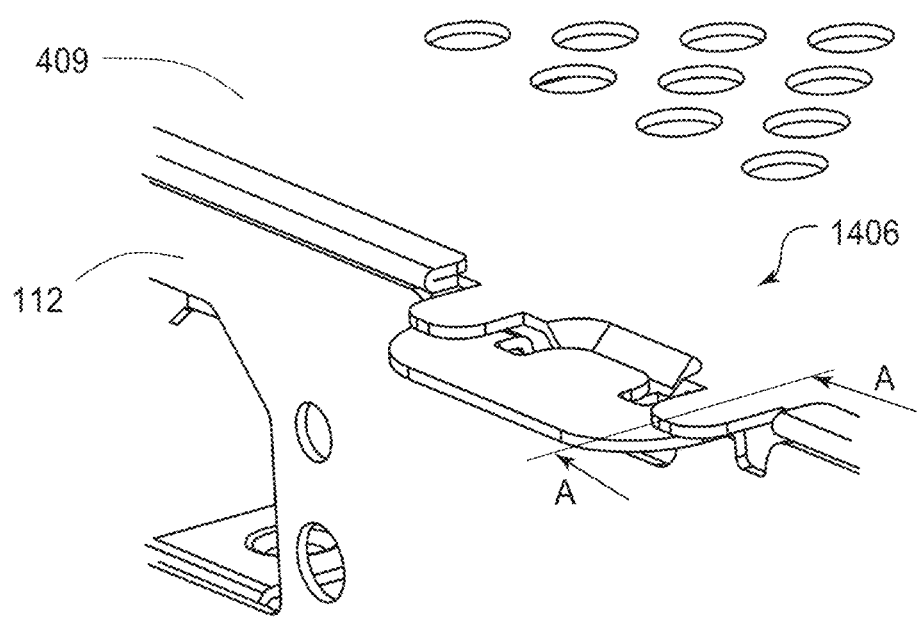

FIG. 7 is a perspective view showing a conventional contact portion between a top plate and a box shaped sheet metal.

Figure 8:
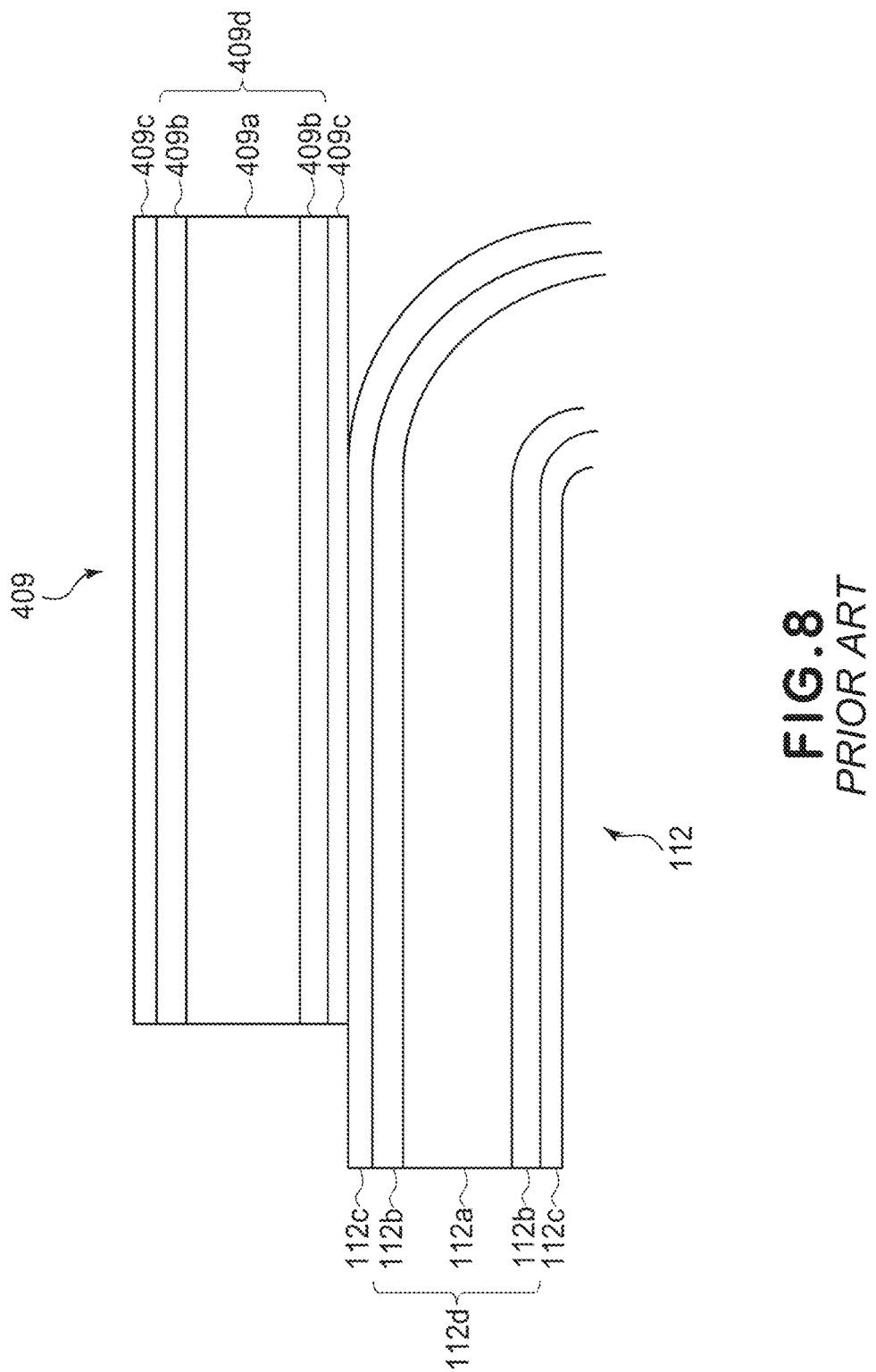

FIG. 8 is a sectional view showing a state when they are cut along line A-A in FIG. 7.

Figure 9:
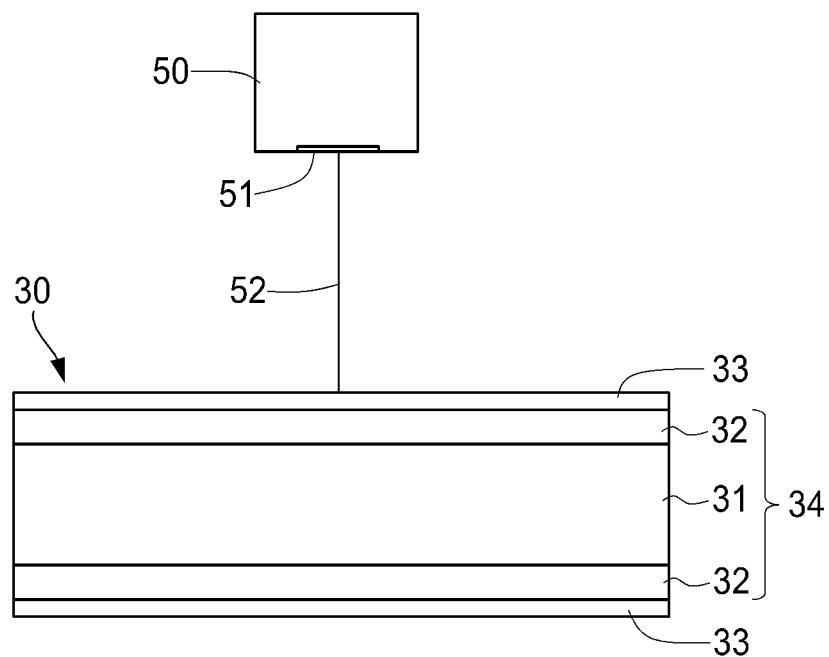
Figure 9:
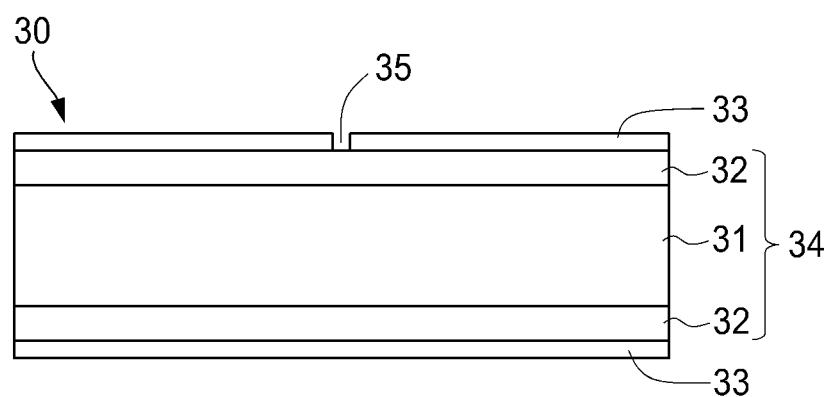

Part (a) and part (b) of FIG. 9 are sectional views showing a state that laser processing is performed on the electrogalvanized steel plate which is used in the first embodiment of the present invention, part (a) of FIG. 9 is showing a state in which the laser is emitted without moving, and part (b) of FIG. 9 is showing a state in which a conductive portion is formed by emitting the laser without moving.

Figure 10:
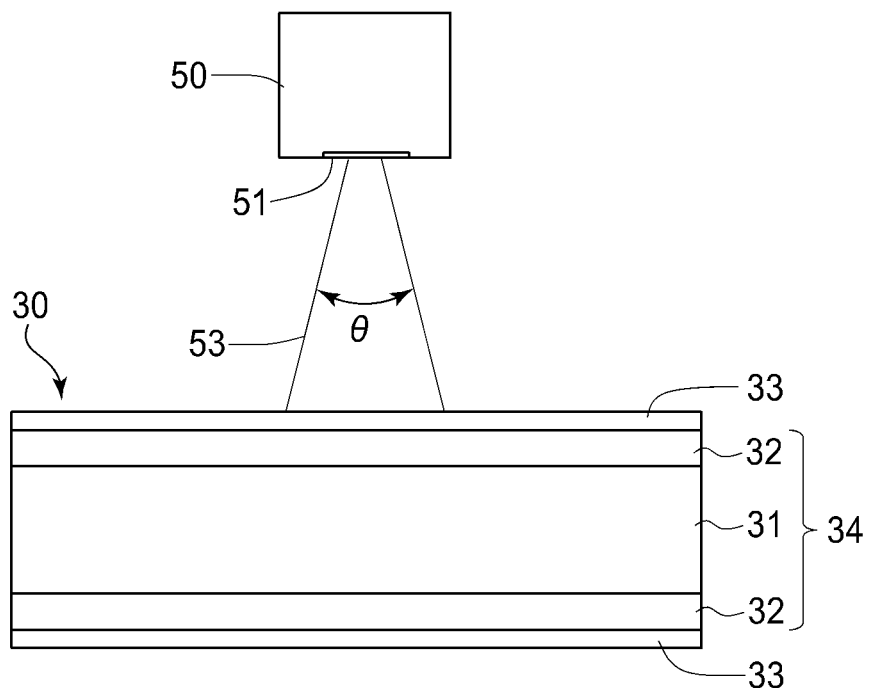
Figure 10:
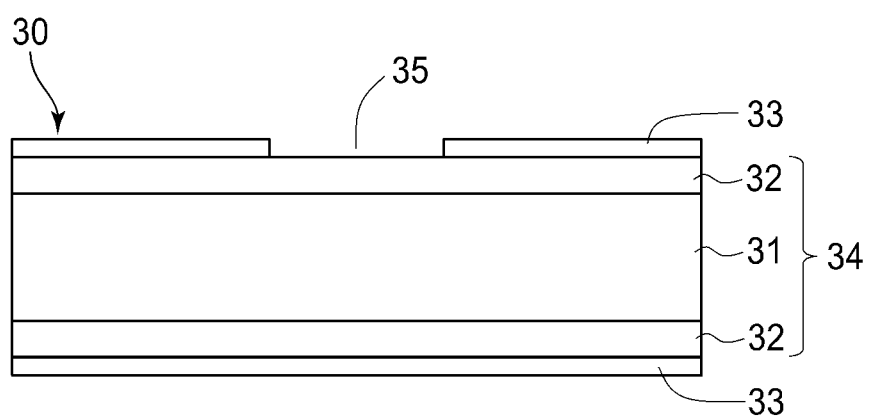

Part (a) and part (b) of FIG. 10 are sectional views showing a state that laser processing is performed on the electrogalvanized steel plate which is used in the first embodiment of the present invention, part (a) of FIG. 10 is showing a state in which the laser is emitted while moving, and part (b) of FIG. 10 is showing a state in which a conductive portion is formed by emitting the laser while moving.

Figure 11:
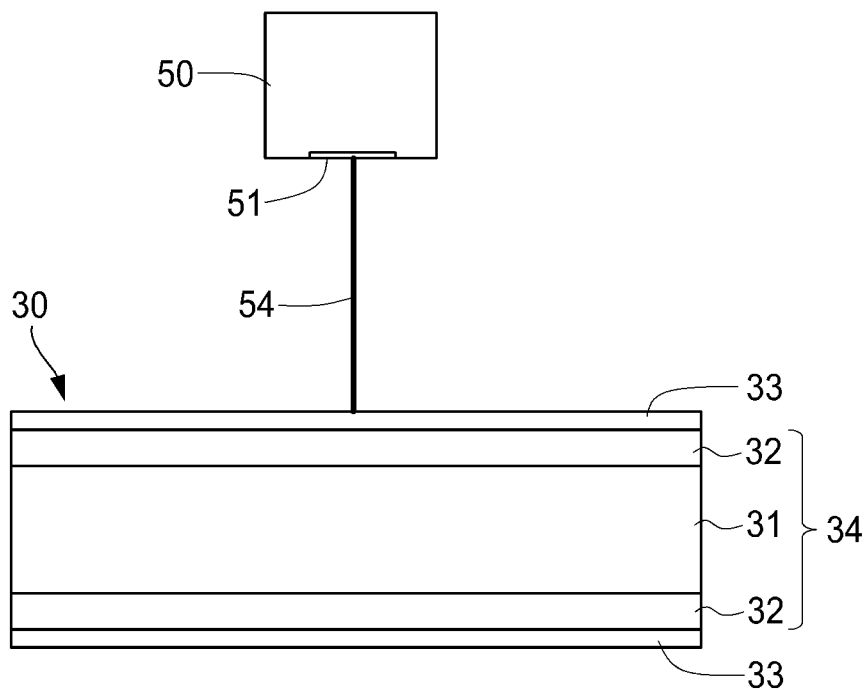
Figure 11:
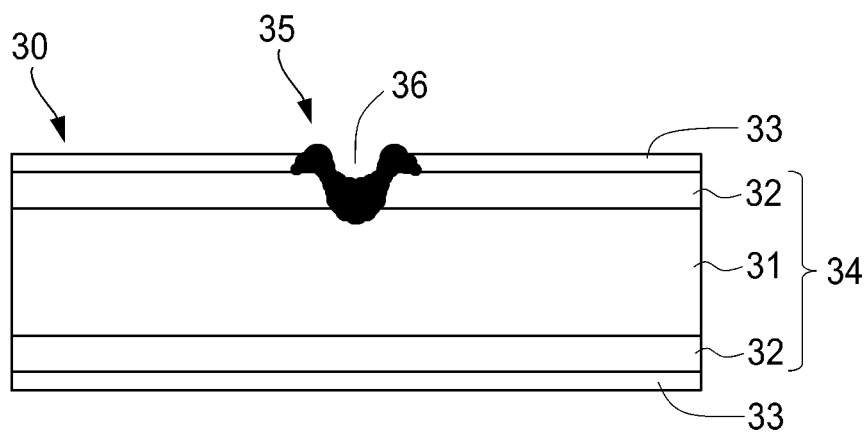

Part (a) and part (b) of FIG. 11 are sectional views showing a state that laser processing is performed on the electrogalvanized steel plate which is used in a third embodiment of the present invention, part (a) of FIG. 11 is showing a state in which high power laser is emitted, and part (b) of FIG. 11 is showing a state in which a conductive portion is formed by emitting the high power laser.

Figure 12:
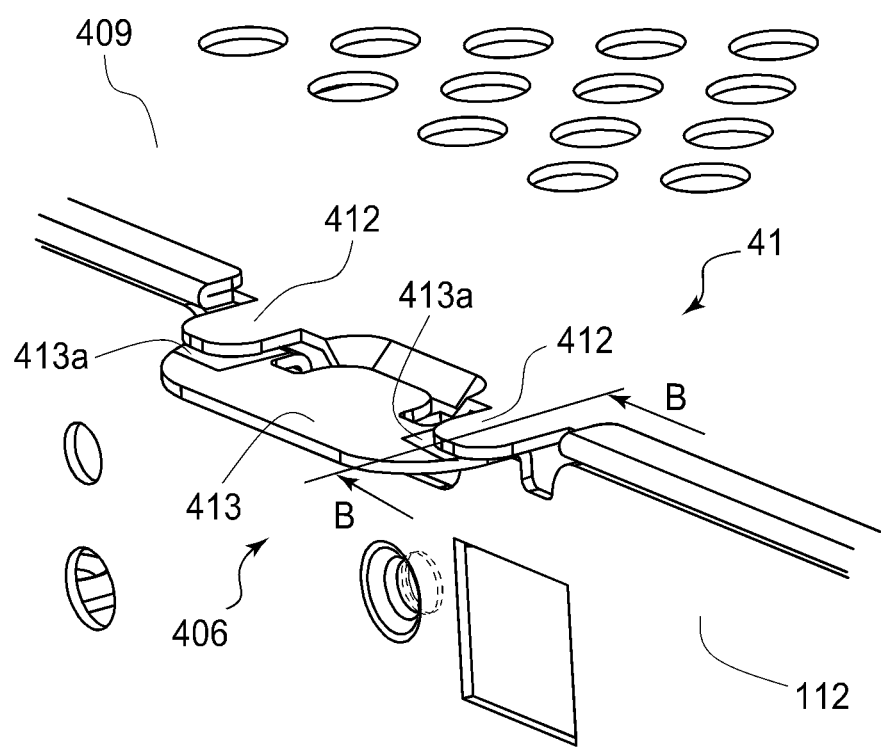

FIG. 12 is a perspective view showing a contact portion between the top plate and the box shaped sheet metal according to the first embodiment of the present invention.

Figure 13:
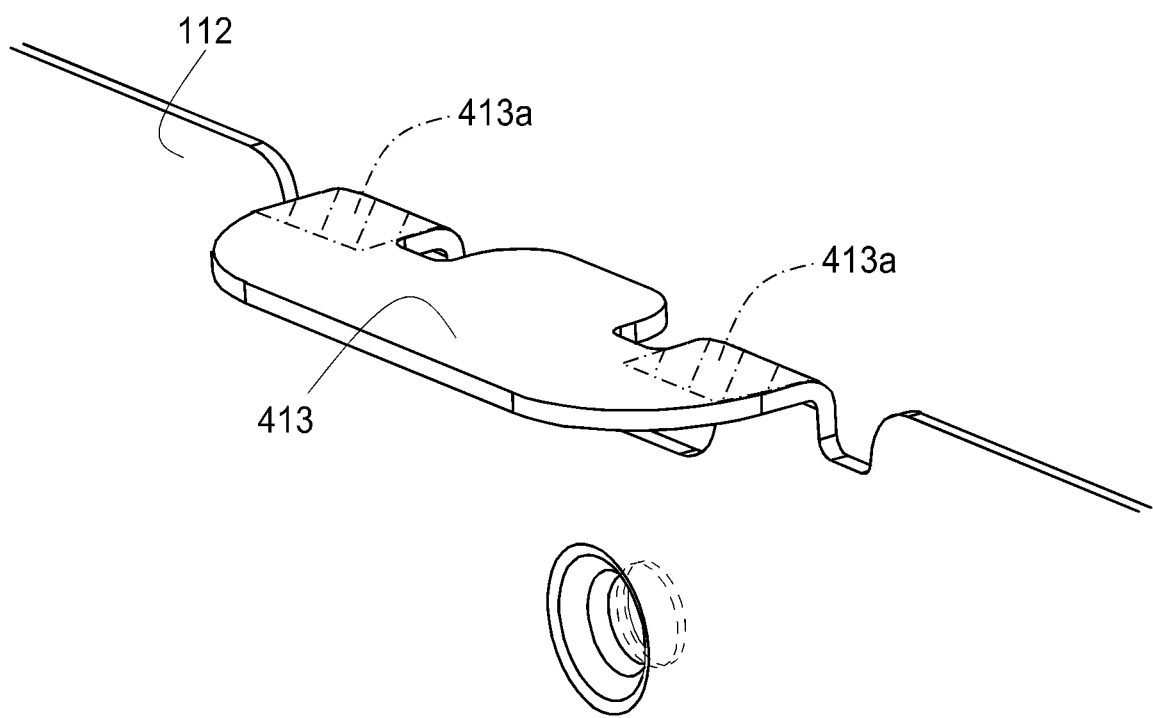

FIG. 13 is a perspective view showing a conductive portion of the box shaped sheet metal according to the first embodiment of the present invention.

Figure 14:
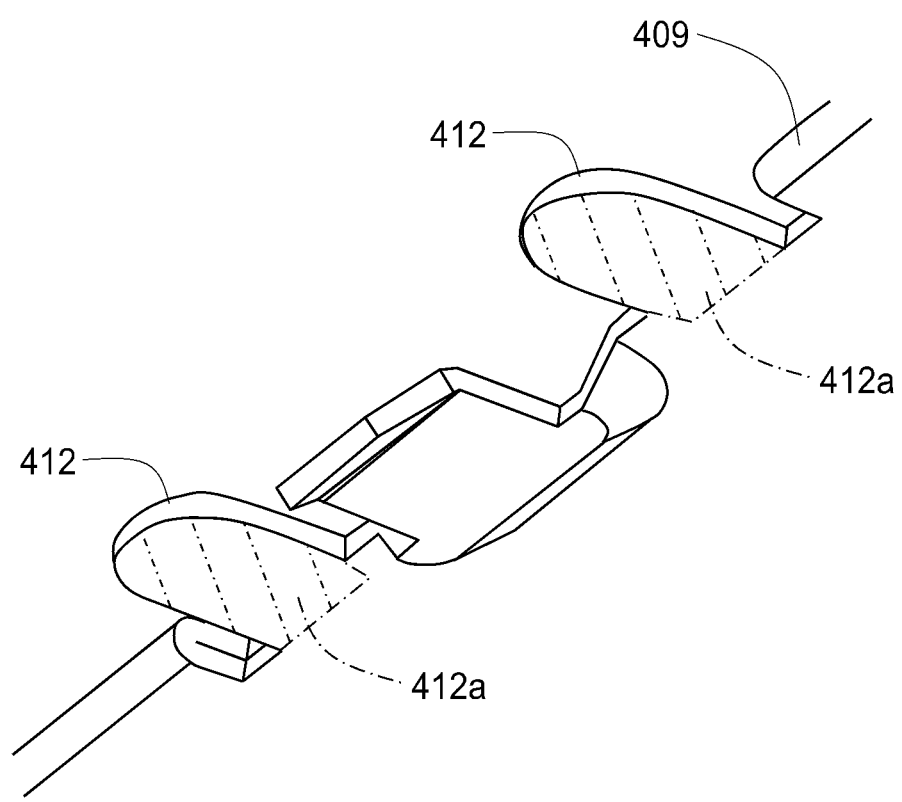

FIG. 14 is a perspective view showing a conductive portion of the top plate according to the first embodiment of the present invention.

Figure 15:
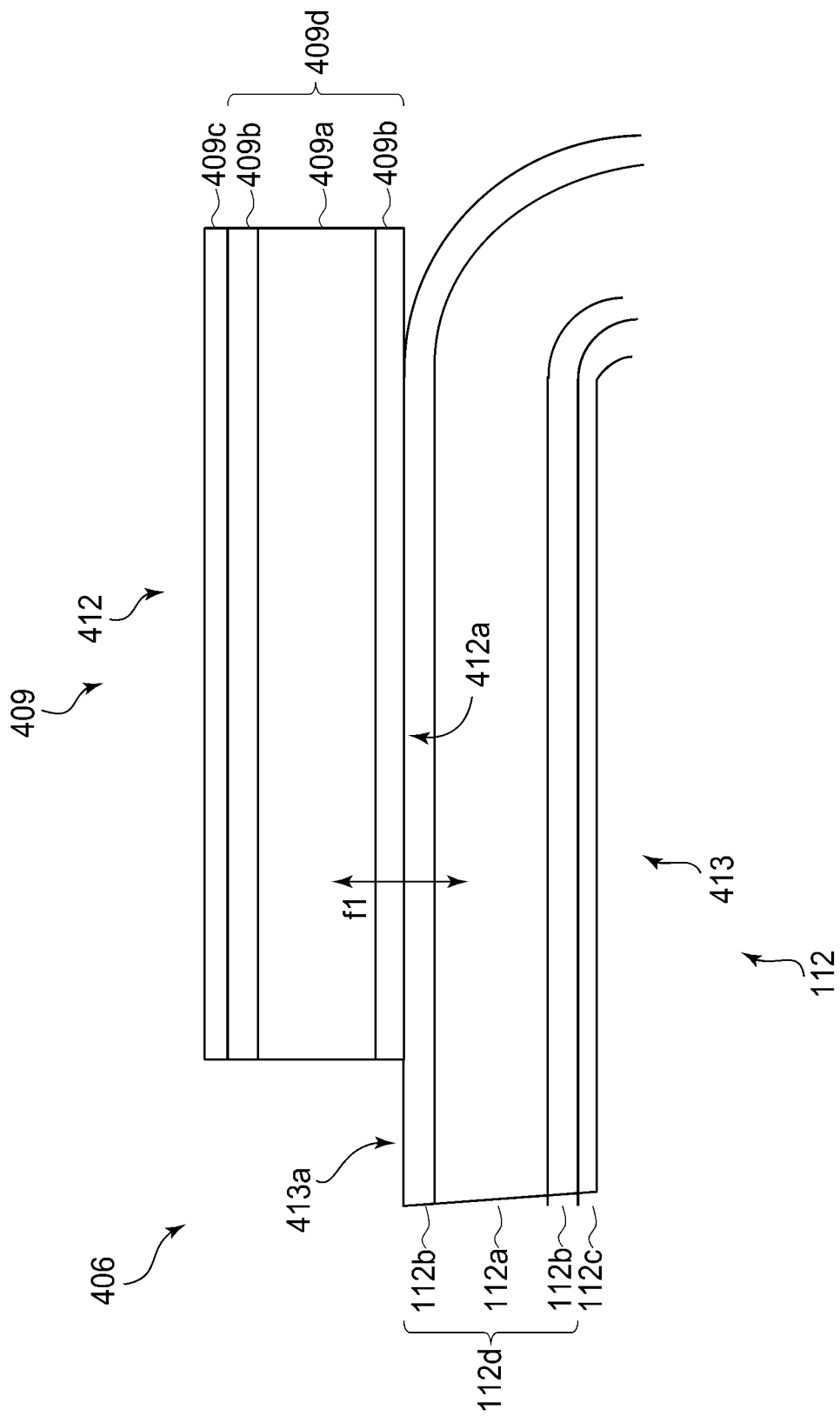

FIG. 15 is a sectional view showing a state when they are cut along line B-B in FIG. 12.

Figure 16:
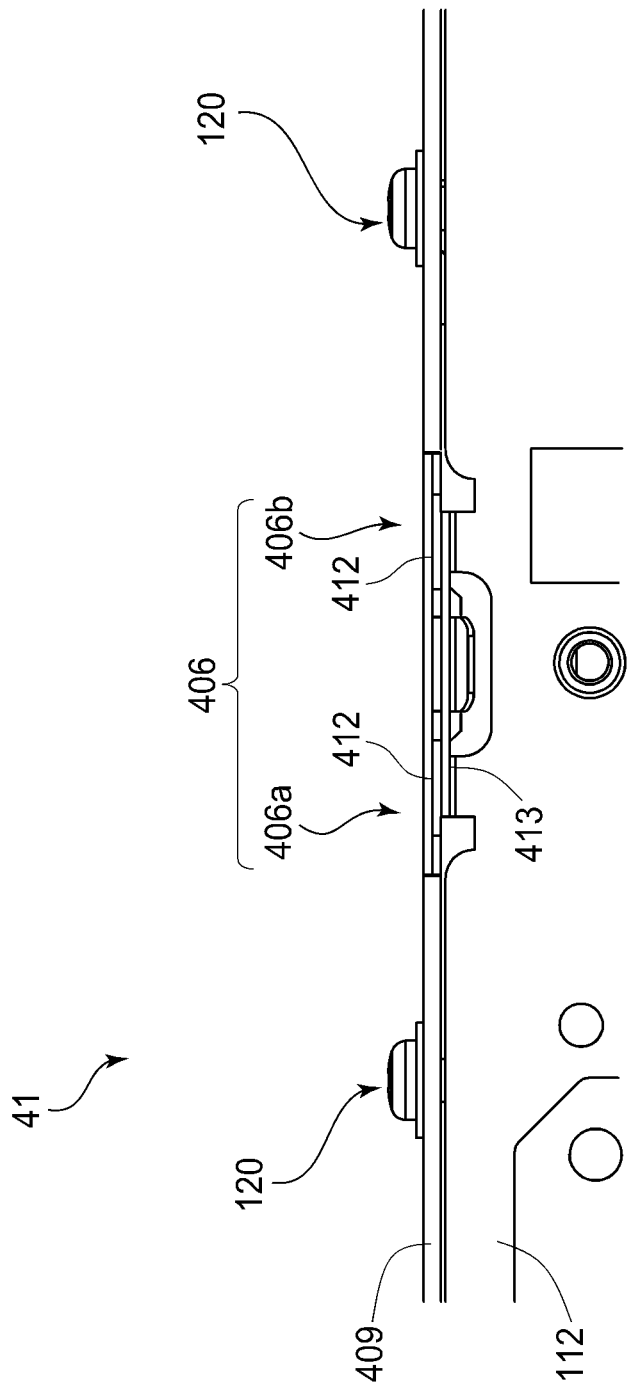

FIG. 16 is a side view showing the contact portion between the top plate and the box shaped sheet metal according to the first embodiment of the present invention.

Figure 17:
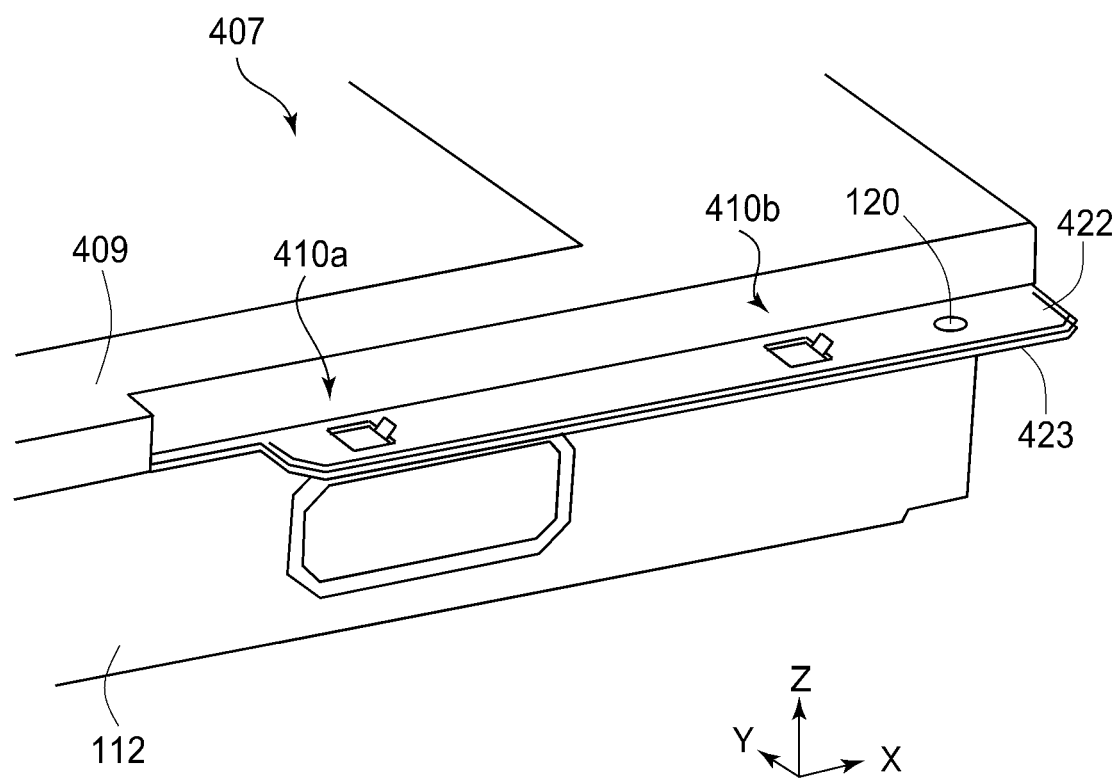

FIG. 17 is a perspective view showing another contact portion between the top plate and the box shaped sheet metal according to the first embodiment of the present invention.

Figure 18:
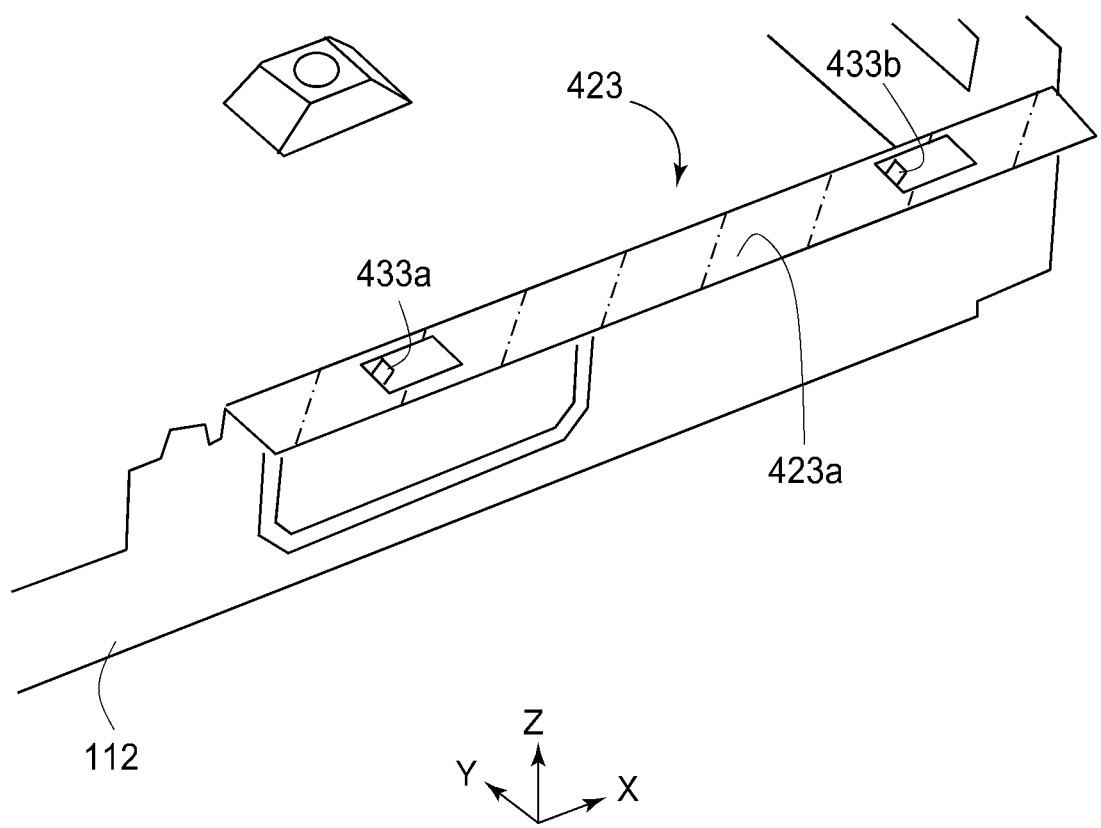

FIG. 18 is a perspective view showing another conductive portion of the box shaped sheet metal according to the first embodiment of the present invention.

Figure 19:
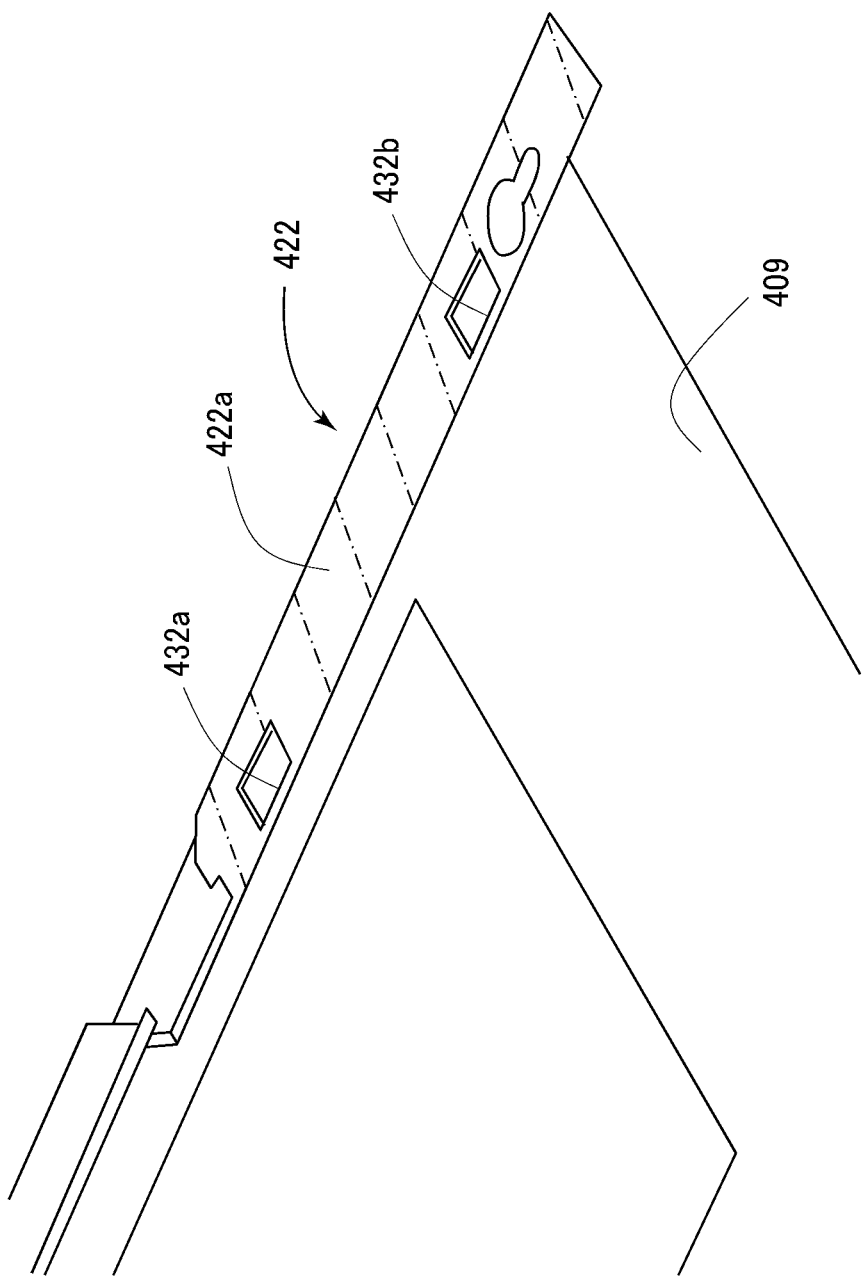

FIG. 19 is a perspective view showing another conductive portion of the top plate according to the first embodiment of the present invention.

Figure 20:
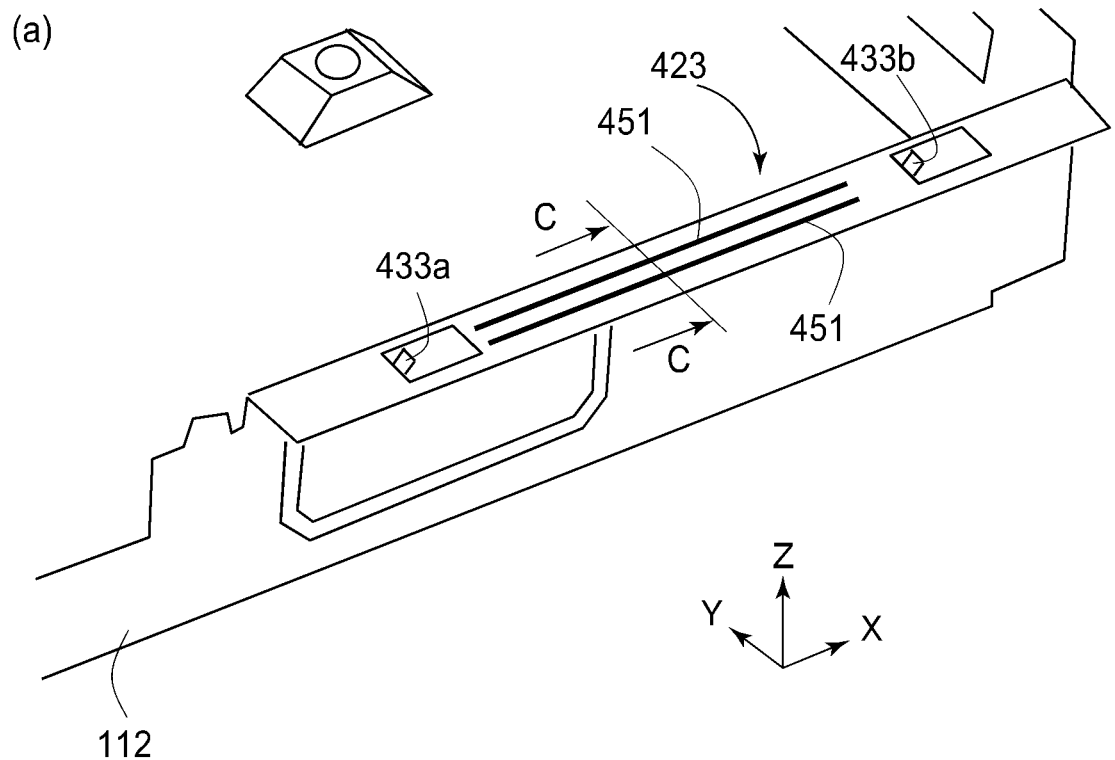
Figure 20:
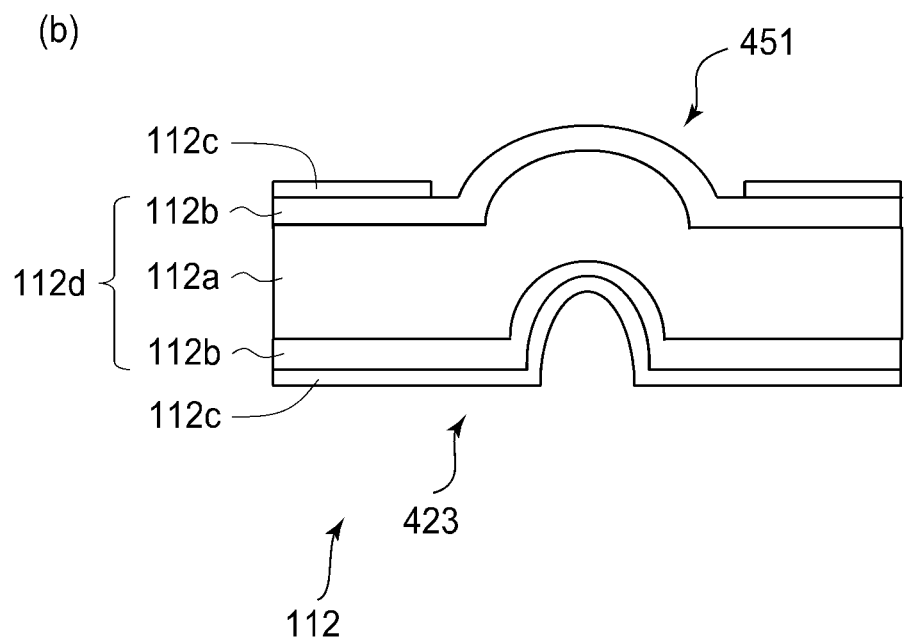

Part (a) and part (b) of FIG. 20 are showing a conductive portion of a box shaped sheet metal according to a second embodiment of the present invention, part (a) of FIG. 20 is a perspective view and part (b) of FIG. 20 is a sectional view showing a state when it is cut along line C-C in part (a) of FIG. 20.

Figure 21:
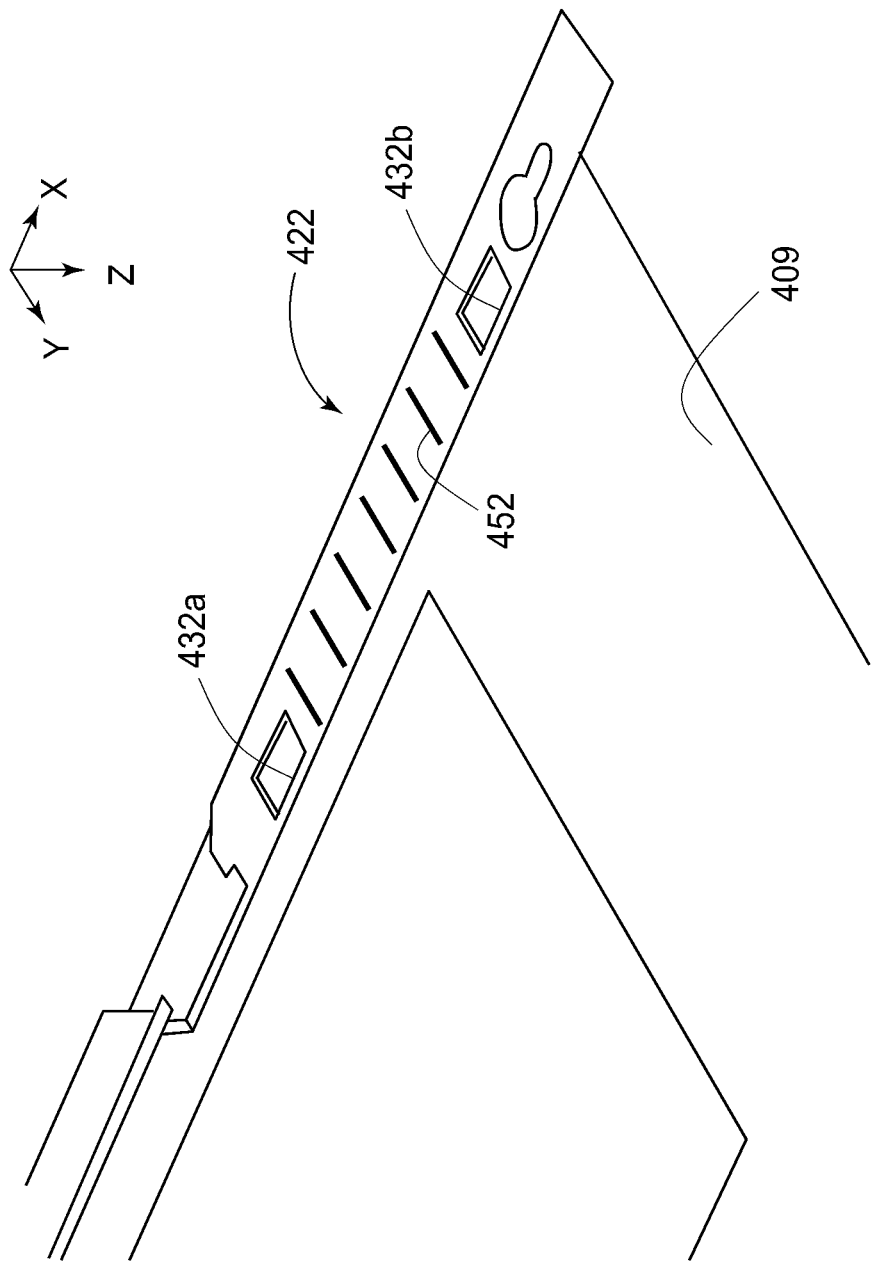

FIG. 21 is a perspective view showing a conductive portion of the top plate according to the second embodiment of the present invention.

Figure 22:
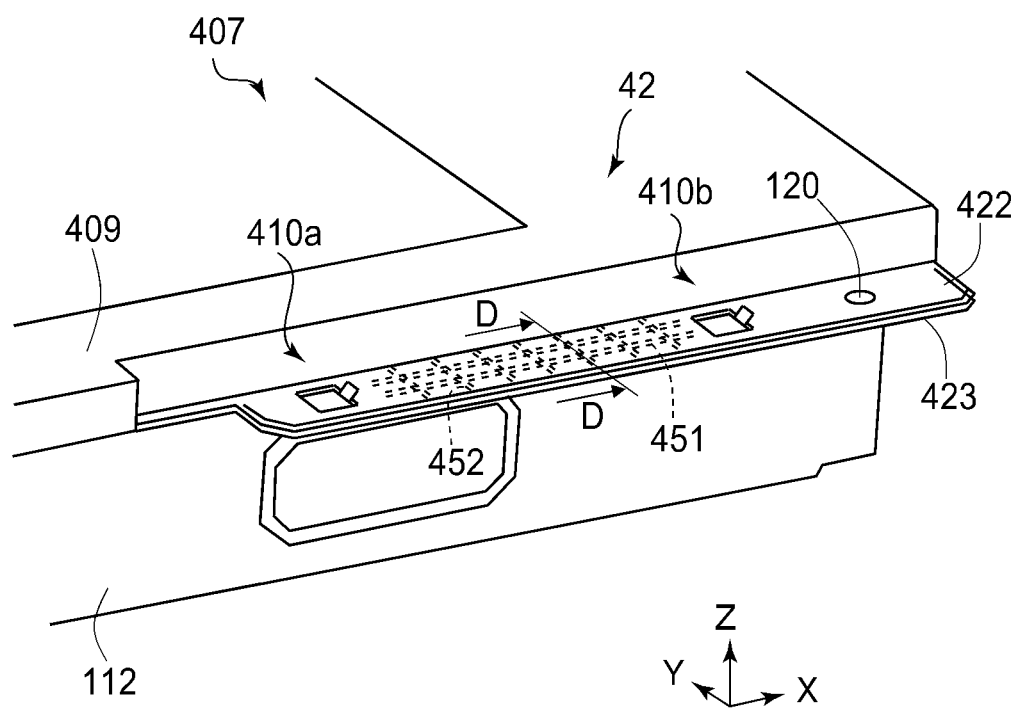
Figure 22:
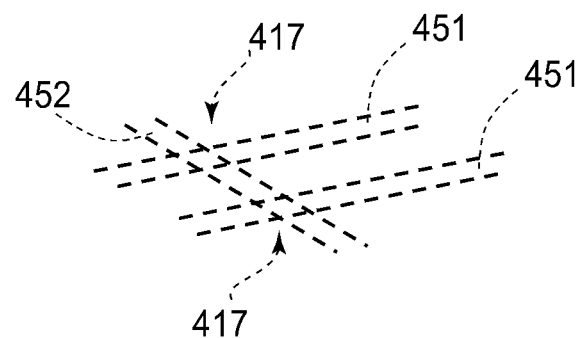

Part (a) and part (b) of FIG. 22 are perspective views showing the contact portion between the top plate and the box shaped sheet metal according to the second embodiment of the present invention, part (a) of FIG. 22 is an overall view, and part (b) of FIG. 22 is an enlarged view.

Figure 23:
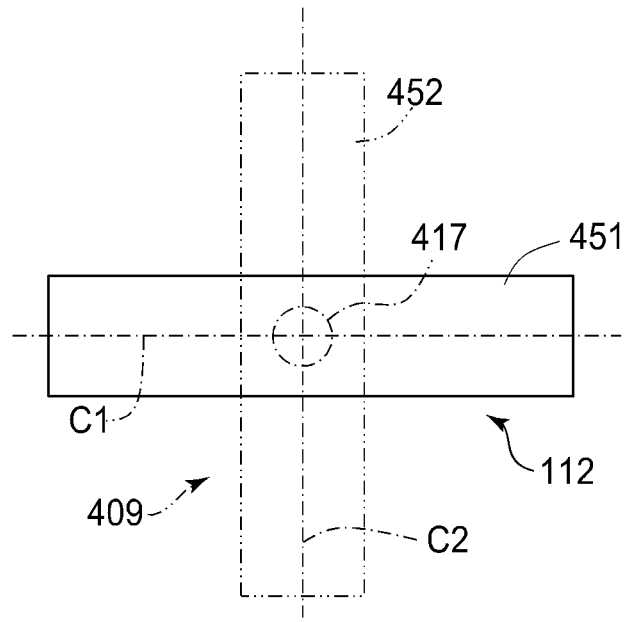
Figure 23:
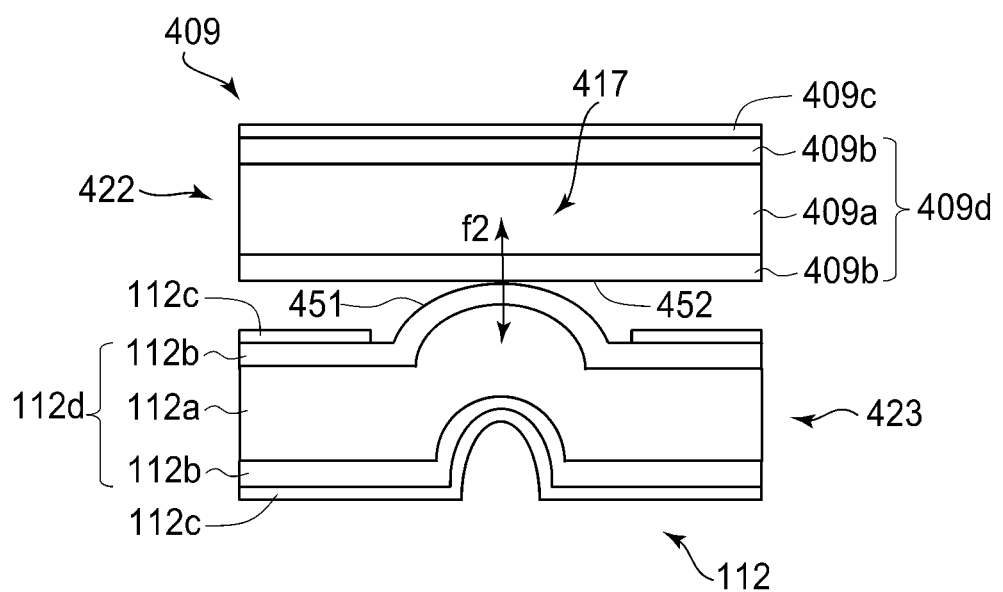

Part (a) and part (b) of FIG. 23 are views showing the contact portion between the top plate and the box shaped sheet metal according to the second embodiment of the present invention, part (a) of FIG. 22 is a plan view, and part (b) of FIG. 22 is a sectional view showing a state when they are cut along line D-D in part (a) of FIG. 22.

Figure 24:
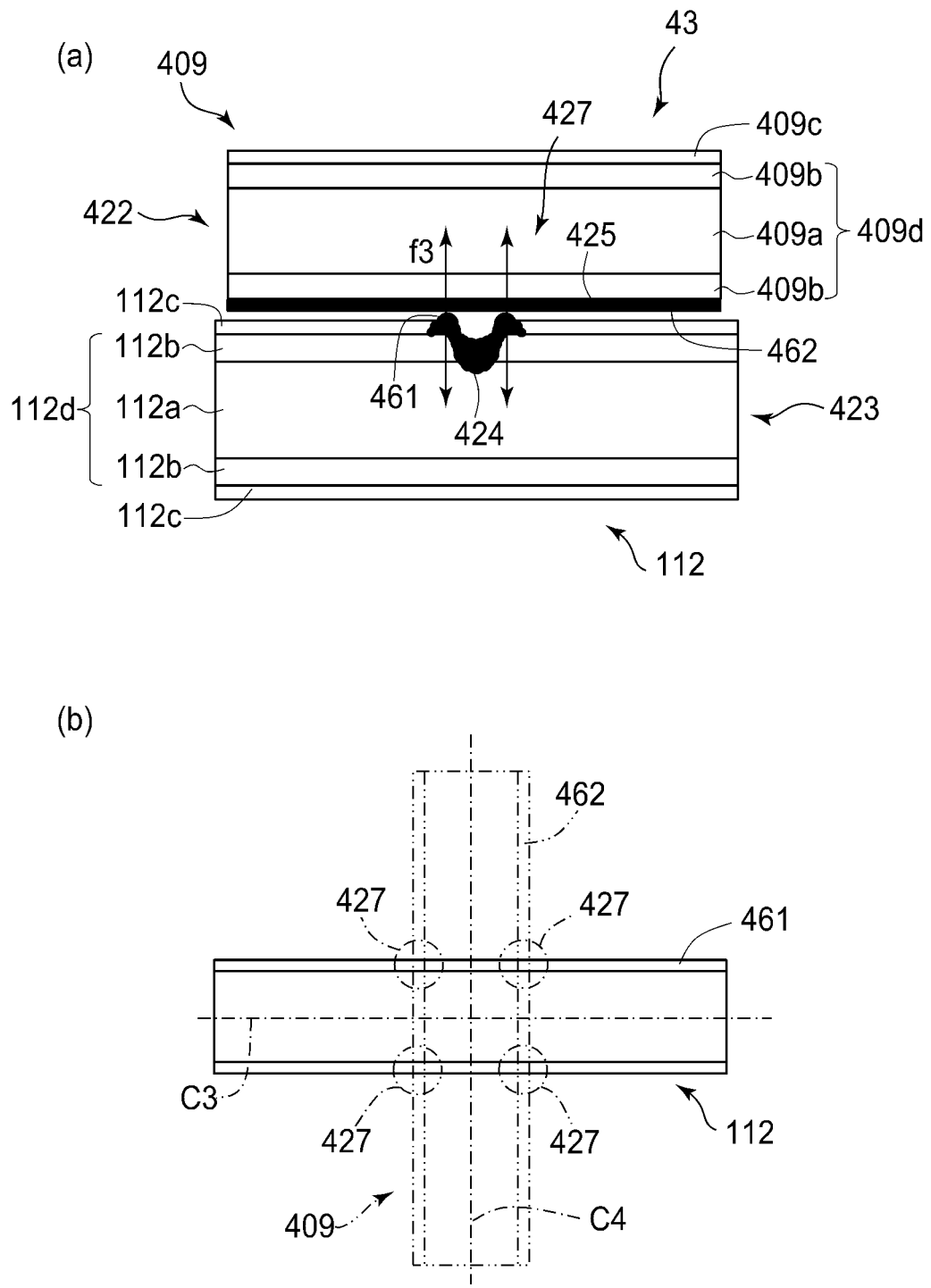

Part (a) and part (b) of FIG. 24 are views showing the contact portion between the top plate and the box shaped sheet metal according to a third embodiment of the present invention, part (a) of FIG. 24 is a sectional view, and part (b) of FIG. 22 is a plan view.

Figure 25:
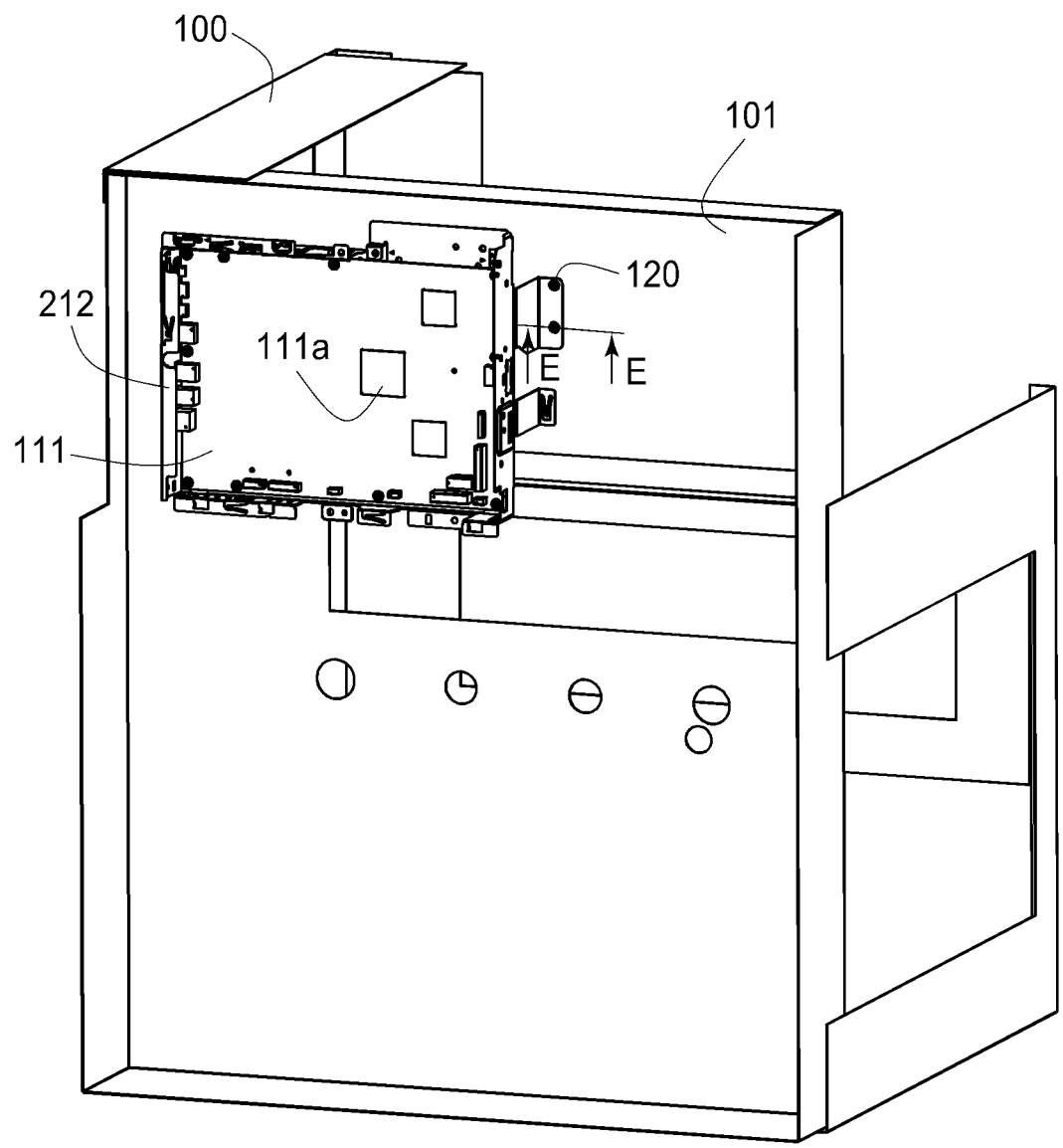

FIG. 25 is a perspective view showing a mounting state of a box shaped sheet metal and a rear side plate according to a fourth embodiment of the present invention.

Figure 26:
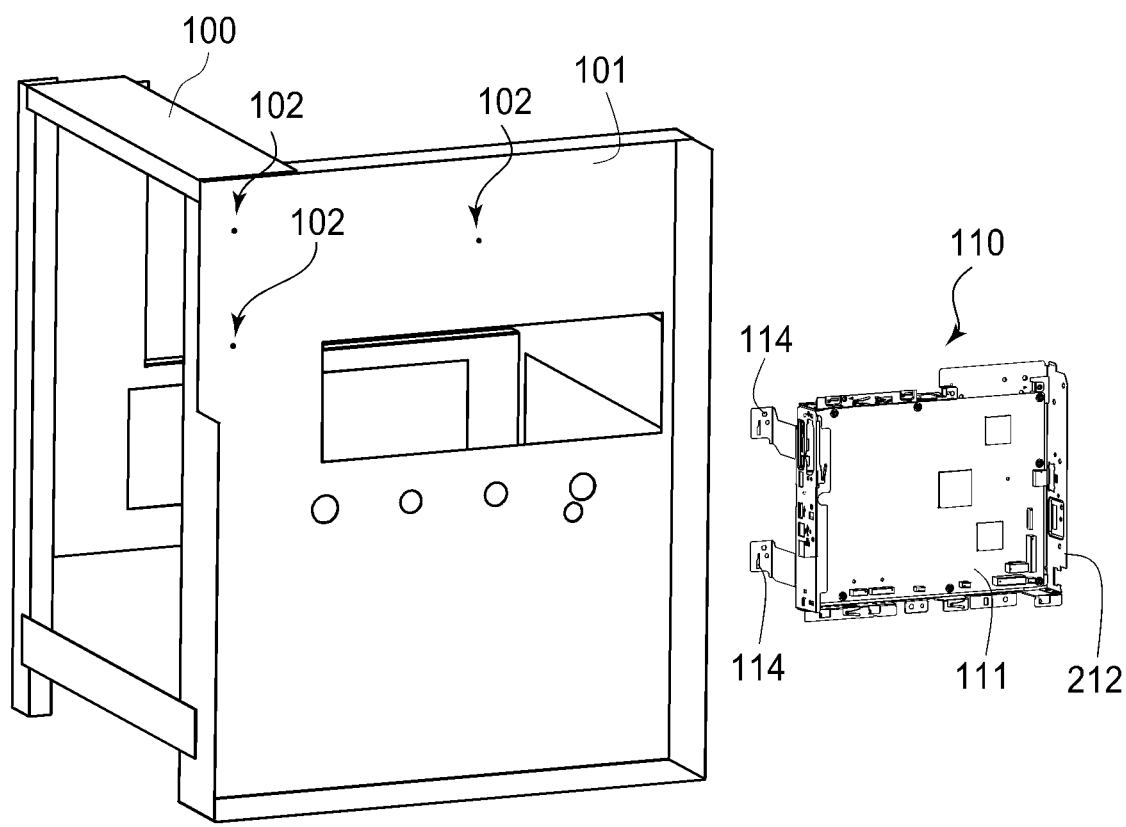

FIG. 26 is a perspective view showing a state before mounting the box shaped sheet metal and the rear side plate according to the fourth embodiment of the present invention.

Figure 27:
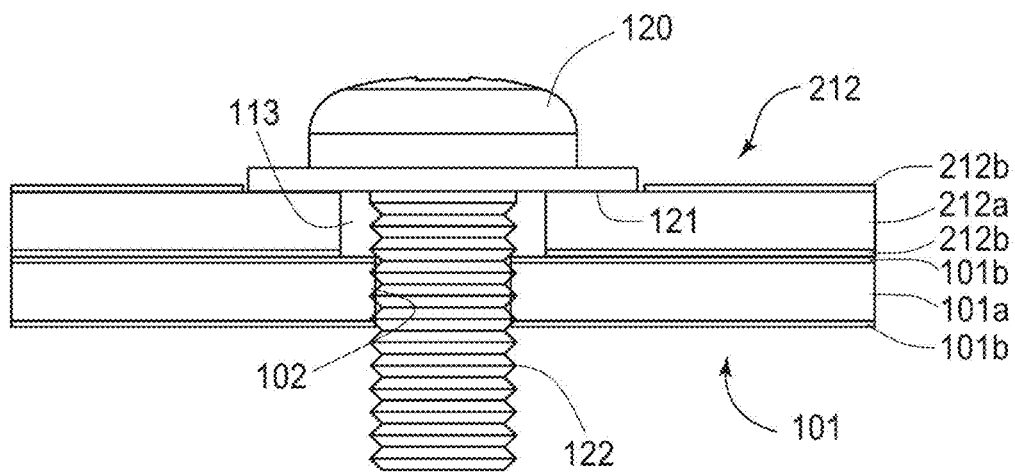
Figure 27:
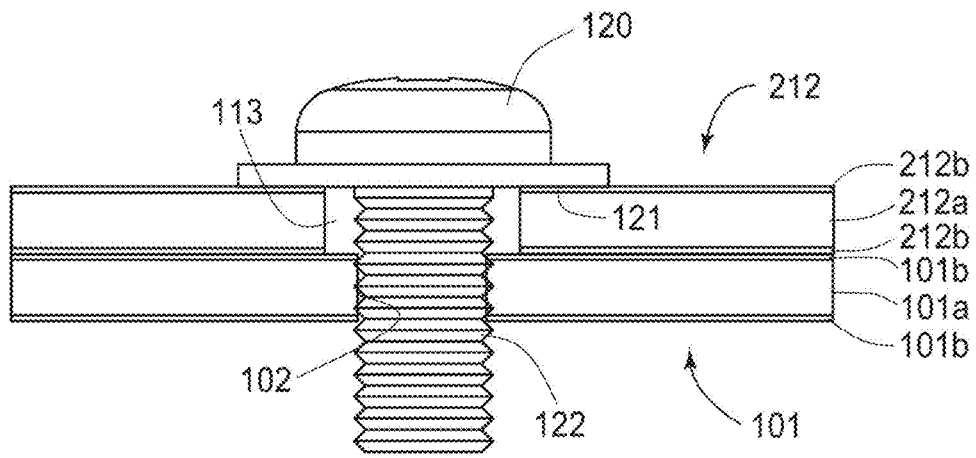

Part (a) and part (b) of FIG. 27 are sectional views showing a conventional coupling structure between the rear side plate and the box shaped sheet metal, part (a) of FIG. 27 is in a case that it is conductive, and part (b) of FIG. 27 is in a case that it is not conductive.

Figure 28:
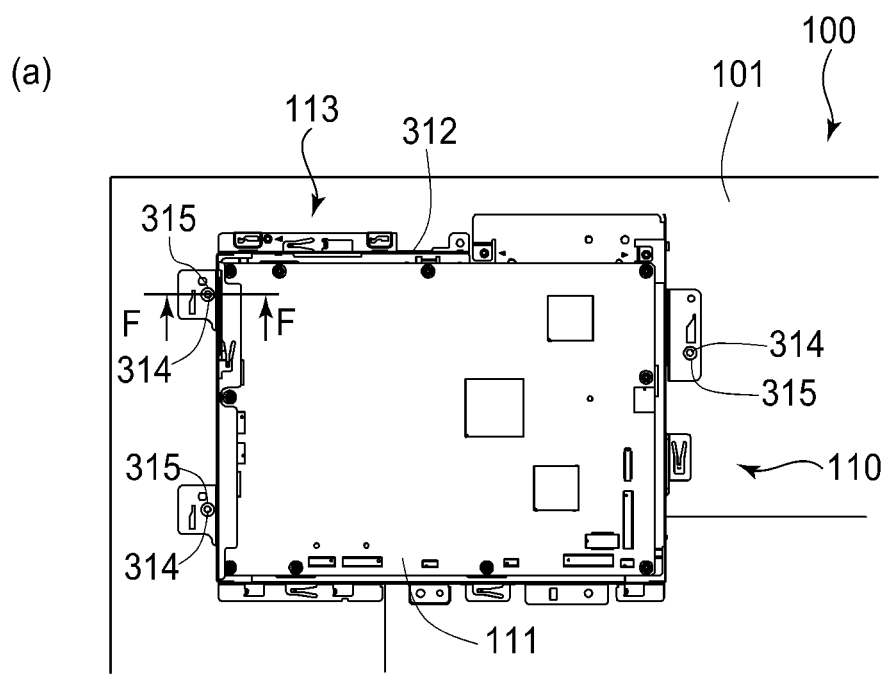
Figure 28:
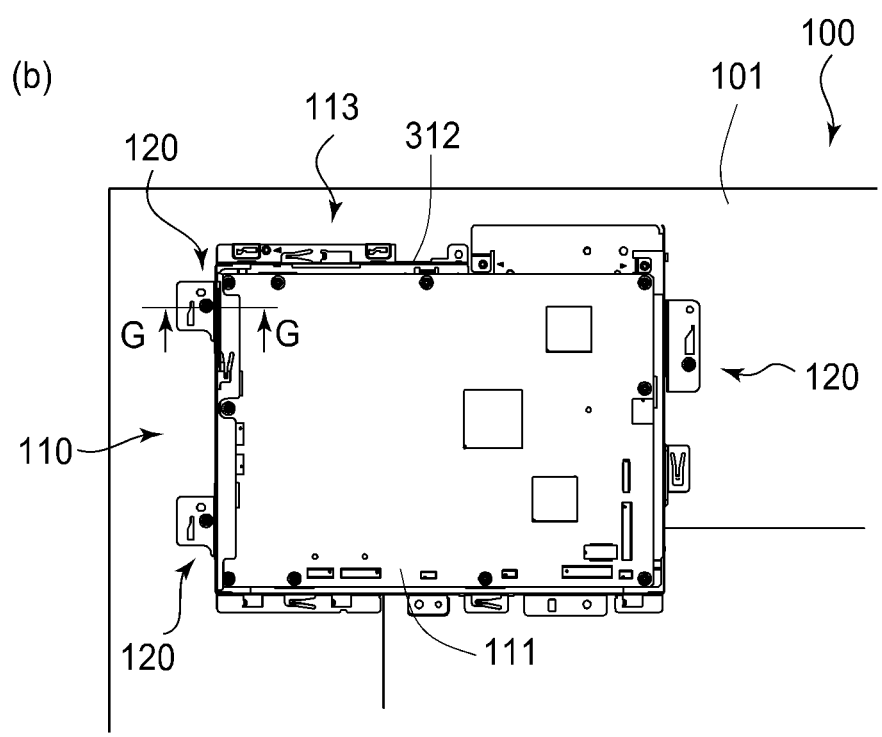

Part (a) and part (b) of FIG. 28 are back views showing the box shaped sheet metal and the rear side plate according to the fourth embodiment of the present invention, part (a) of FIG. 28 is a state before attaching screws, and part (b) of FIG. 28 is a state after attaching the screws.

Figure 29:
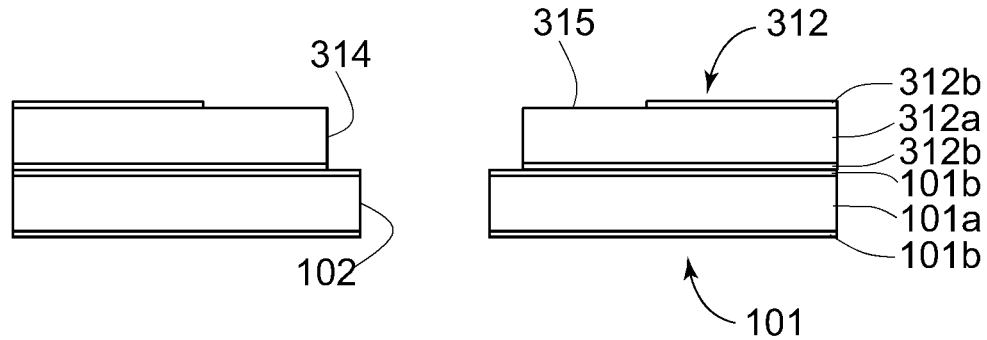
Figure 29:
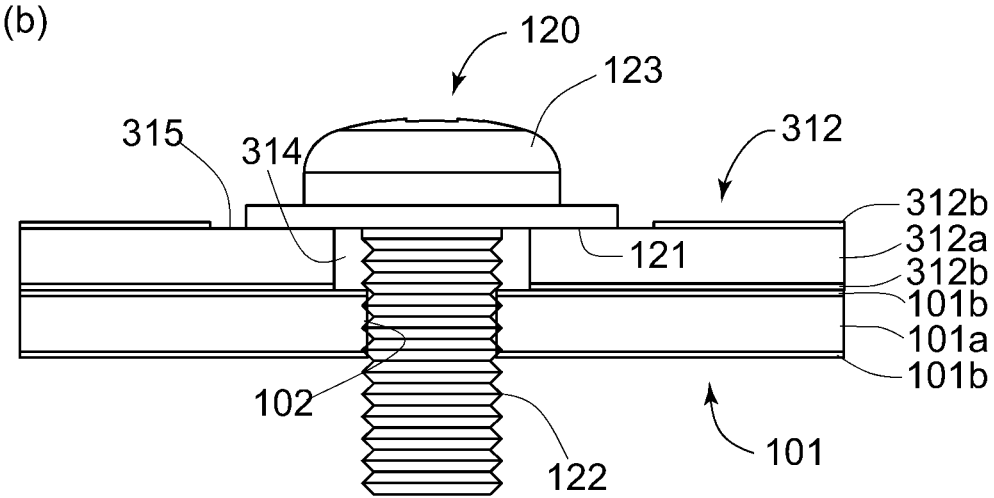
Figure 29:
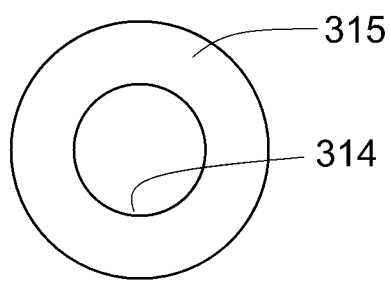
Figure 29:
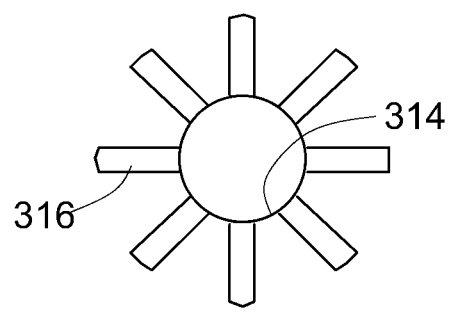

Part (a), part (b), part (c) and part (d) of FIG. 29 are views showing a coupling structure between the rear side plate and the box shaped sheet metal according to the fourth embodiment of the present invention, part (a) of FIG. 29 is a sectional view showing a state before attaching the screws, part (b) of FIG. 29 is a sectional view showing a state after attaching the screws, part (c) of FIG. 29 is a plan view of part (a) of FIG. 29, and part (d) of FIG. 29 is a plan view in a modified example.

Figure 30:
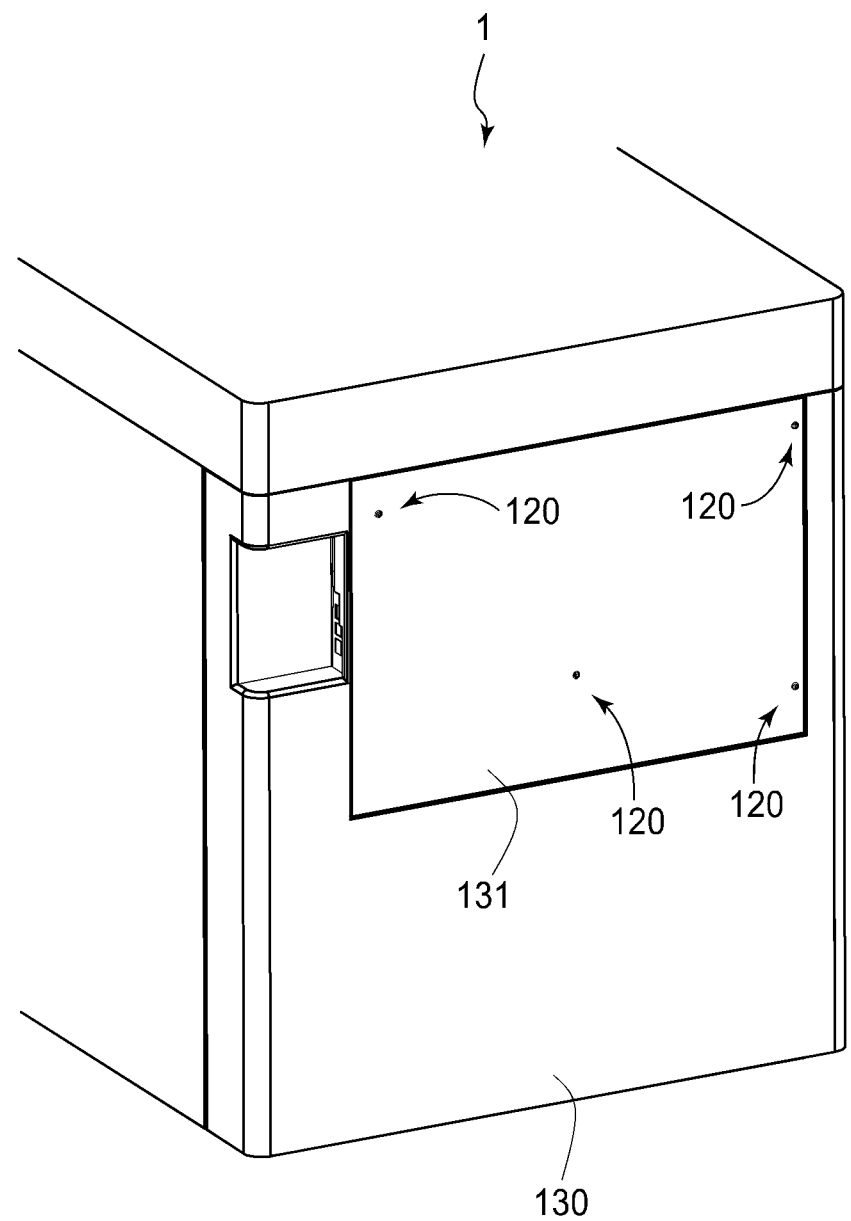

FIG. 30 is a perspective view showing a mounting state of a rear cover, a box shaped sheet metal and a rear side plate in an image forming apparatus according to a fifth embodiment of the present invention.

Figure 31:
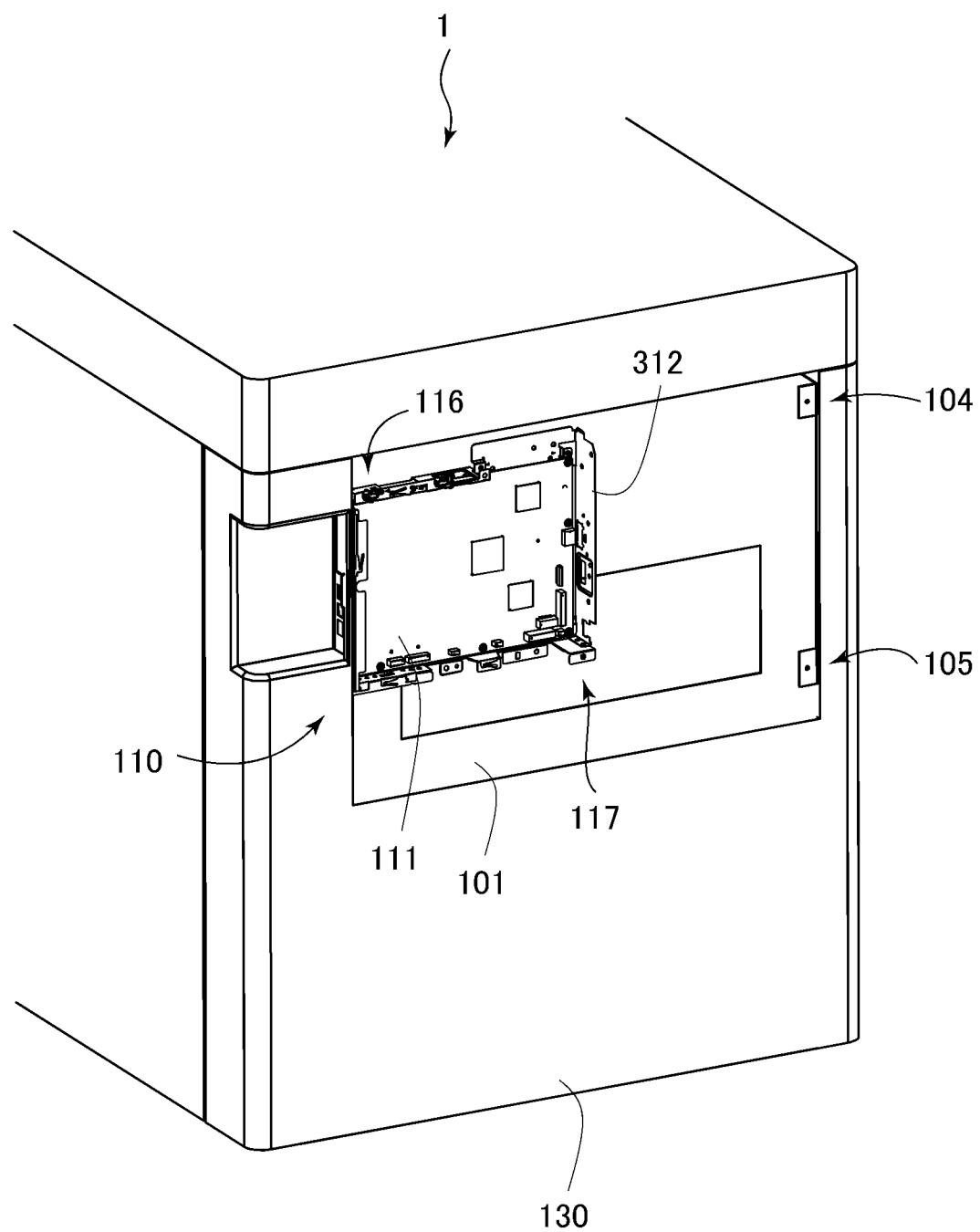

FIG. 31 is a perspective view showing a state that the rear cover is removed in the image forming apparatus according to the fifth embodiment of the present invention.

Figure 32:
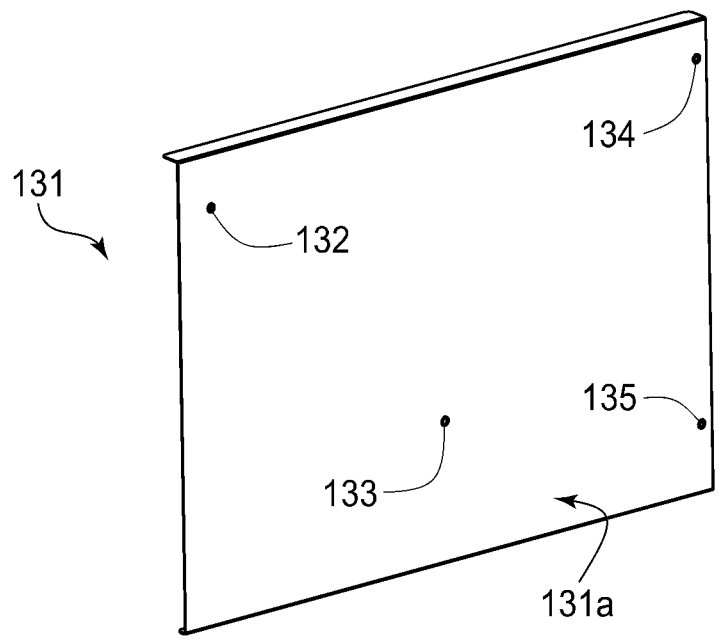
Figure 32:
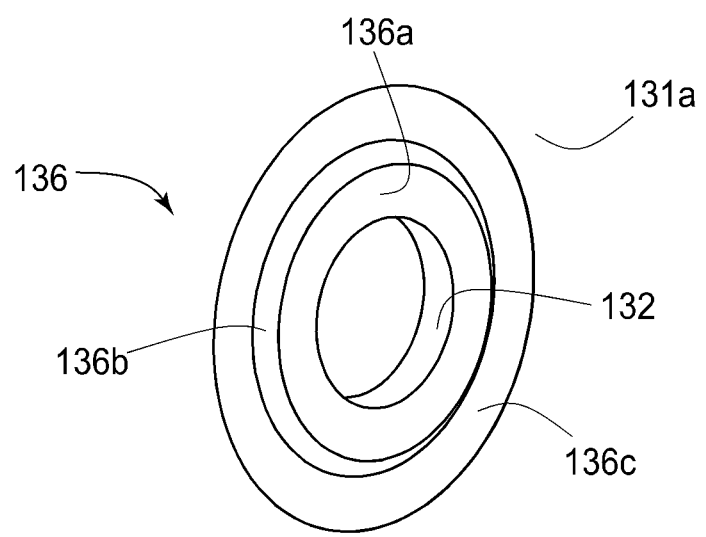

Part (a) and part (b) of FIG. 32 are views showing the rear cover according to the fifth embodiment of the present invention, part (a) of FIG. 32 is an overall perspective view and part (b) of FIG. 32 is an enlarged perspective view of a screw hole.

Figure 33:
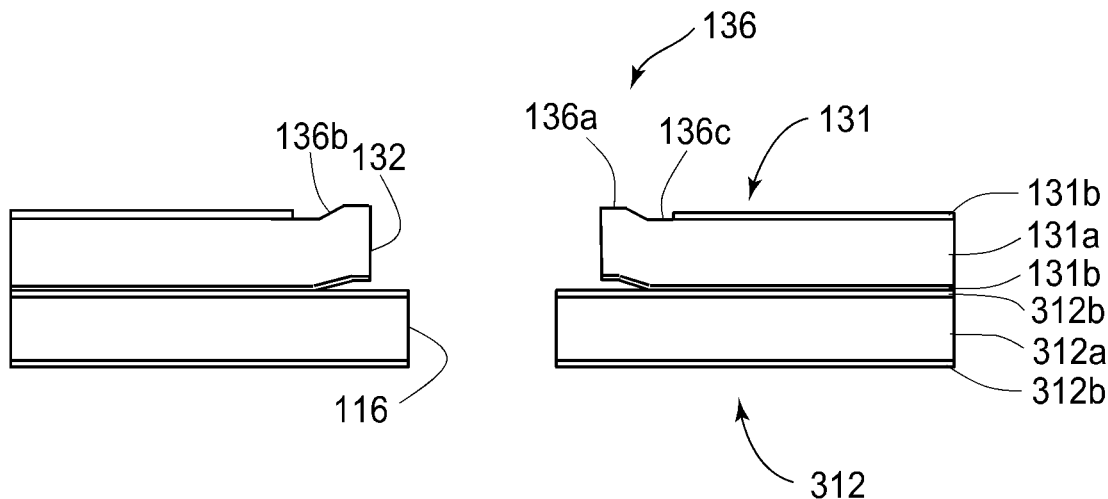
Figure 33:
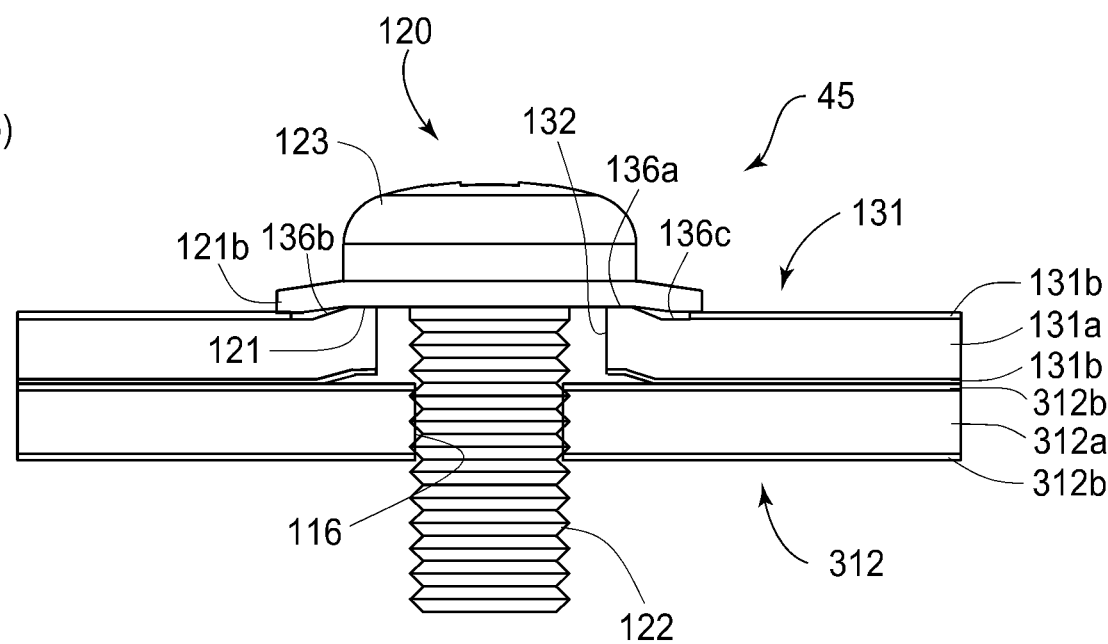

Part (a) and part (b) of FIG. 33 are views showing a coupling structure between the rear cover and the box shaped sheet metal according to the fifth embodiment of the present invention, part (a) of FIG. 33 is a sectional view showing a state before attaching screws, and part (b) of FIG. 33 is a sectional view showing a state after attaching screws.

Figure 34:
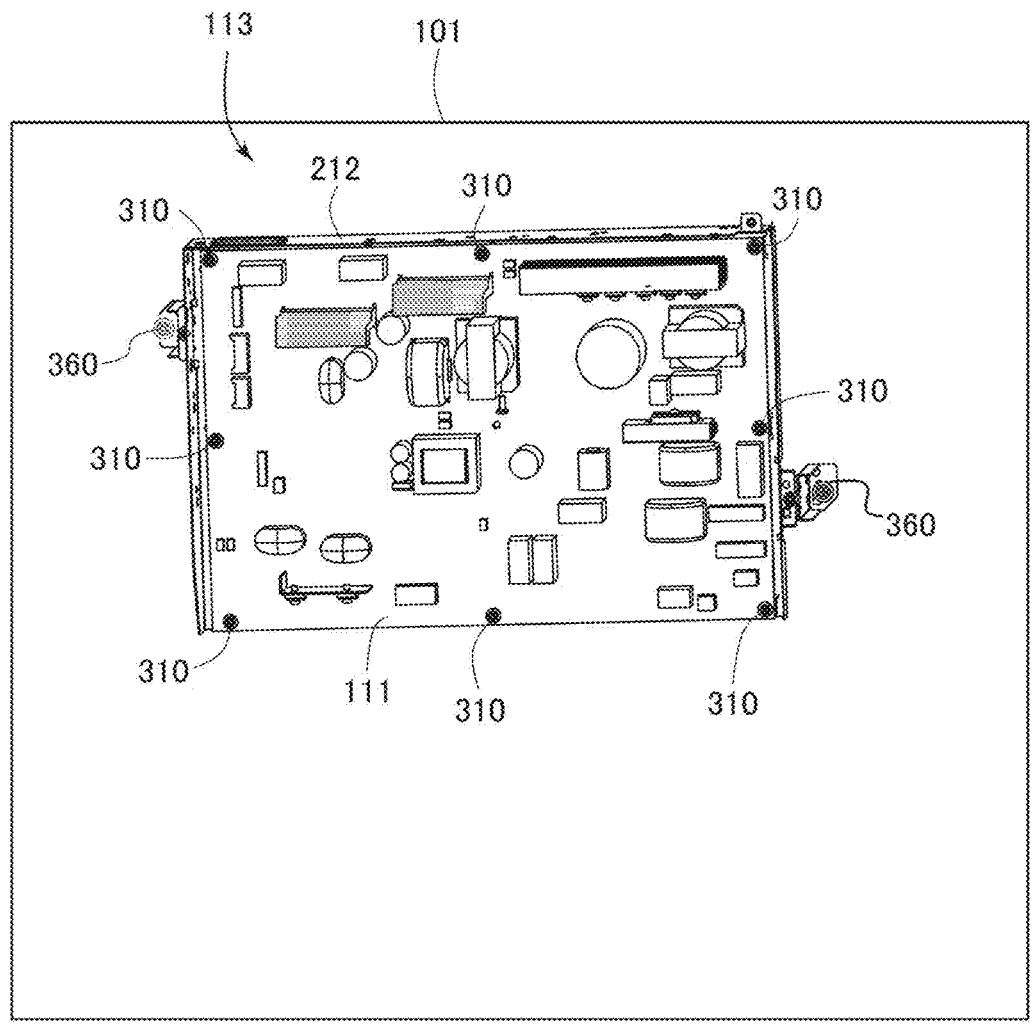

FIG. 34 is a back view showing a conventional mounting state of the rear side plate, the box shaped sheet metal and a control board.

Figure 35:
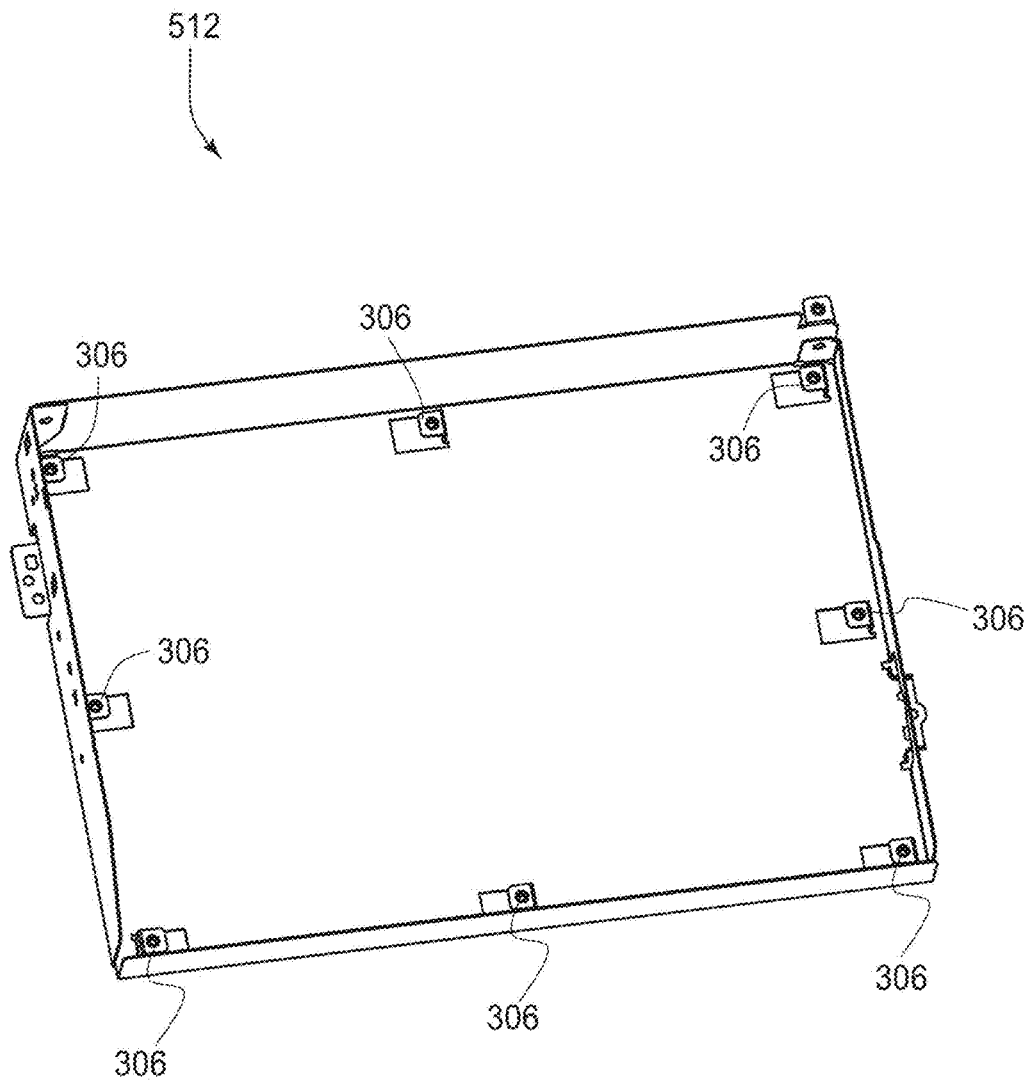

FIG. 35 is a perspective view showing a conventional box shaped sheet metal.

Figure 36:
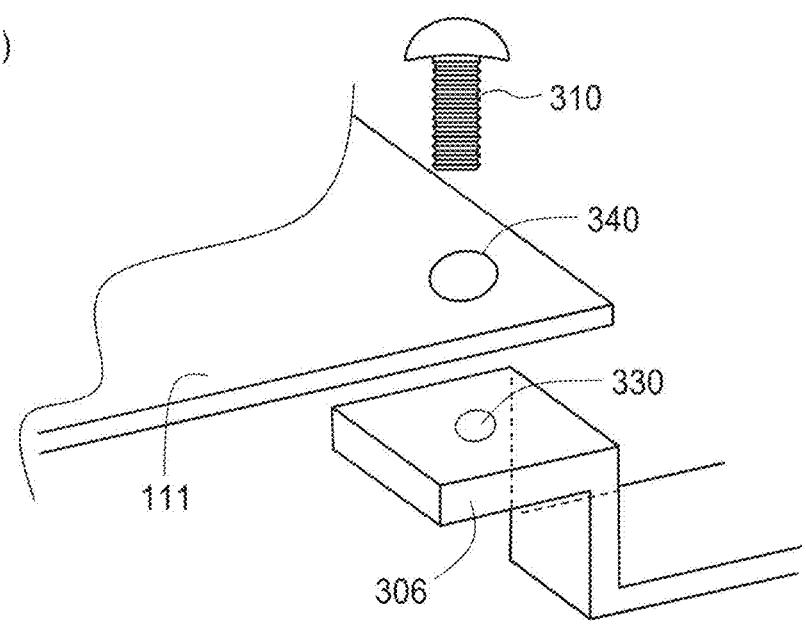
Figure 36:
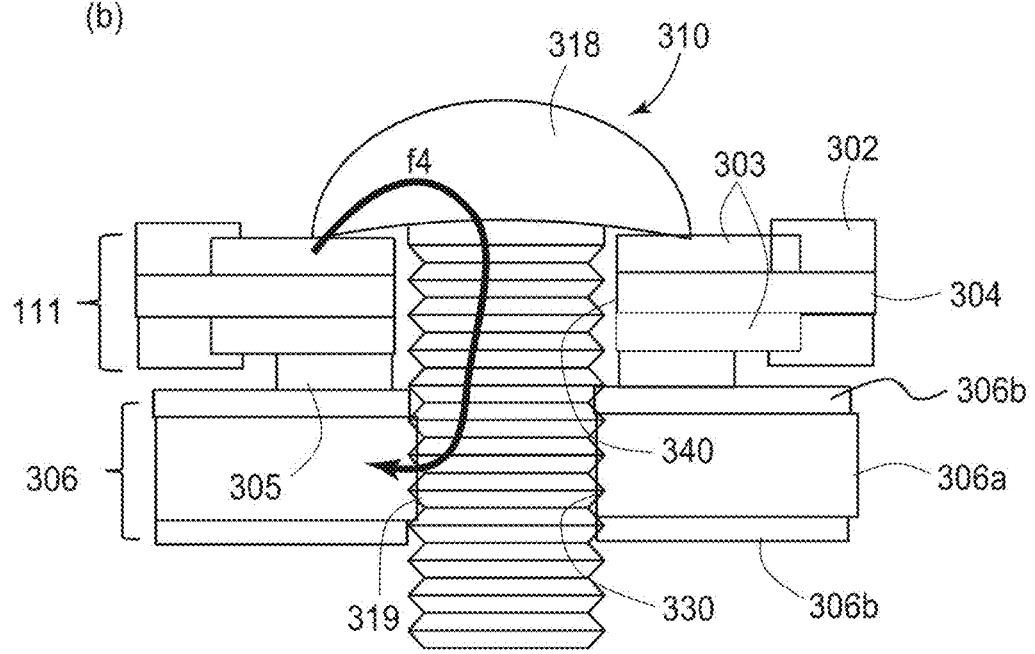

Part (a) and part (b) of FIG. 36 are views of a conventional coupling structure between the box shaped sheet metal and the control board, part (a) of FIG. 36 is a perspective view, and part (b) of FIG. 36 is a sectional view.

Figure 37:
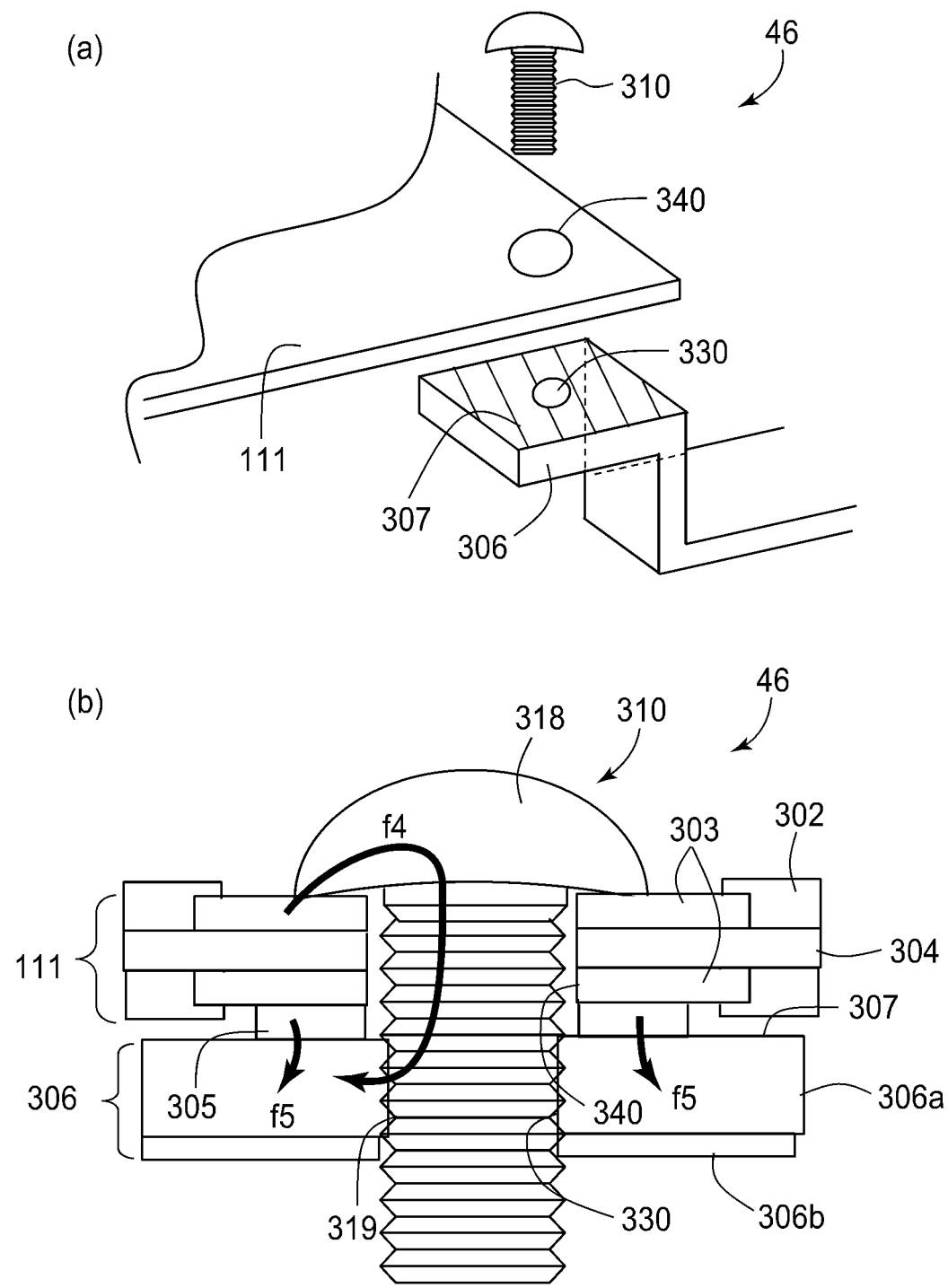

Part (a) and part (b) of FIG. 37 are views of a coupling structure between a box shaped sheet metal and a control board according to a sixth embodiment of the present invention, part (a) of FIG. 37 is a perspective view, and part (b) of FIG. 37 is a sectional view.

Figure 38:
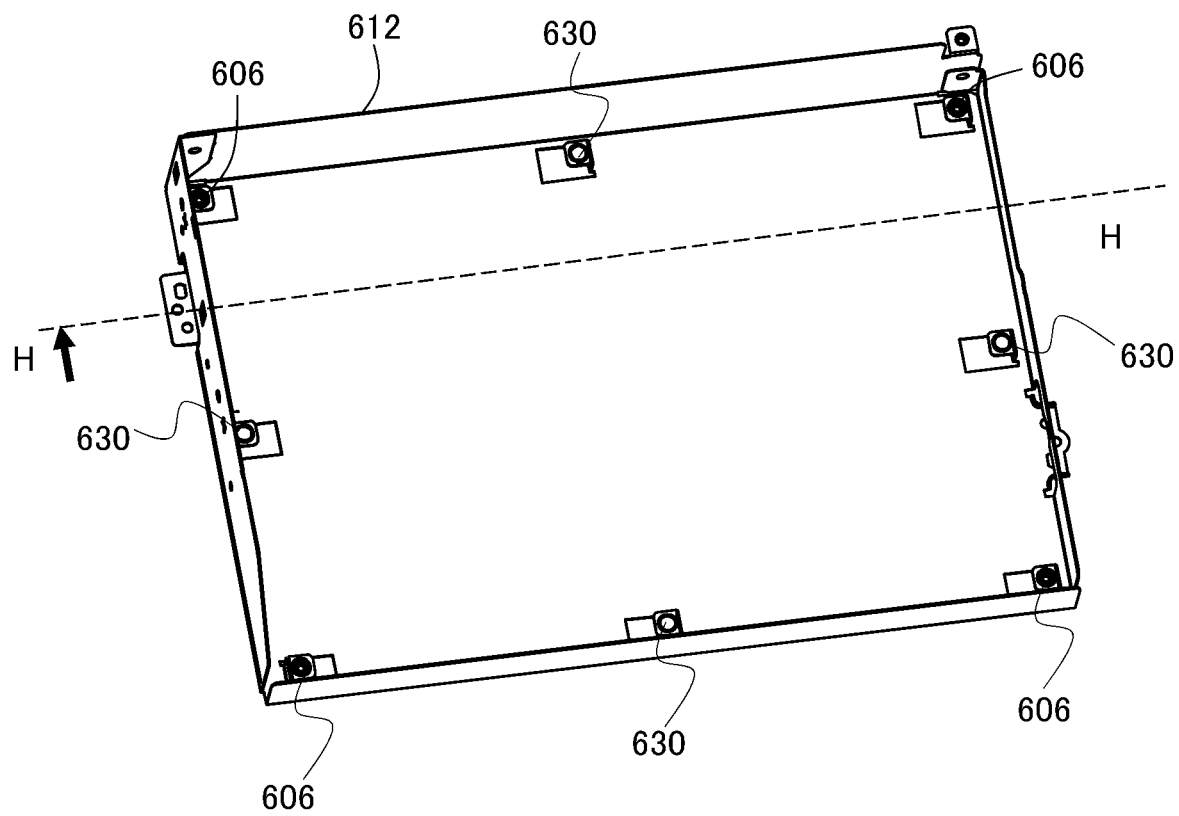

FIG. 38 is a perspective view showing a box shaped sheet metal according to a seventh embodiment of the present invention.

Figure 39:
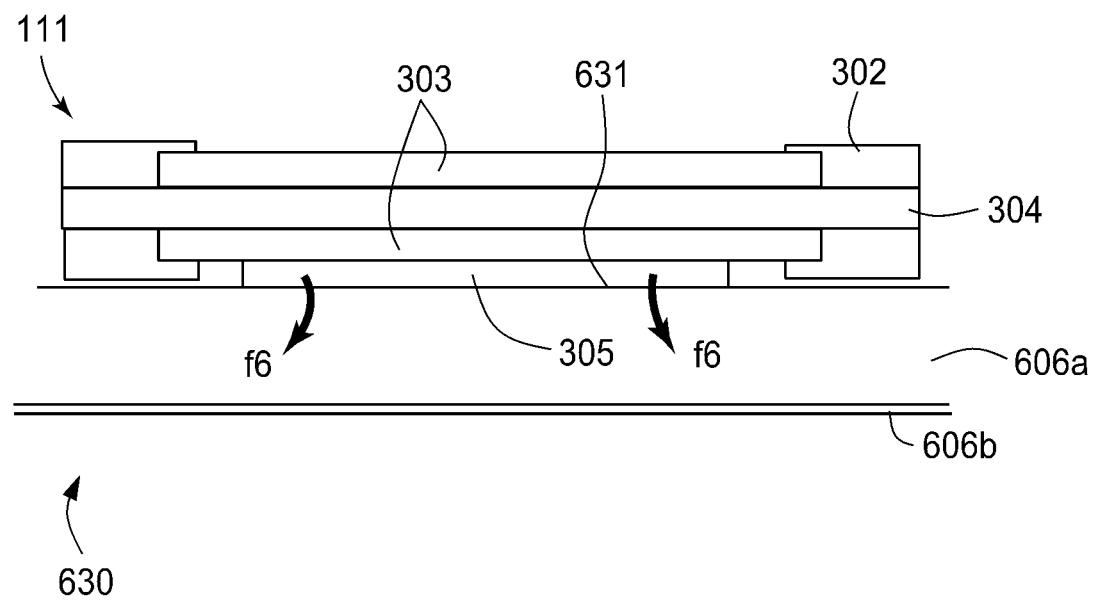

FIG. 39 is a sectional view showing a coupling structure between the box shaped sheet metal and a control board according to the seventh embodiment of the present invention.

Figure 40:
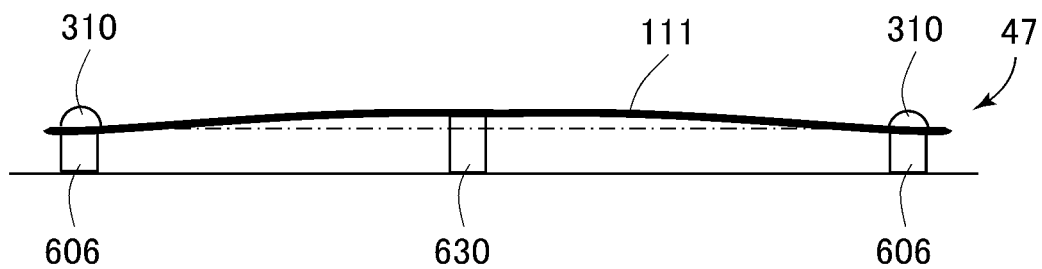
Figure 40:
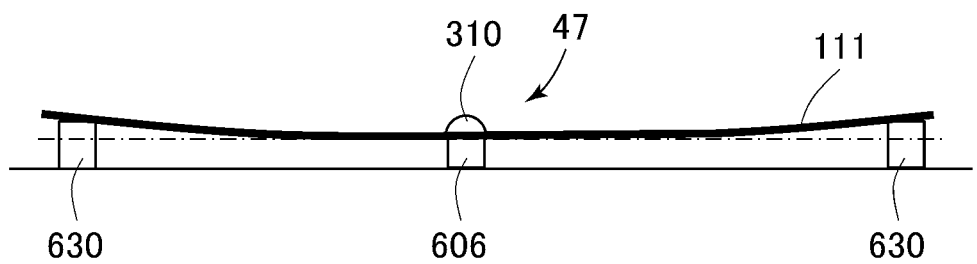

Part (a) and part (b) of FIG. 40 are sectional views showing a coupling structure between the box shaped sheet metal and the control board according to the seventh embodiment of the present invention, part (a) of FIG. 40 is a sectional view in a case that a contact portion is arranged between screw portions, and part (b) of FIG. 40 is a sectional view in a case that a screw portion is arranged between contact portions.

Figure 41:
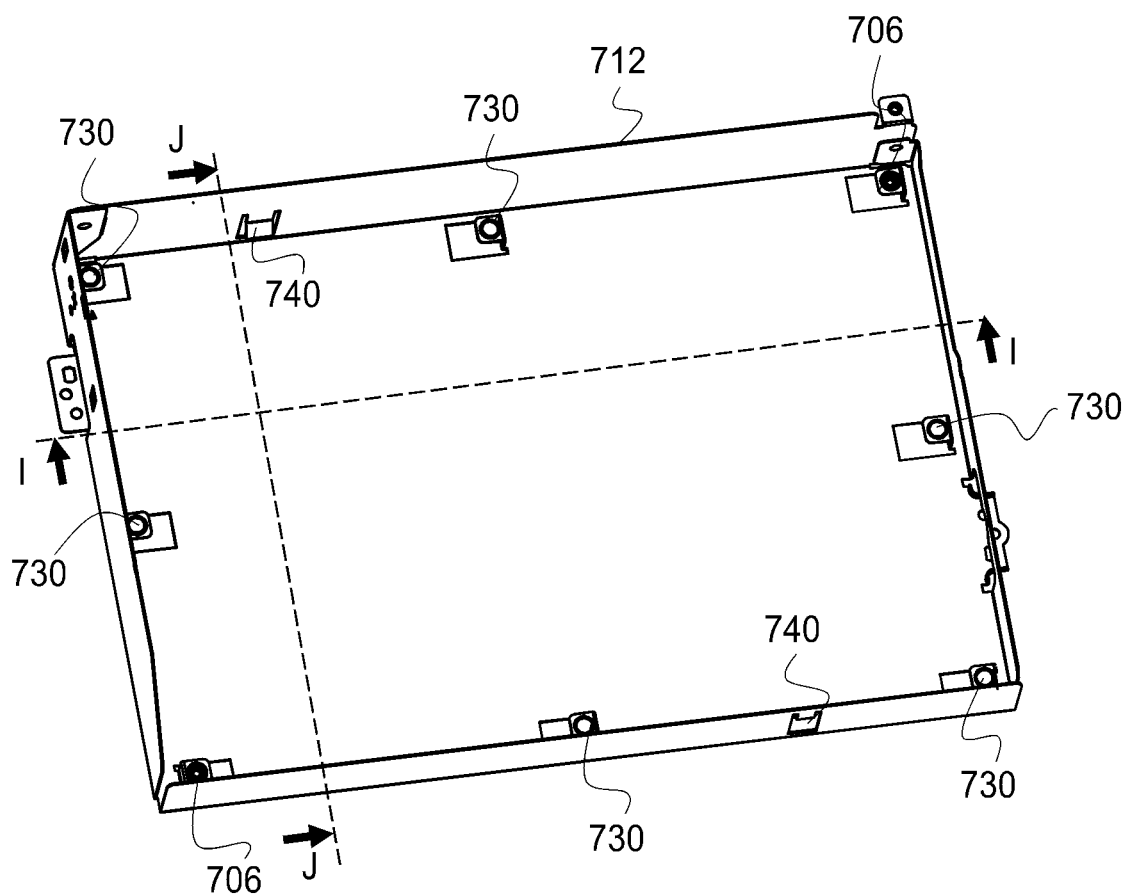

FIG. 41 is a perspective view showing a box shaped sheet metal according to an eighth embodiment of the present invention.

Figure 42:
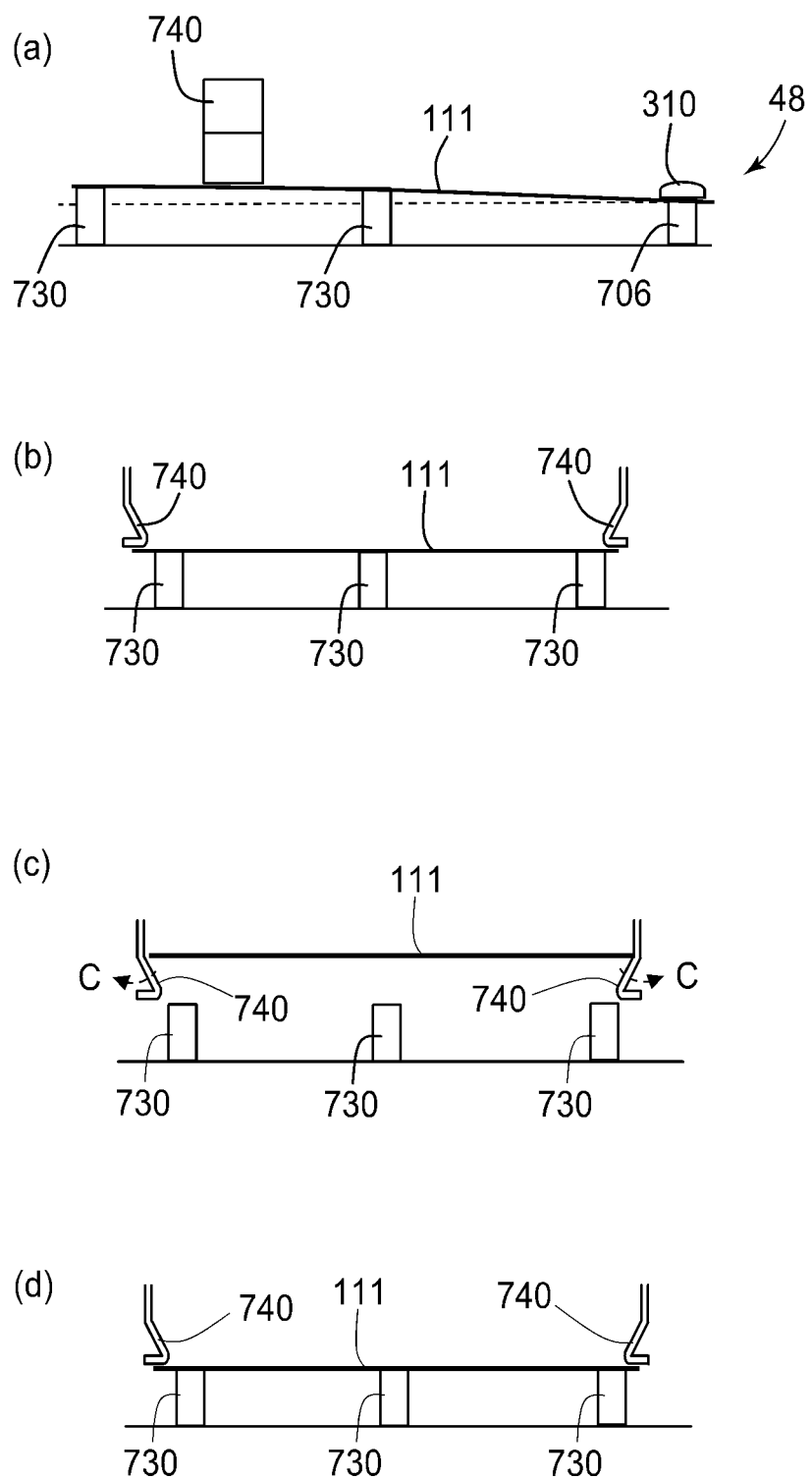

Part (a), part (b), part (c) and part (d) of FIG. 42 are sectional views of a coupling structure between the box shaped sheet metal and a control board according to the eighth embodiment of the present invention, part (a) of FIG. 42 is a sectional view in a case that a regulating portion is arranged between the contact portions, part (b) of FIG. 42 is a sectional view in a case that regulating portions press both end portions of the control board, part (c) of FIG. 42 is a sectional view while the control board is being mounted, and part (d) of FIG. 42 is a sectional view after the control board is mounted.

DESCRIPTION OF THE EMBODIMENTS

First Embodiment

In the following, a first embodiment of the present invention will be specifically described with reference to Figures from 1 through 19. In the embodiment, a full-color printer of a tandem type is described as an example of an image forming apparatus 1. However, the present invention is not limited to the image forming apparatus 1 of the tandem type but may be an image forming apparatus of any other type, and the present invention is not limited to be full-color but may be monochrome or mono-color. Or it may be an inkjet printer. In a following description, vertical and horizontal directions and positions of a front side (a front side) and a rear side (a back side) are represented with respect to a front view of the image forming apparatus 1 (viewpoint in FIG. 2). Incidentally, a side of the image forming apparatus 1 with which a control panel 25 is provided is the front side (the front side), and an opposite side of the front side is the rear side.

[Image Forming Apparatus]

Figure 1:
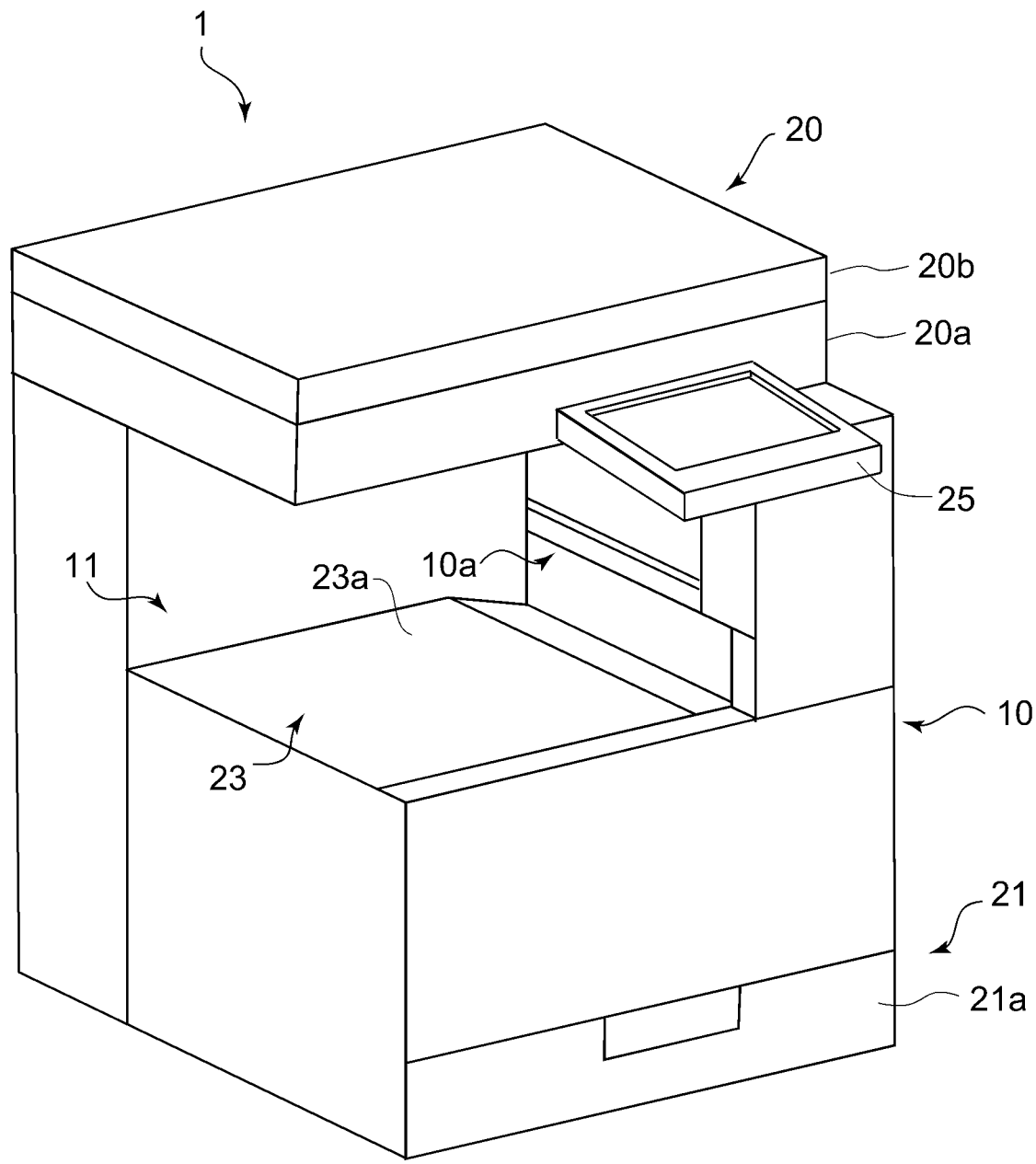
FIG. 1 is a perspective view showing a schematic structure of an image forming apparatus according to a first embodiment of the present invention.

As shown in FIG. 1, the image forming apparatus 1 in the embodiment is provided with a main assembly 10 (main assembly of image forming apparatus). The main assembly 10 is provided with an image reading portion 20, a feeding portion 21, an image forming portion 6 (see FIG. 2), a discharging portion 23, a control portion 24 (see FIG. 2) and an operating portion 25. The image forming apparatus 1 forms an image on a recording material S based on image information. Incidentally, the recording material S is a sheet on which a toner image is formed, and a plain paper, a resin sheet which is a substitute for the plain paper, a cardboard, a sheet for an overhead projector, etc. are examples.

The image reading portion 20 is, for example, a flatbed scanner device and is arranged on top of the main assembly 10. The image reading portion 20 includes a reading main assembly 20a which is provided with a platen glass, and a platen cover 20b which can be opened and closed with respect to the reading main assembly 20a. A document placed on the platen glass is scanned by a scanning optical system which is built into the reading main assembly 20a, and image information is extracted. The feeding portion 21 is arranged in a lower part of the main assembly 10, and is provided with a feeding cassette 21a which stacks and accommodates the recording material S, and feeds the recording material S to the image forming portion 6 (see FIG. 2). The discharging portion 23 is provided with a discharging tray 23a which is arranged in a downstream side of the discharging port 10a which is formed in the main assembly 10. The discharging tray 23a is a face-down tray, and the recording material S which is discharged from the discharging port 10a is stacked. Further, a space between the image reading portion 20 and the discharging tray 23a constitutes an in-body space portion 11.

Figure 2:
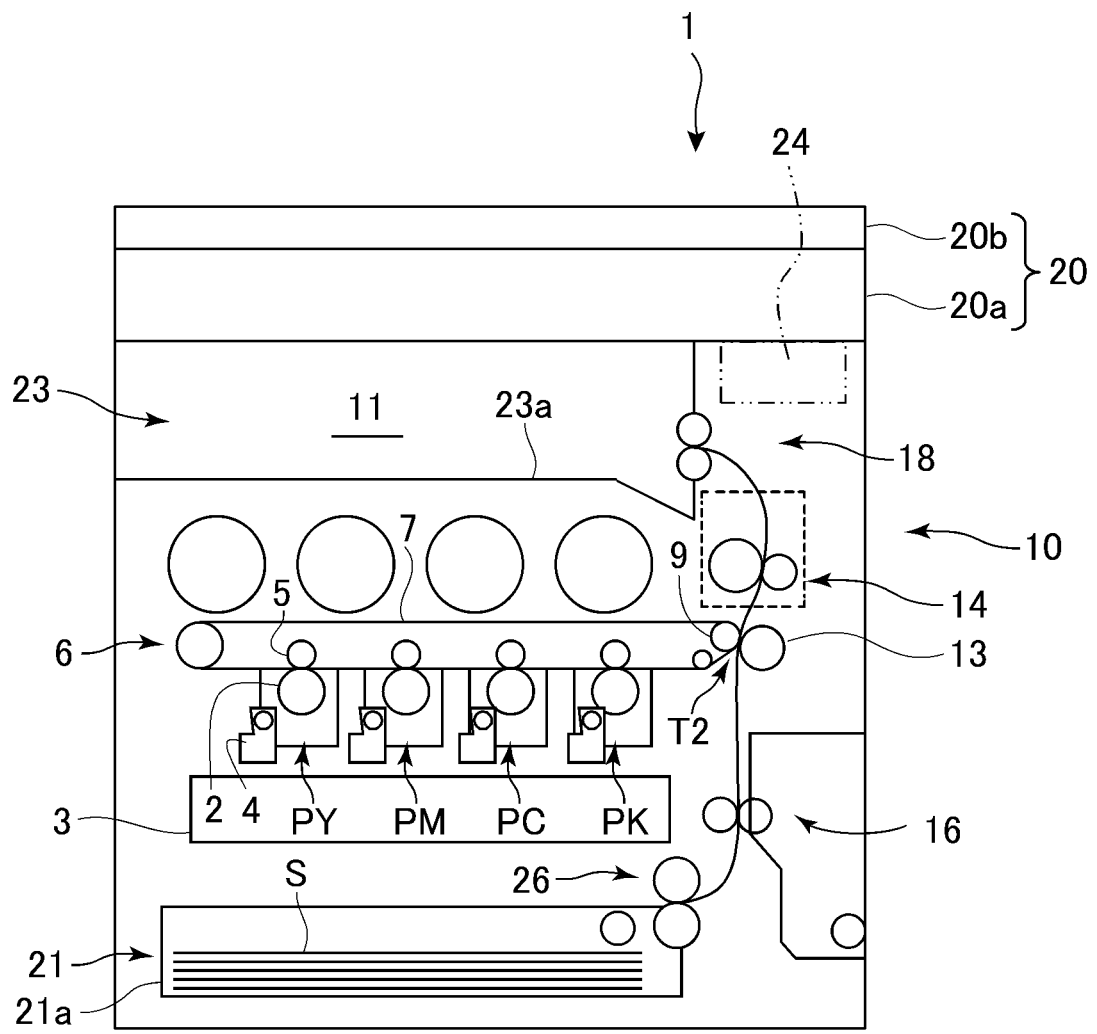
FIG. 2 is a sectional view showing the schematic structure of the image forming apparatus according to the first embodiment of the present invention.

As shown in FIG. 2, the main assembly 10 builds into an image forming portion 6, and the image forming portion 6 forms an image on the recording material S which is fed from the feeding cassette 21a. The image forming portion 6 forms an image based on image information which is received from the image reading portion 20 or an unshown external device (for example, a portable terminal such as a smartphone, a personal computer, etc.). In the embodiment, the image forming portion 6 is provided with four image forming units PY, PM, PC and PK, and is a so-called tandem-type intermediary transfer method constitution. The image forming units PY, PM, PC and PK form yellow (Y), magenta (M), cyan (C) and black (K) toner images, respectively, and form an image on the recording material S via the intermediary transfer belt 7.

Each of the image forming units PY, PM, PC and PK has a similar constitution except difference of color, so the image forming unit PY will be described here as a representative unit while reference numerals are attached. In the image forming unit PY, an unshown charging device (for example, a charging roller), a developing device 4 and an unshown cleaner are arranged around a photosensitive drum 2 which is made of a photosensitive member such as an organic photoconductor (OPC). An image forming operation forms a latent image on the photosensitive drum 2 of each image forming unit PY, PM, PC and PK, firstly. As a preparatory operation, a high voltage is applied to the charging device which is pressed against the photosensitive drum 2 and a surface of the photosensitive drum 2 is uniformly charged according to a rotation of the photosensitive drum 2. Next, a high voltage is applied to a developing sleeve of the developing device 4 through a different path than the charging device, and toner, which is charged, inside of the developing device 4 is coated uniformly on a surface of the developing sleeve. And a latent image of a potential change on the surface of photosensitive drum 2 by laser scanning of an exposing device 3 is formed, and the toner in the developing sleeve develops the latent image on photosensitive drum 2 as a toner image. The toner image which is developed on the photosensitive drum 2 is primary transferred to the intermediary transfer belt 7 by applying a primary transfer voltage to a primary transfer roller 5 which opposes the photosensitive drum 2 via the intermediary transfer belt 7.

The intermediary transfer belt 7 is rotatably driven along a feeding direction (upward direction in the figure) of the recording material S in a secondary transfer portion T2. On a surface of the intermediary transfer belt 7, a full-color toner image is formed by multiple transferring of each single color toner image which is formed by each of the image forming units PY, PM, PC and PK. The toner image which is formed on the surface of the intermediary transfer belt 7 is secondary transferred to the recording material S in the secondary transfer portion T2 which is formed between a secondary transfer roller 13 and an opposing roller 9. At that time, a secondary transfer voltage is applied to the secondary transfer roller 13.

The recording material S is supplied to the image forming portion 6 in accordance with the image forming process. Here, a feeding roller 26 which is provided at a lower position of the main assembly 10 separates and feeds the recording material S which is accommodated in the feeding cassette 21a one sheet at a time. On a right side of an interior of the main assembly 10, a feeding passage which feeds the recording material S from bottom to top along a right side surface of the main assembly 10 is arranged. In the feeding passage, in order from a bottom, a feeding roller 26, a feeding roller pair 16, a secondary transfer roller 13, a fixing device 14 and a discharging roller pair 18. The recording material S which is fed by the feeding roller 26 is corrected for skewness by a feeding roller pair 16, and is fed to the secondary transfer portion T2 in accordance with a timing of transferring the toner image. The recording material S in which an unfixed toner image is formed in the secondary transfer portion T2 is fed to the fixing device 14 which includes a roller pair and a heating source, etc., and heat and pressure are applied. Therefore, the toner is melted and fixed, and the toner image is fixed to the recording material S. In this way, after the toner image is fixed, the recording material S is discharged to the discharging tray 23a which is provided at a top of the image forming portion 6 by the discharging roller pair 18.

[Controller Unit]

A controller unit 110, which constitutes a control portion 24, will be described by using Figures from 3 through 5. The controller unit 110 includes a control board 111 which controls the image forming apparatus 1 and an electric component box 113 which accommodates the control board 111. The electric component 113 includes a box shaped sheet metal 112 which is an example of a casing and a top plate 409 which is an example of a cover. The electric component box 113 is attached to a frame member 100 of the main assembly 10.

Figure 3:
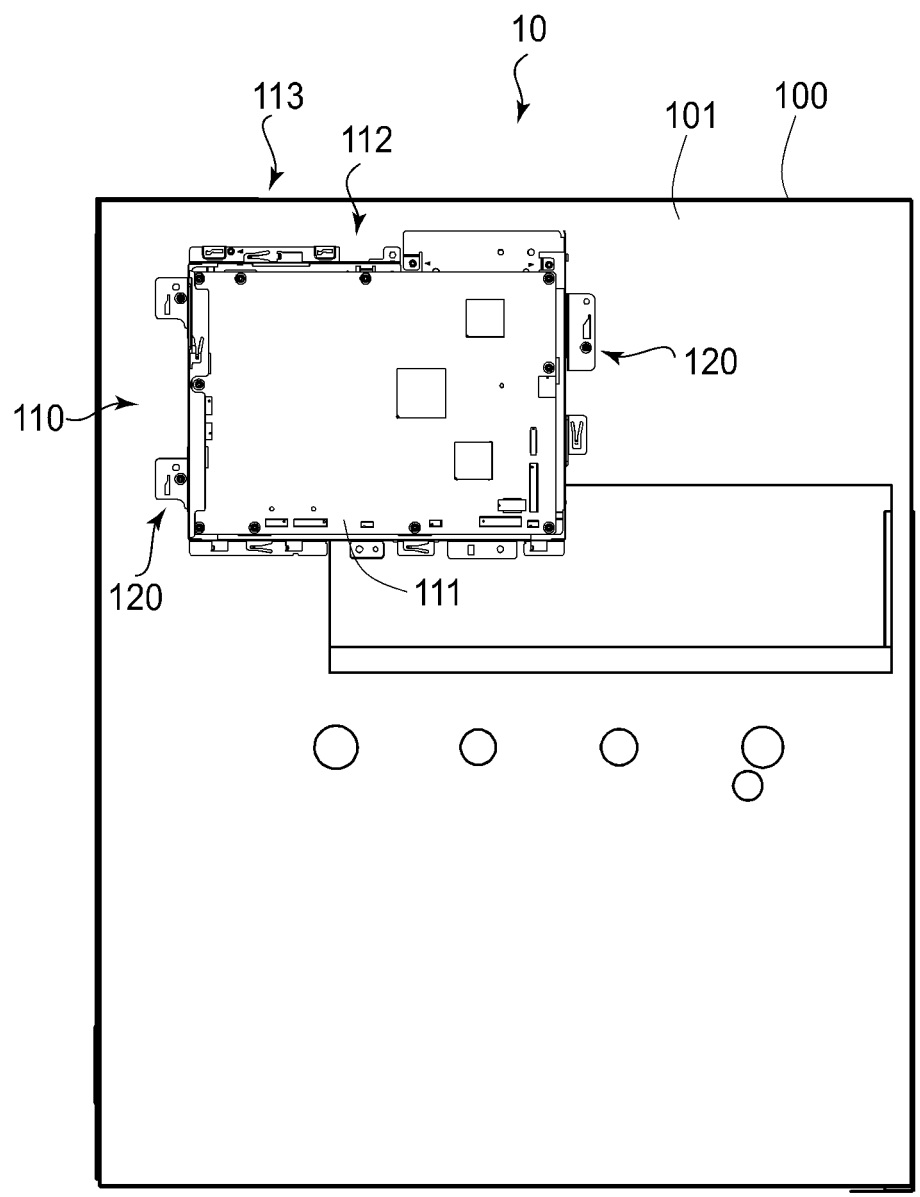
FIG. 3 is a back view showing a mounting state of a box shaped sheet metal and a rear side plate according to the first embodiment of the present invention.

FIG. 3 is a schematic view of main parts of the frame member 100 and the controller unit 110 when the image forming apparatus 1 is viewed from a rear surface side. The control board 111 produces a signal to create an electrostatic latent image based on image information which is read by the image reading portion 20 or image information input from an external device such as a PC. A rear side plate 101 which is an example of an attaching member is provided at a back portion of the frame member 100 and is one component which constitutes the frame member 100, and the box shaped sheet metal 112 is fastened and held to the rear side plate 101 by screws.

Figure 4:
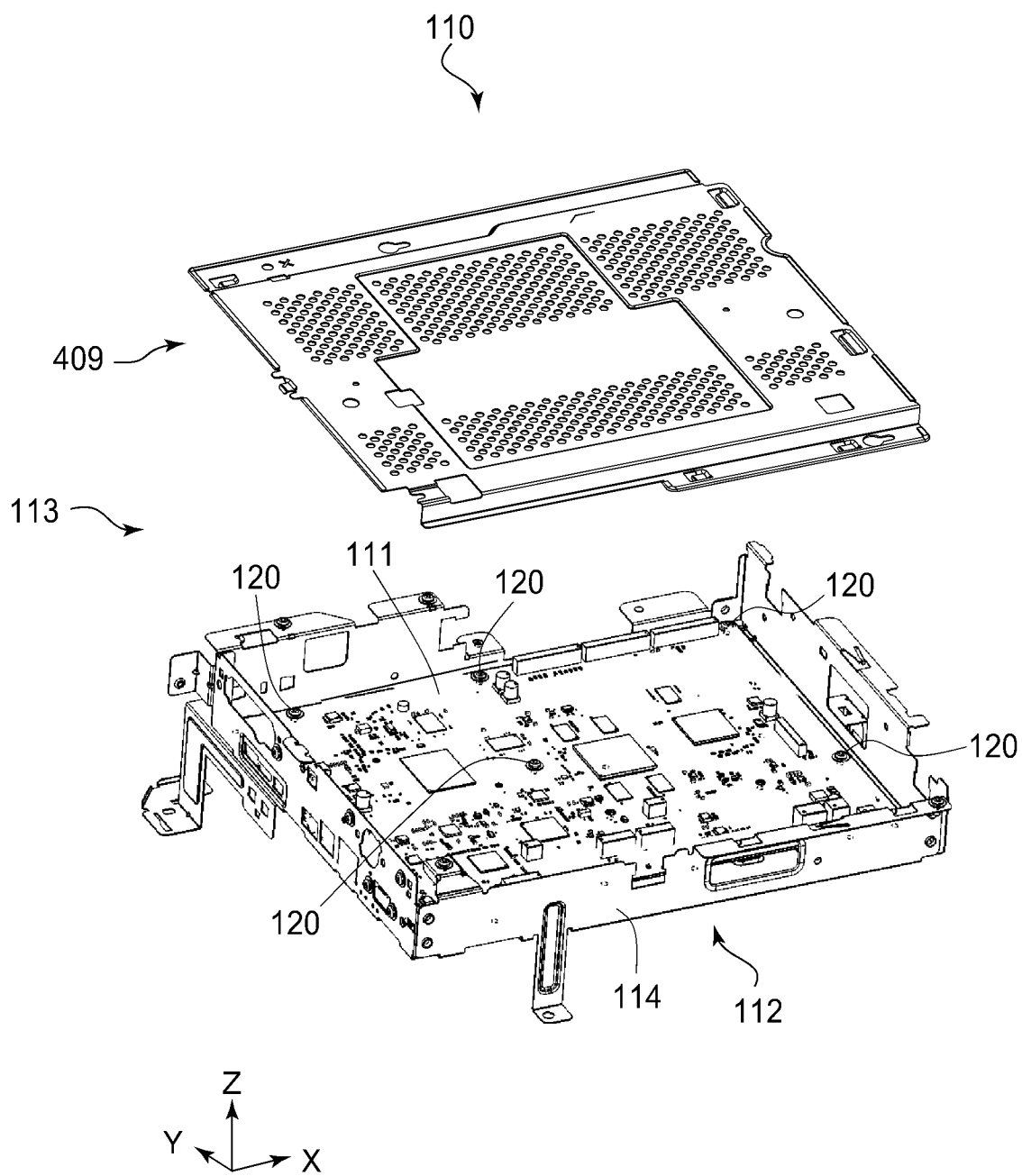
FIG. 4 is a back view showing a state before mounting the box shaped sheet metal and a top plate according to the first embodiment of the present invention.

FIG. 4 is a perspective view of the top plate 409 and the box shaped sheet metal 112 before the top plate 409 is attached to the box shaped sheet metal 112. Part (a) of FIG. 5 is a perspective view of the top plate 409 and the box shaped sheet metal 112 while the top plate 409 is attached to the box shaped sheet metal 112. Part (a) of FIG. 5 is a perspective view of the top plate 409 and the box shaped sheet metal 112 after the top plate 409 is attached to the box shaped sheet metal 112. The control board 111 is fastened and held to the box shaped sheet metal 112 by a screw 120 (a conductive member) which is an example of a screw member. As shown in FIG. 4, the top plate 409 moves in a minus Z axis direction, and as shown in part (a) of FIG. 5, the top plate 409 is arranged in contact with the box shaped sheet metal 112. After that, the top plate 409 is moved in a minus X axis direction, and as shown in part (b) of FIG. 5, the top plate 409 is contacted with a contact portion 403 of the box shaped sheet metal 112, and is fixed at fixed portions 408a and 408b by screws. At this time, the box shaped sheet metal 112 and the top plate 409 are in contact at contact portions 406 and 407. In the embodiment, the box sheet metal 112 and the top plate 409 are constructed of electrogalvanized steel plate.

Incidentally, as shown in FIG. 4, etc., the box shaped sheet metal 112 in the embodiment includes a bottom portion which includes a surface to which the control board 111 is fixed (a surface in which a thickness direction of the rear side plate 101 is parallel to a thickness direction) and four wall portions which are bent and raised with respect to the bottom portion. Further, the box shaped sheet metal 112 in the embodiment, together with the top plate 409, forms an accommodating space which accommodates the control board 111. Incidentally, as shown in FIG. 4, etc., the accommodating space may not be a completely sealed space, and openings or cutouts which are for inserting interconnect lines in which other board and the control board 111 are connected may be provided with the bottom portion or the four wall portions.

The frame member 100 is provided with an unshown power source cord connecting portion and a power source cord, and the power source cord connecting portion is possible to electrically connect a ground wire of the power source cord to the frame member 100. The rear side plate 101 and the box shaped sheet metal 112 are constituted of steel plates in which at least one of surfaces of each of the rear side plate 101 and the box shaped sheet metal 112 is covered with an insulating film.

The control board 111 is an image forming control board which controls a constituted member for image forming. Control circuits for each of the image forming portions are mounted on the control board 111. In order to ground the control board 111, firstly, the control board 111 is electrically connected to the box shaped sheet metal 112, next, the box shaped sheet metal 112 is attached to the frame member 100, and finally the frame member 100 is connected to the ground wire of the power source cord via the power source cord connecting portion and grounded. As the steel plate which constitutes the rear side plate 101 and the box shaped sheet metal 112, in the embodiment, a sheet metal 30 of the electrogalvanized steel plate 30 is used (see FIG. 6).

Here, the electrogalvanized steel plate which is used for the rear side plate 101 and the box shaped sheet metal 112 will be described by using FIG. 6. FIG. 6 is a sectional view showing the sheet metal 30 of a general electrogalvanized steel plate. The sheet metal 30 of the electrogalvanized steel plate includes a base material 31 which is an example of a metal layer which is made of metal, a galvanized layer 32, and a resin layer 33 which is an example of an insulating layer. The base material 31 is steel itself of the steel plate, and the galvanized layer 32 is a layer in which zinc on a surface of the base material 31 is plated. The galvanized layer 32 is constituted to prevent corrosion of the base material 31. Since both of the base material 31 and the galvanized layer 32 are metal, the base material 31 and the galvanized layer 32 are conductive, and the base material 31 and the galvanized layer 32 are referred to as a metal portion 34 as an example of a metal layer. The resin layer 33 is a layer (approximately 1 to 4 μm) which is added in order to add further value (stain resistance, lubricity, fingerprint resistance) to a surface of the galvanized layer 32 and is an insulating layer which are not conductive since it is a resin layer. Incidentally, typical thickness of the sheet metal 30 of the electrogalvanized steel plate is approximately 0.4 to 3.2 mm. In a following, an electrogalvanized steel plate which includes an insulating layer on a surface will be referred to as sheet metal. Further, there is colored steel plate as a steel plate with a similar constitution. The colored steel plate is a steel plate in which the resin layer 33 is coated with paint. The coated layer is also not conductive, so it is possible to apply the present invention. Incidentally, the sheet metal is cut at an edge to form a shape according to a shape of a part which is processed. Here, a cut surface of the sheet metal is conductive since the base material 31 of metal and the galvanized layer 32 are exposed.

[Conventional Box Shaped Sheet Metal and a Contact Portion of the Top Plate]

Here, before describing the embodiment, in the contact portion 406 in which the box shaped sheet metal 112 contacts the top plate 409, a constitution in which sheet metals whose surfaces are not conductive contact each other in a contact portion 1406 of a conventional example will be described. FIG. 7 is a perspective view of the contact portion 1406 of the conventional example in which the top plate 409 is attached to the box shaped sheet metal 112, and FIG. 8 is a sectional view showing a state when they are cut along line A-A in FIG. 7. The box shaped sheet metal 112 is constituted of sheet metal and includes a base material 112a, a galvanized layer 112b and a resin layer 112c. The base material 112a and the galvanized layer 112b constitute a metal portion 112d. Similarly, the top plate 409 is also constituted of sheet metal and includes a base material 409a, a galvanized layer 409b and a resin layer 409c. The base material 409a and the galvanized layer 409b constitute a metal portion 409d.

Therefore, even when the surface of the box shaped sheet metal 112 is contacted with the surface of the top plate 409, since the resin layers 112c and 409c are existed between them, the box shaped sheet metal 112 and the top plate 409 are electrically unstable with just that. The reason for the instability is that the insulating layers are thin layers of a few microns, so they may erode each other somewhat by being in contact and may become a conductive state. However, there may be a case that they are not conductive or a case that their resistance value is high even when they are conductive, so a connection may not be an intended electrically stable connection and may become a poor conduction.

In this way, in a case that the sheet metal is grounded stably, it is possible to reduce EMI which is caused by radiation noise from inside and suppress an invasion of ESD from outside by a structure which shields the electronic circuit board with the sheet metal. On the other hand, conductive parts such as sheet metal and electronic circuit board are not always electrically conductive in a case that they are in contact with each other, and as shown in FIG. 7 and FIG. 8, they are not grounded stably since unstable connection results in high impedance and high resistance.

Further, due to a recent increase in frequency speed, a factor of EMI for the electronic circuit board may extend to high frequencies above 1 GHz. The higher the frequency, the shorter the wavelength, so even short gaps (slits) in sheet metal may become a factor which amplifies EMI. In theory, resonance occurs when a wavelength $\lambda/2$ of a radiated noise matches a length of a slit. For example, in a case that a frequency is 6 GHz, a resonant slit length is 2.5 cm. In order to reduce a slit which contributes to a radiated noise resonance at high frequencies, grounding must be achieved by stable coupling between conductive metal parts (for example, sheet metal and sheet metal, electronic circuit board and sheet metal, etc.) at narrower intervals than ever. On the other hand, even in a case a chrome free steel plate is used, in order to achieve stable grounding, there is a technique for grounding by sliding a leading end of one plate to scrape off the resin coated layer of the other plate to expose metal inside when the sheet metals are coupled by screw members. However, process is performed to expose metal portion from the resin coated layer of the sheet metal, and in order to achieve a stable coupling, it is necessary to insert a conductive member and tighten with fastening members such as screw members or bolt-and-nut. Therefore, in a case of connecting at narrow intervals, a number of connecting structures such as conductive members and screw members are required. When the apparatus is assembled by using such parts, the number of parts and assembly time are increased, and this leads to increased costs.

[The Contact Portion Between the Box Shaped Sheet Metal and the Top Plate in the Embodiment]

In the following, the contact portion 406 and the contact portion 407 in the embodiment will be specifically described. Both of the contact portion 406 and the contact portion 407 are a coupling structure which couples the first sheet metal and the second sheet metal. In the embodiment, as shown in part (b) of FIG. 5, the electric component box 113 includes the contact portion 406 and the contact portion 407 whose constitutions are different, and the contact portion 406 and the contact portion 407 will be described.

Here, laser process, used in the embodiment, which creates a contact surface will be described. Part (a) of FIG. 9 is a sectional view showing a state in which laser is emitted to the sheet metal 30 which is the general electrogalvanized steel plate shown in FIG. 6. A head 50 of a laser emitting device includes a laser emitting portion 51. The head 50 of the laser emitting device in the embodiment is 150 mm in wide×430 mm in depth×230 mm in height, and there are no major restrictions on a mounting position. Further, a fiber laser with a wavelength of around 1064 nm or an individual laser (YV04 laser) are used.

In a case of forming a processed portion on the sheet metal 30 by laser, a laser 52 is emitted from the laser emitting portion 51 to the sheet metal 30. The resin layer 33 of the sheet metal 30 on which the laser 52 is emitted, is heated by the laser 52, and its surface temperature rises rapidly and it evaporates. As a result, as shown in part (b) of FIG. 9, the resin layer 33 is removed and a conductive portion 35 is formed. In the embodiment, the laser 52 is set to an output and an emitting time so that only the resin layer 33 is evaporated in order to remove only the resin layer 33. Even after the resin layer 33 is removed, corrosion resistance is retained since the galvanized layer 32 remains on the conductive portion 35.

Further, the laser which is emitted from the laser emitting portion 51 is possible to change an emitting direction within an emitting range 53 as shown in part (a) of FIG. 10 by moving an unshown mirror inside the head 50. By moving an emitting point little by little with a mirror as shown in part (a) of FIG. 10, it is possible to form the conductive portion 35 with a laser process as a region with not only a point but also a width as shown in part (b) of FIG. 10. Other than a mirror, the head 50 itself of the laser emitting device may move by a driving mechanism to process a region with a range, and this method is used when the conductive portion 35 is formed by laser process of a long distance, etc.

Further, it is possible to increase a power density of the laser 54 as shown in part (a) of FIG. 11. In this case, as shown in part (b) of FIG. 11, by not only evaporation of the surface resin layer 33 but also metal melting of the sheet metal 30, it is possible to form the conductive portion 35 which includes a solidified metal 36 which is conductive to the metal portion 34 and exposed to surface. Incidentally, in laser processes (laser marker processes) which are shown in from part (a) of FIG. 9 through part (b) of FIG. 11, cases that electrogalvanized steel plates are processed are described, however, similarly, it is also possible to apply for a colored steel plate. In process examples which are shown in from part (a) of FIG. 9 through part (b) of FIG. 10, only a coating film of a surface layer is evaporated in a case of a colored steel plate. However, a laser output, an emitting time, etc. are optimized for the colored steel plate.

Next, a case that the conductive portion 35 which is formed by the laser process is applied to the contact portion 406 will be described in detail by using Figures from 12 through 16. FIG. 12 is a perspective view of the contact portion 406 showing an example of shape when the top plate 409 which is an example of the second sheet metal contacts the box shaped sheet metal 112 which is an example of the first sheet metal. The contact portion 406 is a coupling structure in which planar conductive portions 413*a* and 412*a* which are created by the laser process are contacted together by surface contact. FIG. 13 is a perspective view of a receiving portion 413 of the box shaped sheet metal 112, and the conductive portion 413*a* which is an example of the first conductive portion which is created by the laser process is provided with the receiving portion 413. The conductive portion 413*a* corresponds to the conductive portion 35 which is shown in part (b) of FIG. 10 and is formed when the sheet metal of the box shaped sheet metal 112 is laser processed, and the metal portion 112*d* (see FIG. 15) is exposed. The conductive portion 413*a* is set to a laser output and an emitting time so that only the resin layer 33 evaporates, so the galvanized layer 112*b* (see FIG. 15) remains on the surface. Since all of laser processed portions in the embodiment are processed in a similar setting, details are omitted in following descriptions.

FIG. 14 is a perspective view showing an arm portion 412 of the top plate 409, and the conductive portion 412*a*, which is an example of the second conductive portion which is formed by the laser process, is provided with the arm portion 412. The conductive portion 412*a* is formed when the sheet metal of the top plate 409 is laser processed, and the metal portion 409*d* (see FIG. 15) is exposed. FIG. 15 is a sectional view of the contact portion 406 in which the conductive portions 413*a* and 412*a* which is created by the laser process in the embodiment are contacted together, is a sectional view showing a state when they are cut along line B-B in FIG. 12. FIG. 15 is contrasted with FIG. 8 which is the contact portion 1406 of the conventional example.

As shown in FIG. 15, the resin layer 112*c* of the box shaped sheet metal 112 and the resin layer 409*c* of the top plate 409, which are non-conductive layers, are removed by the laser process, and the conductive portion 413*a* of the box shaped sheet metal 112 and the conductive portion 412*a* of the top plate 409 are opposing and in contact with each other. Therefore, since the conductive portion 413*a* of the box shaped sheet metal 112 and the conductive portion 412*a* of the top plate 409 are contacted, a stable electrical connection is obtained as shown as an electric current f1. Since impedance is reduced by coupling between the box shaped sheet metal 112 and the top plate 409 as GND, it is possible to provide the stable contact portion 406 without retaining of unnecessary charge at unstable connecting portions when an external charge is input.

Further, in order to maintain contact between the conductive portion 413*a* and the conductive portion 412*a*, the box shaped sheet metal 112 and the top plate 409*a* are fixed by the screw 120 as shown in FIG. 16. Incidentally, a constitution for fixing the box shaped sheet metal 112 and the top plate 409 is not limited to the screw 120, however, the constitution may be fixed by a hooked shape by a sheet metal process. Further, the constitution for fixing the box shaped sheet metal 112 and the top plate 409 is preferable to provide in a vicinity of the contact portion 406 in order to strengthen fixing.

As shown in FIG. 16, the contact portion 406 in which the box shaped sheet metal 112 and the top plate 409 is arranged between the screws 120 which fix. Further, the contact portion 406 is provided at a plurality of locations of the first contact portion 406*a* and the second contact portion 406*b* between the screw 120 and the screw 120. Incidentally, there is no difference between the first contact 406*a* and the second contact 406*b* except that they are symmetrical in shape.

That is, the screw 120, which is an example of a coupling portion, couples the box shaped sheet metal 112 and the top plate 409, while the conductive portions 413*a* and the conductive 412*a* are at least partially in contact with each other. A coupling structure 41 which couples the box shaped sheet metal 112 and the top plate 409 in the embodiment is provided with the conductive portion 413*a*, the conductive portion 412*a* and the screws 120. And the screw 120 couples the box shaped sheet metal 112 and the top plate 409, while the conductive portion 413*a* and the conductive portion 412*a* are urged in directions of contacting each other. Thus, it is possible to stably contact the conductive portion 413*a* and the conductive portion 412*a*.

Next, a case that the conductive portion 35 which is formed by laser process is applied to the other contact portion 407 will be specifically described by using from FIG. 17 through FIG. 19. As shown in FIG. 17, the contact portion 407 is provided with fringe portions 423 and 422 which are provided in order to connect the box shaped sheet metal 112 and the top plate 409 to form a casing shape (see part (b) of FIG. 5). FIG. 17 is a perspective view showing the fringe portion 423 of the box shaped sheet metal 112 and the fringe portion 422 of the top plate 409, and the fringe portions 423 and 422 are fixed and connected by two engaging portions 410*a* and 410*b* which are separately arranged in the X direction.

Here, in a case that no conductive portion is provided on contact surfaces in the fringe portions 423 and 422 which are coupled while they are opposing and contacting each other, a contact is between non-conductive sheet metals as shown in FIG. 8. In this way, a contact between the fringe portions 423 and 422 of long sides which are even mechanically contacted but electrically unstable, is not preferable since it may be a source of resonance which amplifies EMI. Therefore, in the embodiment, a contact portion 407 is provided on these fringe portions 423 and 422 of the long side.

FIG. 18 is a perspective view showing the fringe portion 423 of the box shaped sheet metal 112, and the fringe portion 423 includes a conductive portion 423a, which is an example of the planar first conductive portion which is made by the laser process in the embodiment. The conductive portion 423a is in a state that the metal portion 112d is exposed since the resin layer 112c is peeled by the laser process of the sheet metal of the box shaped sheet metal 112 (see FIG. 15). Further, the fringe portion 423 includes engaging claws 433a and 433b which are an example of locking members which are a part of the engaging portions 410a and 410b.

FIG. 19 is a perspective view showing the fringe portion 422 of the top plate 409, and the fringe portion 422 includes the conductive portion 422a which is an example of the planar second conductive portion which is made by the laser process in the embodiment. The conductive portion 422a is in a state that the metal portion 409d is exposed since the resin layer 409c is peeled by the laser process of the sheet metal of the top plate 409 (see FIG. 15). Further, the fringe portion 422 includes engaging holes 432a and 432b which are an example of locked members which are a part of the engaging portions 410a and 410b.

In a case of assembling the top plate 409 to the box shaped sheet metal 112, the top plate 409 is fitted to the box shaped sheet metal 112 by sliding it in the −X direction. At this time, edges of the engaging holes 432a and 432b of the top plate 409 hook onto the engaging claws 433a and 433b of the box shaped sheet metal 112, and the engaging portions 410a and 410b are formed, and then a position of the top plate 409 with respect to the box shaped sheet metal 112 is fixed in the −X direction and Z direction. Further, in the embodiment, to ensure that the top plate 409 is firmly fixed to the box shaped sheet metal 112 after assembling, the top plate 409 and the box shaped sheet metal 112 are fixed by the screw 120 (see FIG. 17). However, even in a case that the screw 120 is not used in the contact portion 407, since the position of the top panel 409 is fixed by the engaging portions 410a and 410b, it is not necessary to provide the screw 120. Further, corrosion resistance of the conductive portions 423a and 422a of the fringe portions 423 and 422 is retained since the galvanized layers 112b and 409b are exposed, and it is possible to remove dirt and oxide film during storage of the sheet metal members by sliding movement while they are assembled, etc. Thus, it is possible to contact stably between the conductive portion 423a and the conductive portion 422a.

In this way, with respect to connection portions of the sheet metal with long distance, ideally, it is preferable to connect at narrow intervals in order to reduce EMI and improve performance of ESD resistance of the controller unit 110 as a shielded box. A number of conductive members and screw connection structures are required for an electrically stable connection, however, according to the embodiment, it is possible to realize an electrically stable grounding without relying on the number of connecting parts since same effect is obtained as a connecting at a number of points. That is, the coupling structure 41 which couples the box shaped sheet metal 112 and the top plate 409 in the embodiment is provided with the conductive portion 423a and the conductive portion 422a, the engaging claws 433a and 433b, the engaging holes 432a and 432b and the screw 120.

As described above, according to the coupling structure 41 in the embodiment, in a case of coupling between sheet metals which include an insulating coating film and metal portion such as chrome free steel sheet and colored steel, the laser process is applied to ensure that the metal portion is exposed from the insulating coating film and a structure that the exposed conductive portions are contacted is used. In this way, while electrically stable grounding is realized, it is possible to reduce the number of connection structures of the conductive members and the screw members and then it is possible to enhance EMI reduction and ESD resistance efficiently. Thus, electrically stable grounding is realized in the coupling structure 41 between sheet metals which is used in the image forming apparatus 1. Further, since a number of the connection structures of the conductive members and the screw members is not required, it is possible to suppress increase of the number of parts and assembly time.

Second Embodiment

Next, a second embodiment of the present invention will be described in detail with reference to from part (a) of FIG. 20 through part (b) of FIG. 23. In the embodiment, a constitution is different from that of the first embodiment in that the conductive portion is not flat but rather a straight protruding bead shape. However, since other constitutions in the embodiment is same as that of the first embodiment, same reference numerals are used and detailed descriptions are omitted. In the first embodiment, a constitution that the conductive portions 413a, 412a, 423a and 422a which are made by the laser process of the sheet metal members are contacted each other is described, however, in a case that sheet metal members, whose strength are weak and distortion are large, are used, the contact may not be stable since the contact is between two flat surfaces. Therefore, in the second embodiment, a structure, in which the sheet metal members are contacted at multiple points by applying sheet metal processes on the exposed metal surface, is provided. Here, as an example, a case that the coupling structure 42 is applied to the fringe portion 423 of the box shaped sheet metal 112 which is an example of the first sheet metal and the fringe portion 422 of the top plate 409 which is an example of the second sheet metal will be described.

Part (a) of FIG. 20 is a perspective view showing the fringe portion 423 of the box shaped sheet metal 112, and the fringe portion 423 includes, for example, two bead portions 451 which are aligned in the Y direction with the X direction as a longitudinal direction. A line drawing process is applied to the fringe portion 423, the laser process is applied to the line drawing and the bead portion 451 is formed. By applying the drawing process, an effect of maintaining levelness is also obtained due to work hardening of the fringe portion 423. Incidentally, in the embodiment, two of the bead portions 451 are provided, however, it is not limited to this, and one or even three or more of the bead portions 451 may be provided.

Part (b) of FIG. 20 is a sectional view when it is cut along the line C-C in part (a) of FIG. 20, showing one of the bead portions 451 of the fringe portion 423 of the box shaped sheet metal 112. Similar to FIG. 8, metal portions of the box shaped sheet metal 112 are the metal portions 112d respectively, which are metal members which include the base material 112a and the galvanized layer 112b. The laser process which is shown in part (a) of FIG. 10 is applied in order to bulge a shape by the drawing process and remove the resin layer 112c of the bulged portion. In this way, the bead portion 451 is formed.

FIG. 21 is a perspective view showing the fringe portion 422 of the top plate 409, and the fringe portion 422 includes, for example, seven of the bead portions 452 which are aligned in the X direction with the Y direction as the longitudinal direction. The bead portion 452 is provided so that a longitudinal direction of the bead portion 452 is perpendicular to a longitudinal direction of the bead portion 451 which is provided with the fringe portion 423 of the box shaped sheet metal 112. The line drawing process is applied to the fringe portion 422, the laser process is applied to the line drawing and the bead portion 452 is formed. By applying the drawing process, the effect of maintaining levelness is also obtained due to work hardening of the fringe portion 422. Incidentally, in the embodiment, seven of the bead portions 452 are provided, however, it is not limited to this, and from one through six or even eight or more of the bead portions 451 may be provided. Incidentally, a sectional shape of the bead portion 452 is similar to a sectional shape of the fringe portion 423 of the box shaped sheet metal 112 which is described in part (b) of FIG. 20, so the description is omitted.

Part (a) of FIG. 22 is a perspective view showing the fringe portion 423 of the box shaped sheet metal 112 and the fringe portion 422 of the top plate 409, and the fringe portions 423 and 422 are fixed and connected by two engaging portions 410a and 410b which are separately arranged in the X direction. The bead portion 451 which is formed on the fringe portion 423 of box shaped sheet metal 112 1 and the bead portion 422 which is formed on the fringe portion 422 of the top plate 409 are opposing and in contact with each other. As shown in part (b) of FIG. 22, the bead portion 451 and the bead portion 452 are opposing each other in a perpendicular relationship, and a point of intersection is a contact portion 417 in the embodiment. The coupling structure 42 which couples the box shaped sheet metal 112 and the top plate 409 in the embodiment is provided with the bead portion 451 which is an example of the first conductive portion, the bead portion 452 which is an example of the second conductive portion, and the screw 120 which is an example of the coupling portion.

Similar to the first embodiment, fixing portions are necessary in order to maintain contact state of the contact portion 417, the engaging portions 410a and 410b are separately arranged in the X direction to fix and connect the fringe portions 423 and 422 each other. While an intersection of the contact portion 417 is formed, the top plate 409 slides and fits into the box shaped sheet metal 112 in the -X direction and is fixed by the engaging portion 410. In the embodiment, corrosion resistance is retained since the galvanized layer 112b remains, and it is possible to remove dirt and oxide film during storage of the sheet metal members by sliding movement. Similar to the first embodiment, to ensure that the top plate 409 is firmly fixed to the box shaped sheet metal 112 after assembling, the top plate 409 and the box shaped sheet metal 112 are fixed by the screw 120.

Here, the contact portion 417, in which the bead portion 451 of the fringe portion 423 of the box shaped sheet metal 112 and the bead portion 452 of the fringe portion 422 of the top plate 409 are intersected and contacted each other, will be described by using parts (a) and (b) of FIG. 23. Part (a) of FIG. 23 is a plan view of the contact portion 417 in a state that the bead portion 451 of the fringe portion 423 of the box shaped sheet metal 112 and the bead portion 452 of the fringe portion 422 of the top plate 409 are intersected, when viewed from the Z direction. Part (b) of FIG. 23 is a sectional view of the contact area 417 showing a state when they are cut along line D-D in part (a) of FIG. 22. A center line C1 of the bead 451 of the box shaped sheet metal 112 is positioned at a peak of the drawing process of the bead portion 451 and positioned at substantially center of the contact portion 417 with the top plate 409. A center line C2 of the bead portion 452 of the top plate 409 is positioned at a peak of the drawing process of the bead portion 452 and positioned at substantially center of the contact portion 417 with the box shaped sheet metal 112.

In the embodiment, 14 points of the contact portions 417 in total are provided by providing two of bead portions 451 and seven of bead portions 452. Therefore, since the bead portion 451 of the box shaped sheet metal 112 and the bead portion 452 of the top plate 409 are contacted, a stable electrical connection is obtained as shown as an electric current f2. When the plurality of contact portions 417 between the fringe portion 423 and the fringe portion 422 of long side which are mechanically in contact but electrically unstable, it is possible to achieve reduction of impedance by coupling as GND of the box shaped sheet metal 112 and the top plate 409. Thus, it is possible to provide the stable contact 417 without unnecessary charges staying at unstable connection portion when charges are input from outside. Incidentally, it is possible to contact at multiple points and reduce an impedance of the contact portion 417 when the number of the contact portions 417 is increased and density of the contact portions 417 is increased, however, it is preferable to select appropriately according to performance which is required since it is a trade-off with difficulty and cost of process.

As described above, according to the coupling structure 42 in the embodiment, in a case of coupling between sheet metals which include an insulating coating film and metal portion such as chrome free steel sheet and colored steel, the laser process is applied to ensure that the metal portion is exposed from the insulating coating film and a structure that the exposed conductive portions are contacted is used. In this way, while electrically stable grounding is realized, it is possible to reduce the number of connection structures of the conductive members and the screw members and then it is possible to enhance EMI reduction and ESD resistance efficiently. Thus, electrically stable grounding is realized in the coupling structure 42 between sheet metals which is used in the image forming apparatus 1. Further, since a number of the connection structures of the conductive members and the screw members is not required, it is possible to suppress increase of the number of parts and assembly time.

Incidentally, in the second embodiment which is described above, a case in which the bead portion 451 is provided on the box shaped sheet metal 112 and at a same time the bead portion 452 is opposed to the bead portion 451 and provided on the top plate 409 is described, however, it is not limited to this. For example, only one of the bead portions 451 and 452 may be formed and the other may be flat.

Third Embodiment

Next, a third embodiment of the present invention will be described in detail with reference to parts (a) and (b) of FIG. 24. In the embodiment, a constitution is different from that of the second embodiment in that the bead portions 461 and 462 are formed by the metal melting of the laser process, not by the drawing process. However, since other constitutions in the embodiment is same as that of the second embodiment, same reference numerals are used and detailed descriptions are omitted. Here, as an example, a case that the coupling structure 43 is applied to the fringe portion 423 of the box shaped sheet metal 112 which is an example of the first sheet metal and the fringe portion 422 of the top plate 409 which is an example of the second sheet metal will be described.

In the second embodiment, the fringe portion 423 of the box shaped sheet metal 112 is provided with the bead portion 451 which is formed by the line drawing process. Instead of the bead portion 451 which is formed by the drawing process, in the third embodiment, the bead portion 461, which is formed by metal melting process in which power density of the laser 54 which is emitted from the laser emitting portion 51 of the laser emitting device which is shown in part (b) of FIG. 11 is increased, is used. In the method, as shown in part (b) of FIG. 11, while the resin layer 33 which is a surface of the metal sheet member is evaporated, metal is melted and forms the solidified metal 36 and the conductive portion 35 which conducts to the metal portion 34 is formed.

In the embodiment, the bead portion 461 is formed by using the metal melting process at a position of the bead portion 451 of the fringe portion 423 of the box shaped sheet metal 112 which is shown in FIG. 20. Further, the bead portion 462 is formed by using the metal melting process at a position of the bead portion 452 of the fringe portion 422 of the top plate 409 which is shown in FIG. 21. Similar to the second embodiment, the bead portion 461 which is formed on the fringe portions 423 of the box shaped sheet metal 112 and the bead portion 462 which is formed on the fringe portion 422 of the top plate 409 are opposed each other and contacted, and are connected at the contact portion 427.

Part (a) of FIG. 24 is a sectional view of the contact portion 427 showing a state when they are cut along line D-D in part (a) of FIG. 22 which is corresponded. The solidified metal 424 (which corresponds to the solidified metal 36) which is formed after melting the metal in the fringe portion 423 of the box shaped sheet metal 112 is melted and recessed in a center and is bulged at an edge. Similarly, the solidified metal 425 (which corresponds to the solidified metal 36) which is formed after melting the metal in the fringe portion 422 of the top plate 409 is melted and recessed in the center and is bulged at the edge. The contact portion 427 is formed by contacting the bead portions 461 and 462 each other which are constituted of the solidified metals 424 and 425. The coupling structure 43 which couples the box shaped sheet metal 112 and the top plate 409 in the embodiment is provided with the bead portion 461 which is an example of the first conductive portion, the bead portion 462 which is an example of the second conductive portion, and the screw 120 which is an example of the coupling portion. Therefore, since the bead portion 461 of the box shaped sheet metal 112 and the bead portion 462 of the top plate 409 are contacted, a stable electrical connection is obtained as shown as an electric current f3.

Part (b) of FIG. 24 is a plan view of the contact portion 427 in a state that the bead portion 461 of the fringe portion 423 of the box shaped sheet metal 112 and the bead portion 462 of the fringe portion 422 of the top plate 409 are intersected, when viewed from the Z direction. A center line C3 of the box shaped sheet metal 112 is positioned in a center of a melting portion of metal melting process of the bead portion 461 and a center line C4 of the top plate 409 is positioned in a center of a melting portion of the bead portion 462. The contact portion 427 in the embodiment does not contact at centers of the center line C3 and the center line C4, respectively, however the contact portion 427 contacts at portions in which swelling portions of edges which are created during the metal melting process.

In the embodiment, by providing a plurality of contact points between the box shaped sheet metal 112 and the top plate 409 by metal melting process, it is possible to achieve reduction of the impedance by coupling as GND. Although a positional accuracy of a processed production by metal melting is worse than in the other embodiments, it is possible to simply a manufacturing process in that it is not necessary to include additional manufacturing processes such as drawing process but it is possible only to introduce to the box shaped sheet metal 112 and the top plate 409. Further, it is possible to use a method to weld another metal by using a welding rod, when the metal melting process is applied. In that case, swelled weld beads are used as the bead portions 461 and 462, and a center portion along a center line such as the second embodiment becomes a most swelled shape.

As described above, according to the coupling structure 43 in the embodiment, in a case of coupling between sheet metals which include an insulating coating film and metal portion such as chrome free steel sheet and colored steel, the laser process is applied to ensure that the metal portion is exposed from the insulating coating film and a structure that the exposed conductive portions are contacted is used. In this way, while electrically stable grounding is realized, it is possible to reduce the number of connection structures of the conductive members and the screw members and then it is possible to enhance EMI reduction and ESD resistance efficiently. Thus, electrically stable grounding is realized in the coupling structure 43 between sheet metals which is used in the image forming apparatus 1. Further, since a number of the connection structures of the conductive members and the screw members is not required, it is possible to suppress increase of the number of parts and assembly time.

Fourth Embodiment

Next, a fourth embodiment of the present invention will be described in detail with reference to from FIG. 25 through part (d) of FIG. 29. In the embodiment, a constitution is different from that of the first embodiment in that a coupling structure 44 of the sheet metal is applied to an attachment of the rear side plate 101 which is an example of the second sheet metal and the box shaped sheet metal 312 which is an example of the first sheet metal of the electric component box 113. However, since other constitutions in the embodiment is same as that of the first embodiment, same reference numerals are used and detailed descriptions are omitted.

First, a conventional coupling structure which couples the controller unit 110 with the rear side plate 101, that is a conventional coupling structure which couples the box shaped sheet metal 212 with the rear side plate 101, will be described by using from FIG. 25 through part (b) of FIG. 27. FIG. 25 is a perspective view of the rear side plate 101 and the controller unit 110 when viewed from a rear surface side of the image forming apparatus 1. FIG. 26 is a perspective view of the rear side panel 101 before attaching the controller unit 110. A tap portion 102 which is to fix the screws 120 is formed on the rear side plate 101. The box shaped sheet metal 212 which holds the control board 111 is coupled with the rear side plate 101 by getting the screw 120 through a screw hole 114 and tightening to the tap portion 102. The rear side plate 101 and the box shaped sheet metal 212 are constituted of electrogalvanized steel sheet with an insulating layer on the surface.

[Conventional Coupling Structure of the Rear Side Plate and the Electric Component Box]

Here, a conventional example of method, to electrically connect between a sheet metal and a sheet metal which are not conductive on their surface, will be described by using part (a) and part (b) of FIG. 27. Part (a) of FIG. 27 is a sectional view (a sectional view when it is cut along line E-E in FIG. 25) of a screw portion of the conventional example in which the box shaped sheet metal 212 is fixed to the rear side plate 101 and is a case that its conductivity is good, and part (b) of FIG. 27 is a case that its conductivity is poor. Since the box shaped sheet metal 212 and the rear side plate 101 are constituted of sheet metal, there are non-conductive portions on the surface layer which are insulating layers. Conductive portions of the box shaped sheet metal 212 and the rear side plate 101 are conductive portions 212a and 101a respectively (which are corresponding to the metal portion 34 in FIG. 6), and non-conductive portions of the box shaped sheet metal 212 and the rear side plate 101 are non-conductive portions 212b and 101b (which are corresponding to the resin layer 33 in FIG. 6) respectively. Therefore, even in a case that the box shaped sheet metal 212 and the rear side plate 101 are in contact with each other on the surface, since there are non-conductive portions 212b and 101b between them, the box shaped sheet metal 212 and the rear side plate 101 are not conductive as they are.

In the case that the conductivity is good as shown in part (a) of FIG. 27, when fixing with the screw 120, a screw bearing surface 121 which is a contact portion of a screw head with the box shaped sheet metal 212 slides with the non-conductive portion 212b of the box shaped sheet metal 212 by a rotation and torque of the screw 120 during screwing. As a result, the screw bearing surface 121 scrapes off the non-conductive portion 212b and contacts with the exposed conductive portion 212a. The screw 120 itself is conductive since it is made of carbon steel with a galvanized surface. Thus, the screw 120 and the box shaped sheet metal 212 are conductive. Further, a screw thread portion 122 of the screw 120 screws and contacts with the tap portion 102 of the rear side plate 101. Since a tap hole is also provided in the conductive portion 101a, the screw 120 and the rear side plate 101 are conductive. As described above, the box shaped sheet metal 212 and the rear side plate 101 are conductive through the screw 120.

Next, in the case that the conductivity is poor as shown in part (b) of FIG. 27, when torque which used to screw the screw 120 is weak, the non-conductive portion 212b is not sufficiently scraped and the non-conductive portion 212b is remained. In this case, since it is not possible to contact the screw bearing surface 121 with the conductive portion 212a, conduction between the box shaped sheet metal 212 and the rear side plate 101 through the screw 120 may not be possible or may become unstable. A reason why the conduction becomes unstable is that the insulating layer is a thin layer of a few microns, is eroded each other somewhat due to contact, and may become a conductive state. However, in this situation, there is a case that it is not conductive or a case that a resistance value is high even when it is conductive, so the conduction may be poor in which it is not electrically stable connection which is intended.

In this way, under an assumption that stable grounding of the sheet metal is possible, it is possible to suppress an intrusion of ESD from outside and reduce EMI due to radiated noise from inside by applying a structure that the sheet metal shields the electronic circuit board. On the other hand, even when conductive parts such as a sheet metal and an electronic circuit board are contacted each other, it is not always conductive, and impedance and resistance may become high by an unstable connection and it is not a stable ground.

[A Coupling Structure of the Rear Side Plate and the Electric Component Box in the Embodiment]

In a following, a coupling structure 44 in the embodiment will be described in detail. Part (a) of FIG. 28 is a back view in a state that the controller unit 110 which includes the box shaped sheet metal 312 in the embodiment is attached to the rear side plate 101, and in a state before the screw 120 is attached. Part (b) of FIG. 28 is a state that the screw 120 is tightened in a state in part (a) of FIG. 28. Around the screw hole 314 which is an example of a through hole (a first through hole) in the box shaped sheet metal 312, an engraving 315 (a first conductive portion), in which a film which is the non-conductive portion 312b (see part (a) of FIG. 29) is removed by the laser process and the conductive portion 312a (see part (a) of FIG. 29) is partially exposed, is formed. An area of the engraving 315 is larger than an area of the screw bearing surface 121 which is a head portion of the screw 120. Incidentally, in the embodiment, a metal washer, etc. is not used when the screw 120 is fastened, however, washer, etc. may be used. In this case, the area of the engraving 315 is larger than a washer, etc. which is used.

Part (a) of FIG. 29 is a sectional view showing a state when it is cut along line F-F in part (a) of FIG. 28, and showing the screw hole 314 (a first through hole) and the engraving 315 which is formed by the laser process. Part (b) of FIG. 29 is a sectional view showing a state when it is cut along line G-G in part (b) of FIG. 28, and showing a state after the screw 120 (a screw member) is fastened. Part (c) of FIG. 29 is a plan view of the screw hole 314 and the engraving 315. The box shaped sheet metal 312 includes the conductive portion 312a (which is corresponding to the metal portion 34 in FIG. 6) and the non-conductive portion 312b (which is corresponding to the resin layer 33 in FIG. 6). Since the non-conductive portion 312b is removed from the engraving 315 (the conductive portion) by the laser process, the conductive portion 312a is exposed. That is, the engraving 135 is formed around the screw hole 314, and the non-conductive portion 312b is removed by the laser process, and the conductive portion 312a is exposed. Further, since only a surface layer of the resin layer is removed and the galvanized layer is remained, corrosion resistance is retained. As shown in part (c) of FIG. 29, a shape of the engraving 315 is formed as a concentric circle with the screw hole 314. The screw 120 includes a head portion 123 with the bearing surface 121 and the screw thread portion 122 (the screw portion) which is inserted into the screw hole 314 and the tap portion 102 (a second through hole) and fastens the box shaped sheet metal and the rear side plate 101. A diameter of the screw hole 314 is smaller than a diameter of the head portion 123, and a diameter of the tap portion 102 is smaller than the diameter of the screw hole 314.

In this state, the screw 120 is passed through the screw hole 314 and tightened to the tap portion 102, and then finally the screw bearing surface 121 and the conductive portion 312a which is exposed by the engraving 315 are contacted. Further, the screw thread portion 122 contacts with the tap portion 102 which is an example of the second conductive portion which is provided with the conductive portion 101a of the rear side plate 101. That is, the screw 120 screws the screw thread portion 122 with respect to the tap portion 102 so that the bearing surface 121 contacts the engraving 315. Since the screw 120 is conductive, the box shaped sheet metal 312 and the rear side plate 101 are conductive through the screw 120. By providing the engraving 315 and exposing the conductive portion 312a in advance, even in a case that torque is insufficient during tightening the screw, it is prevented that the conductive portion 312b are not conductive due to insufficient scraping of the non-conductive portion 312b, and it is possible to conduct stably between the box shaped sheet metal 312 and the rear side plate 101 through the screw. The coupling structure 44 which couples the box shaped sheet metal 312 and the rear side plate 101 in the embodiment is provided with the engraving 315, the tap portion 102 and the screw 120.

Further, a timing for engraving by the laser process is preferably just before tightening the screw for assembling in order to prevent staining of the engraved surface. The laser emitting device for the laser process is possible to install next to an assembly line due to its flexible installation location, and it is possible to process just before assembling. Thus, since it is a contact with the conductive portion 312a in which there is no dirt, it is possible to ensure the conduction more reliably.

As described above, according to the coupling structure 44 in the embodiment, in a case of coupling between sheet metals which include an insulating coating film and metal portion such as chrome free steel sheet and colored steel, the laser process is applied to ensure that the metal portion is exposed from the insulating coating film and a structure that the exposed conductive portions are contacted is used. In this way, while electrically stable grounding is realized, it is possible to reduce the number of connection structures of the conductive members and the screw members and then it is possible to enhance EMI reduction and ESD resistance efficiently. Thus, electrically stable grounding is realized in the coupling structure 44 between sheet metals which is used in the image forming apparatus 1. Further, since a number of the connection structures of the conductive members and the screw members is not required, it is possible to suppress increase of the number of parts and assembly time.

Incidentally, in the fourth embodiment which is described above, a case in which the shape of the engraving 315 is the concentric circle with the screw hole 314 is described, however, it is not limited to this. For example, the engraving may be line, and as shown in part (d) of FIG. 29, the engraving 316 which is an example of the first conductive portion may be line which intersects the edge of the screw hole 314, for example, it may be radially centered on the screw hole 314. It is possible to reduce a processing time, since an area in which a laser is emitted becomes small when the engraving is line. Since the resin layer which is the non-conductive portion 312b of the sheet metal is extremely thin and deforms elastically by tightening the screw, it is possible to contact the conductive portion 312a which is at the engraving 316 with the screw bearing surface 121. Thus, it is possible to conduct even when the engraving 316 is linear. Further, by providing line or dot engraving, it becomes a starting point for scraping the resin layer during tightening the screw, so the resin layer is easier to scrape and its conductivity is stable.

Fifth Embodiment

Next, a fifth embodiment of the present invention will be described in detail with reference to from FIG. 30 through part (b) of FIG. 33. In the embodiment, a constitution is different from that of the fourth embodiment in that a portion of an engraving 136 around a screw hole 132 is formed in a protruding shape. However, since other constitutions in the embodiment is same as that of the fourth embodiment, same reference numerals are used and detailed descriptions are omitted.

FIG. 30 is a perspective view of the image forming apparatus 1 when it is viewed from the rear side surface while an outer cover of the image forming apparatus 1 is attached. FIG. 31 is a perspective view while a rear cover 131 which is in a position to mainly cover the control board 111 is removed. The rear cover 131 which is an example of the first sheet metal, is constituted of a colored steel plate which includes a non-conductive paint film on its surface. Further, the rear cover 131 is fastened by the screws 120 to the tap portions 116 and 117 which are examples of the second conductive portions of the box shaped sheet metal 312 which is an example of the second board and the tap portions 104 and 105 which are examples of the second conductive portions of the rear side plate 101 which is an example of the second board. A back lower cover 130 mainly covers an area below the control board 111. Since the rear cover 131 has a function as a cover member which covers the control board 111, the rear cover 131 is a part in which conductivity of the box shaped sheet metal 312 and the rear side plate 101 is important from a viewpoint of noise prevention.

Part (a) of FIG. 32 is a perspective view showing the rear cover 131. The rear cover 131 is provided with four through holes for screw fastening and they are the screw holes 132, 133, 134 and 135, respectively. Since the screw holes 132, 133, 134 and 135 are all similar in shape, so the screw hole 132 will be described in detail below.

Part (b) of FIG. 32 is an enlarged perspective view of the screw hole 132. Around the screw hole 132 which is an example of the first through hole in the rear cover 131, the paint film which is a non-conductive portion 131b (see part (a) of FIG. 33) is removed by the laser process, and the engraving 136 (the first conductive portion) in which a part of a conductive portion 131a (see part (a) of FIG. 33) is exposed is formed. In the engraving 136, the galvanized layer which is the conductive portion 131a is exposed. The engraving 136 is constituted of a following three surfaces. A first surface is an outer surface 136c on a same surface as the conductive portion 131a which is an exterior surface of the rear cover 131, a second surface is a protruding surface 136a which protrudes outward from the outer surface 136c, and a third surface is a sloping surface 136b which is continuous with the outer surface 136c and the protruding surface 136a. A process of protruding a surrounding portion of the screw hole 132 outward is performed, for example, by a press process, and after that the laser process is performed. Alternatively, the laser process may be performed first, and after that the press process may be performed.

A shape of the engraving 136 is formed to be concentric with the screw hole 132. Further, a periphery of the outer surface 136c is smaller than the screw bearing surface 121 of the screw 120, and after tightening the screw 120, the engraving 136 is completely hidden behind the screw bearing surface 121 and is not seen. In this way, when the engraving 136 is smaller than an outer shape of the screw bearing surface 121, the engraving 136 in which the paint film is removed is not exposed on an exterior, and sense of design is maintained. In the embodiment, a metal washer, etc. is not used to fasten the screw 120, however, a washer, etc. may be used. In this case, an area of the engraving 136 is smaller than the washer, etc. which is used. Incidentally, size and shape of the engraving 136 are common with those of the screw holes 132, 133, 134 and 135.

Part (a) of FIG. 33 is a sectional view of the screw hole 132 while the rear cover 131 is attached to the image forming apparatus 1. Although the box shaped sheet metal 312 and the rear cover 131 are in contact, they include the non-conductive portions 312b and 131b respectively, so at this stage the box shaped sheet metal 312 and the rear cover 131 are not conductive.

Part (b) of FIG. 33 is a sectional view when the screw 120 is tightened. The screw bearing surface 121 of the screw 120 is not strictly flat, however, a protruding portion 121b in which an outer periphery portion of the screw bearing surface 121 is protruding toward a leading edge side of the screw thread portion 122 is formed. The engraving 136 protrudes on an opposite side of the box shaped sheet metal 312. Here, when the engraving 136 is flat, the protruding portion 121b of the screw bearing surface 121 contacts with the engraving 136. Furthermore, when the size of the engraving 136 is smaller than the outer shape of the screw bearing surface 121 in order to consider an appearance, a contact with the engraving 136 may not be stable, since the protruding portion 121b of the screw bearing surface 121 may not contact the engraving 136 and may contact only the paint film surface in which the engraving 136 is not formed.

On the other hand, in the embodiment, by providing a protruding surface 136a which is a protrusion portion on the rear cover 131 side, the screw bearing surface 121 contacts the protruding surface 136a which is a conductive portion before the protruding portion 121b of the screw bearing surface 121, so it is possible to securely contact at the conductive portion. Further, since the screw 120 contacts the tap portion 116 in which the screw thread portion 122 is located at the conductive portion of the box shaped sheet metal 312, it is possible to conduct the rear cover 131 and the box shaped sheet metal 312 through the screw 120. A coupling structure which couples the rear cover 131 and the box shaped sheet metal 312 in the embodiment is provided with the engraving 136, the tap portions 116 and 117 and the screw 120. Further, the coupling structure 45 which couples the rear cover 131 and the rear side plate 101 in the embodiment is provided with the engraving 136, the tap portion 104 and 105 and the screw 120.

In this way, since the non-conductive portion 131b is removed in advance and the conductive portion 131a is exposed, so it is possible to eliminate an uncertainty factor of scraping the non-conductive portion 131b by torque during tightening the screw and ensure stable conduction. Further, even in a case that the engraving 136 is smaller than the outer shape of the screw bearing surface 121 in order to consider the appearance, it is possible to securely contact the screw bearing surface 121 with the protruding surface 136a which is the conductive portion by providing the protruding surface 136a which is a protruding shape of the engraving 136.

As described above, according to the coupling structure 45 in the embodiment, in a case of coupling between sheet metals which include an insulating coating film and metal portion such as chrome free steel sheet and colored steel, the laser process is applied to ensure that the metal portion is exposed from the insulating coating film and a structure that the exposed conductive portions are contacted is used. In this way, while electrically stable grounding is realized, it is possible to reduce the number of connection structures of the conductive members and the screw members and then it is possible to enhance EMI reduction and ESD resistance efficiently. Thus, electrically stable grounding is realized in the coupling structure 45 between sheet metals which is used in the image forming apparatus 1. Further, since a number of the connection structures of the conductive members and the screw members is not required, it is possible to suppress increase of the number of parts and assembly time.

Incidentally, in the fifth embodiment which is described above, a case in which the shape of the engraving 136 is the concentric circle with the screw hole 132 is described, however, it is not limited to this. For example, the engraving may be linear, and the engraving 136 may be a line which intersects an edge of the screw hole 132, or, for example, it may be radial which is centered on the screw hole 132 (see part (d) of FIG. 29).

Sixth Embodiment

Next, a sixth embodiment of the present invention will be described in detail with reference to from FIG. 34 through part (b) of FIG. 37. In the embodiment, a constitution is different from that of the first embodiment in that a coupling structure 46 of the sheet metal is applied to an attachment of the control board 111 and a box shaped sheet metal 512 which is an example of the sheet metal member of the electric component box 113. However, since other constitutions in the embodiment is same as that of the first embodiment, same reference numerals are used and detailed descriptions are omitted.

First, a conventional coupling structure between the control board 111 and the box shaped sheet metal 512 will be described by using from FIG. 34 through part (b) of FIG. 36. FIG. 34 is a back view showing the rear side plate 101 and the electric component box 113 when they are viewed from the rear surface side of the image forming apparatus 1, while the box shaped sheet metal 512 and the control board 111 are attached. The control board 111 is coupled to the electric component box 113 by using screws 310 (conductive member) at eight points. The electric component box 113 is coupled to the rear side plate 101 by using screws 360 at two points. FIG. 35 is a perspective view showing the box shaped sheet metal 512. The box shaped sheet metal 512 is a box shaped sheet metal which holds and protects the control board 111. In order to attach the control board 111, flange-shaped screw fastening portions 306, in which screw holes 330 (see part (a) of FIG. 36) are formed, are formed at three points on each side and eight points in total.

Part (a) of FIG. 36 is a perspective view showing details of a conventional attaching structure of the control board 111 and the screw fastening portion 306. A hole 340, which is an example of a through hole through which the screw 310 passes, is provided with the control board 111, the screw 310 is tightened into the screw hole 330 which is formed in the screw fastening portion 306, and the control board 111 is assembled.

Part (b) of FIG. 36 is a sectional view showing a state that the control board 111 is attached to the conventional screw fastening portion 306 by the screw 310. Part (b) of FIG. 36 is a sectional view of the general electrogalvanized steel sheets which are materials of the control board 111 and the screw fastening portion 306. The screw fastening portion 306 includes a metal portion 306a, which is made of a base material of sheet metal and a galvanized layer and conductive, and a resin layer 306b. The control board 111 includes a core material 304, a copper foil 303 which covers a front surface and a back surface and a resist 302 which is provided on the front surface and the back surface. Further, a lead solder 305 is welded and provided under a surface of the copper foil 303 and is contacted with the screw fastening portion 306. This solder 305 protrudes more than the resist 302, and the screw fastening portion 306 is contacted with the solder 305, not the resist 302.

Next, a flow of electric current f4, which is generated when the screw fastening portion 306 is conductive from the control board 111 through the screw 310, will be described. A surface of the base material of the screw 310 is surface treated similar to the electrogalvanized steel sheet, and a resin coating layer is formed on the screw 310. While the screw 310 is screwed, since a screw head 318 rotates and presses against the control board 111 while sliding with the control board 111, the resin layer of the screw head 318 is scraped off and the base material and the copper foil 303 which is an example of the third conductive portion are directly contacted. Since a screw thread 319 rotates in a same way and presses against the screw hole 330 while sliding with the screw hole, the resin layer is scraped off and the screw thread 319 and the metal portion 306a of the screw hole 330 are directly contacted. As a result, when a charge from outside is input to the control board 111, as shown by the electric current f4, the charge is flown to the screw head 318 from the copper foil 303, passed through the screw 310, flown to the metal portion 306a through the screw thread 319, and fallen to the ground.

Here, it is preferable that an assembly angle at which the screw 310 passes through the screw fastening portion 306 is right angle, however, in a case that a worker assembles it, variations of around ±10° may occur. Accordingly, there is variation in a way that the resin layer is scraped off during tightening the screw. Thus, when it is not sufficiently scraped off, resistance value may be high and grounding may not be stable.

[The Coupling Structure of the Box Shaped Sheet Metal and the Control Board in the Embodiment]

The coupling structure 46 in the embodiment will be described in detail below. In the embodiment, the laser process is applied to a side surface of the control board 111 side of the screw fastening portion 306, the resin layer 306b is removed and a coupling surface 307 is formed. Part (a) of FIG. 37 is a perspective view showing the coupling structure 46 of the control board 111 and the coupling surface 307 in which the resin layer 306b is removed. Similar to a case of part (a) of FIG. 36, the hole 340 (the first through hole), which is an example of a through hole through which the screw 310 passes, is provided with the control board 111, the screw 310 is tightened into the screw hole 330 (the second through hole) and the control board 111 is assembled.

Part (b) of FIG. 37 is a sectional view when the coupling surface 307 in which the resin layer 306b is removed by the laser process and the control board 111 are coupled. The metal portion 306a in which the resin layer 306b is removed by the laser process is possible to contact with the solder 305 without the need to apply a force like sliding when stopping the screw 310. That is, the coupling surface 307, which is an example of the second conductive portion, contacts with the solder 305 which is an example of the first conductive portion of the control board 111, and the control board 111 and the screw fastening portion 306 are conductive. In this way, the coupling structure 46 couples the control board 111 and the box shaped sheet metal 512. The coupling structure 46 which couples the control board 111 and the box shaped sheet metal 512 in the embodiment is provided with the solder 305 which is an example of the second conductive portion, the coupling surface 307 which is an example of the first conductive portion and the screw 310.

Therefore, when a charge from outside is input, as shown by the electric current f4 like the conventional example, the charge is flown to the metal portion through the screw 310 (the screw member) which is an example of the coupling portion and fallen to the ground. In addition to that, electric current f5 is flown from the solder 305 on the control board 111 to the coupling surface 307 of the screw fastening portion 306. That is, in the electric current f5, the charge flows through points of low resistance and become a new flow in addition to the electric current f4, and it is possible to reduce impedance with the electric component box 113 which constitutes of the control board 11 and the coupling surface 307 and supply stable GND to an electric circuit. Further, when coupling the control board 111 and the coupling surface 307, in a case that an opening portion of the resist 302 of the control board 111 is larger than the coupling surface 307 in which the laser process is performed, thickness (approximately 40 μm) of the resist 302 does not interfere with the coupling. Thus, it is possible to supply the stable GND without the solder 305.

As described above, according to the coupling structure 46 in the embodiment, in a case of coupling between sheet metals which include an insulating coating film and metal portion such as chrome free steel sheet and colored steel, the laser process is applied to ensure that the metal portion is exposed from the insulating coating film and a structure that the exposed conductive portions are contacted is used. In this way, while electrically stable grounding is realized, it is possible to reduce the number of connection structures of the conductive members and the screw members and then it is possible to enhance EMI reduction and ESD resistance efficiently. Thus, electrically stable grounding is realized in the coupling structure 46 between sheet metals which is used in the image forming apparatus 1. Further, since a number of the connection structures of the conductive members and the screw members is not required, it is possible to suppress increase of the number of parts and assembly time.

Incidentally, in the sixth embodiment which is described above, a case of removing the resin layer 306b on the entire surface of the screwing portion 306 is described, however, it is not limited to this. An area in which the resin layer 306b is removed may not be an entire surface of the screw fastening portion 306, however, it may be large enough to ensure contact with the solder 305.

Seventh Embodiment

Next, a seventh embodiment of the present invention will be described in detail with reference to from FIG. 38 through part (b) of FIG. 40. In the embodiment, a constitution is different from that of the sixth embodiment in that screws 310 in which the control board 111 is screwed to the box shaped sheet metal 612 which is an example of the sheet metal member are reduced in a coupling structure 47. However, since other constitutions in the embodiment is same as that of the sixth embodiment, same reference numerals are used and detailed descriptions are omitted. When a number of screws 310 are applied, there is a problem that the number of parts and assembly time are increased. Therefore, in the embodiment, while preventing conduction failures in the control board 111, the number of parts and assembly time are reduced by reducing the number of screws 310. The coupling structure 47 couples the control board 111 and the box shaped sheet metal 612.

FIG. 38 is a perspective view of the box shaped sheet metal 612 in the embodiment. The box shaped sheet metal 612 is provided with the four screw fastening portions 606 with unshown screw holes at four locations of four corners of the box shaped sheet metal 612, and contact portions 630 without screw holes are provided at four locations in a center of each side of the box shaped sheet metal 612. A constitution of the screw fastening portion 606 is similar to the screw fastening portion 306 in the sixth embodiment (see part (a) of FIG. 37), so detailed descriptions are omitted. As shown in FIG. 39, the contact portion 630 is made of the general electrogalvanized steel sheet, and the resin layer 606b is scraped off by the laser process and a coupled surface 631 which is an example of the second conductive portion in which a metal portion 606a is exposed. Similarly, in the screw fastening portion 606, an unshown coupling surface (see the coupling surface 307 in part (a) of FIG. 37) which is an example of the second conductive portion is also formed. The coupling structure 47 which couples the control board 111 and the box shaped sheet metal 612 in the embodiment is provided with the solder 305 which is an example of the second conductive portion, the coupling surface 631 which is an example of the first conductive portion and the screw 310.

Part (a) and part (b) of FIG. 40 are sectional views showing a state when it is cut along line H-H in FIG. 38, and showing a height relationship between the control board 111, the screw fastening portion 606 and the contact portion 630. As shown in part (a) and part (b) of FIG. 40, the screw fastening portion 606 which fixes the screw 310 is 1 to 2 mm lower in height than the contact portion 630 which is not screwed. By having different heights in this way, for example, as shown in part (a) of FIG. 40, in a case that the contact portion 630 is arranged between the two screw fastening portions 606, the control board 111 which is supported by the two screw fastening portions 606 is pressed against the contact portion 630. Further, as shown in part (b) of FIG. 40, for example, in a case that the screw fastening portion 606 is arranged between the two contact portions 630, the control board 111 which is supported by the two screw fastening portions 606 is pressed against the contact portion 630. In this way, by making the height of the screw fastening portion 606 lower than the height of the contact portion 630, the control board 111 is pressed against the contact portion 630 by elasticity of the control board 111 at from 200 to 500 gf.

Incidentally, in the embodiment, the difference in height is defined as from 1 to 2 mm, however, this difference in height changes depending on the size of the control board 111 and the interval of the screw 310. For example, in a case that the interval between the screws 310 is approximately 90 mm, an effect on small parts such as chip capacitors is little even when it is flexed between them within approximately 1 mm.

As shown in FIG. 39, since the contact portion 630 is pressed against the control board 111 by the elasticity of the control board 111, the coupling surface 631 is in constant contact with the solder 305 due to the pressing force. The pressing force on the screw fastening portion 606 by using the screw 310 is from 2 to 5 kgf, and the pressing force on the contact portion 630 is one tenth compared to this. However, since the resin layer 606b is scraped off in advance, it is possible to secure electric current f6 when it is pressed down by a few grams. Thus, when a charge is input to the control board 111 from an outside, the charge is transmitted from the copper foil 303 of the control board 111 to the solder 305 and flows to the coupling surface 631, so grounding is ensured.

As described above, according to the coupling structure 47 in the embodiment, in a case of coupling between sheet metals which include an insulating coating film and metal portion such as chrome free steel sheet and colored steel, the laser process is applied to ensure that the metal portion is exposed from the insulating coating film and a structure that the exposed conductive portions are contacted is used. In this way, while electrically stable grounding is realized, it is possible to reduce the number of connection structures of the conductive members and the screw members and then it is possible to enhance EMI reduction and ESD resistance efficiently. Thus, electrically stable grounding is realized in the coupling structure 47 between sheet metals which is used in the image forming apparatus 1. Further, since a number of the connection structures of the conductive members and the screw members is not required, it is possible to suppress increase of the number of parts and assembly time.

Eighth Embodiment

Next, an eighth embodiment of the present invention will be described in detail with reference to from FIG. 41 through part (d) of FIG. 42. In the embodiment, a constitution is different from that of the seventh embodiment in that screws 310 in which the control board 111 is screwed to the box shaped sheet metal 712 which is an example of the sheet metal member are further reduced in a coupling structure 48. However, since other constitutions in the embodiment is same as that of the seventh embodiment, same reference numerals are used and detailed descriptions are omitted. When screwing points of the screw 310 are fewer, it is possible to reduce the assembly time and the disassembly time. However, in a case that the number of the screwing points are reduced, a degree of freedom of the control board 111 is increased during transportation of the image forming apparatus 1, and conduction failure, etc. may occur by vibration. Therefore, in the embodiment, while preventing conduction failure between the box shaped sheet metal 712 and the control board 111, the number of the screws 310 are further reduced. The coupling structure 48 couples the control board 111 and the box shaped sheet metal 712. The coupling structure 47 which couples the control board 111 and the box shaped sheet metal 712 in the embodiment is provided with the solder 305 which is an example of the second conductive portion, the coupling surface which is an example of the first conductive portion and the screw 310.

FIG. 41 is a perspective view of the box shaped sheet metal 712 in the embodiment. The box shaped sheet metal 712 is provided with two of the screw fastening portions 706 with unshown screw holes at two opposite corners, and six of the contact portions 730 without screw holes are provided at other corners and center portions of each side. Furthermore, the box shaped sheet metal 712 includes two of regulating portions 740 which are examples of holding portions for directly positioning the control board 111. The resin layer on the control board 111 side is removed from both of the screw fastening portions 706 and the contact portions 730 by the laser process.

Part (a) of FIG. 42 is a sectional view showing a state when it is cut along line I-I in FIG. 41 and part (b) of FIG. 42 is a sectional view showing a state when it is cut along line J-J in FIG. 41, and they shows height relationships among the control board 111, the screw fastening portion 706, the contact portion 730 and the regulating portion 740. As shown in part (a) of FIG. 42, the screw fastening portion 706 which fixes the screw 310 is 1 to 2 mm lower in height than the contact portion 730 which is not screwed. Further, the regulating portion 740 is as high as a height for pressing the control board 111 which is contacted with the contact portion 730.

Therefore, for example, as shown in part (a) of FIG. 42, in a case that the contact portion 730, the regulating portion 740, the contact portion 730 and the screw fastening portion 706 are arranged from left to right in order, the regulating portion 740 and the screw fastening portion 706 press the control board 111 from above. Therefore, the control board 111 is pressed by elasticity against the contact portion 730 at from 200 to 500 gf. In the embodiment, there are fewer screw fastening points with the screws 310 than in the seventh embodiment, the control board 111 is regulated by the regulating portion 740 in an upward direction so as not to vibrate in a vertical direction during transportation.

Part (c) and part (d) of FIG. 42 are sectional views showing a state when they are cut along line I-I in FIG. 41, and showing a state that the control board 111 is assembled into the box shaped sheet metal 712. As shown in part (c) of FIG. 42, when the control board 111 is coupled with the contact portion 730 of the box shaped sheet metal 712, the regulating portion 740 is deformed in a direction of an arrow C while the control board 111 is pushed down along the regulating portion 740. When the control board 111 is pushed down further, as shown in part (d) of FIG. 42, the control board 111 enters into underside of the regulating portion 740 and contacts with the contact portion 730. The regulating portion 740 which was elastically deformed is restored to its original shape. Since the control board 111 is on the underside of the regulating portion 740, movement is regulated even when the control board 111 is urged in an upward direction, so it is possible to prevent conduction failure between the box shaped sheet metal 712 and the control board 111.

Further, it is preferable that the resin layer is removed for a contact surface of the regulating portion 740 with the control board 111 and the resist 302 is not applied on contact side of the control board 111 in the portion. Therefore, it is possible to provide more stable GND level to the electric circuit by electrically connecting between the control board 111 and the electrical box 113.

As described above, according to the coupling structure 48 in the embodiment, in a case of coupling between sheet metals which include an insulating coating film and metal portion such as chrome free steel sheet and colored steel, the laser process is applied to ensure that the metal portion is exposed from the insulating coating film and a structure that the exposed conductive portions are contacted is used. In this way, while electrically stable grounding is realized, it is possible to reduce the number of connection structures of the conductive members and the screw members and then it is possible to enhance EMI reduction and ESD resistance efficiently. Thus, electrically stable grounding is realized in the coupling structure 48 between sheet metals which is used in the image forming apparatus 1. Further, since a number of the connection structures of the conductive members and the screw members is not required, it is possible to suppress increase of the number of parts and assembly time.

Other Embodiments

In the embodiments which are described above, the electrogalvanized steel sheet is shown as an example of steel sheet constituting the rear side plate 101, the box shaped sheet metal 112, etc., however, it is not limited to this, and colored steel sheet may be used. Further, an image forming control board is shown as an example of the control board 111 which is accommodated in the electric component box 113, however, it is not limited to this, and a sheet feeding control board, a fax board, or a power supply board may be used. Further, the box shaped sheet metal 112, etc. which supports the control board 111 from the rear surface is fixed to the rear side plate 101, however, it may be fixed to any of side plates which are provided on front, right and left sides other than the rear side plate 101.

According to the present invention, in a coupling structure between sheet metals which are used in an image forming apparatus, it is possible to achieve electrically stable grounding.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-151976 filed on Sep. 17, 2021, which is hereby incorporated by reference herein in its entirety.

What is claimed is:

1. A coupling structure provided in an image forming apparatus that forms an image on a recording material and constituted to couple a first sheet metal and a second sheet metal having an insulative layer on a galvanized layer on a surface of a metal layer, respectively, the coupling structure comprising:
   a first conductive portion from which the insulative layer is removed but the galvanized layer remains and is exposed in the first sheet metal;
   a second conductive portion from which the insulative layer is removed but the galvanized layer remains and is exposed in the second sheet metal; and
   a coupling portion constituted to couple the first sheet metal and the second sheet metal in a state in which at least a part of the first conductive portion and at least a part of the second conductive portion are contacted with each other.

2. The coupling structure according to claim 1, wherein the first conductive portion and the second conductive portion are respectively flat and are contacted in surface contact with each other.

3. The coupling structure according to claim 1, wherein at least one of the first conductive portion and the second conductive portion has a shape projecting to the other of the first conductive portion and the second conductive portion.

4. The coupling structure according to claim 1, wherein the coupling portion includes an engaging portion formed on the first sheet metal, and an engaged portion formed on the second sheet metal and constituted to couple the first sheet metal and the second sheet metal by the engaging portion being engaged.

5. The coupling structure according to claim 1, wherein the coupling portion includes a screw member fastening the first sheet metal and the second sheet metal.

6. The coupling structure according to claim 5,
   wherein the first sheet metal is provided with a first through hole,
   wherein the second sheet metal is provided with a second through hole which is the second conductive portion,
   wherein the screw member includes a conductive member having a head portion having a seat surface and a screw portion inserted into the first through hole and the second through hole,
   wherein a diameter of the first through hole is smaller than a diameter of the head portion,
   wherein a diameter of the second through hole is smaller than the diameter of the first through hole,
   wherein the first conductive portion is formed around the first through hole of a surface on a side opposite to the second sheet metal and exposes the metal layer at least where the insulative layer is removed, and wherein the screw portion of the screw member is screwed in the second through hole so that the seat surface comes in contact with the first conductive portion.

7. The coupling structure according to claim 6, wherein the first conductive portion projects to the side opposite to the second sheet metal.

8. The coupling structure according to claim 6, wherein the first conductive portion is concentrically formed with the first through hole.

9. The coupling structure according to claim 6, wherein the first conductive portion has a linear shape crossing an edge of the first through hole.

10. The coupling structure according to claim 1,
wherein the image forming apparatus has an electric component box constituted to accommodate a control board that controls the image forming apparatus, and an attaching member to which the electric component box is attached,
wherein the first sheet metal is a side plate, and
wherein the second sheet metal is the electric component box.

11. The coupling structure according to claim 1,
wherein the image forming apparatus has an electric component box constituted to accommodate a control board that controls the image forming apparatus, and an attaching member to which the electric component box is attached,
wherein the electric component box includes a casing and a cover,
wherein the first sheet metal is the casing,
wherein the second sheet metal is the cover.

12. A coupling structure provided in an image forming apparatus that forms an image on a recording material and constituted to couple a first sheet metal and a second sheet metal having an insulative layer on a galvanized layer on a surface of a metal layer, respectively, the coupling structure comprising:
a first through hole formed in the first sheet metal;
a second through hole formed in the second sheet metal; and
a screw member includes a head portion having a seat surface and a screw portion inserted into the first through hole and the second through hole, and constituted to fasten the first sheet metal and the second sheet metal,
wherein a diameter of the first through hole is smaller than a diameter of the head portion,
a diameter of the second through hole is smaller than the diameter of the first through hole,
the first sheet metal includes a conductive portion from which the insulative layer is removed but the galvanized layer remains and is exposed in the first sheet metal, the conductive portion formed around the first through hole, and
the screw portion of the screw member is screwed in the second through hole so that the seat surface comes in contact with the conductive portion.

13. A coupling structure provided in an image forming apparatus that forms an image on a recording material and constituted to couple a sheet metal member having an insulative layer on a galvanized layer on a surface of a metal layer and a control board that controls the image forming apparatus, the coupling structure comprising:
a first conductive portion from which the insulative layer is removed but the galvanized layer remains and is exposed in the sheet metal member;
a second conductive portion formed on the control board; and
a coupling portion constituted to couple the sheet metal member and the control board in a state in which at least a part of the first conductive portion and at least a part of the second conductive portion are contacted with each other.

14. The coupling structure according to claim 13, wherein the second conductive portion includes a solder welded to the control board to project toward the first conductive portion.

15. The coupling structure according to claim 13,
wherein the control board is provided with a first through hole,
wherein the sheet metal member is provided with a second through hole,
wherein the coupling portion is a screw member including a conductive member having a head portion having a seat surface and a screw portion inserted into the first through hole and the second through hole,
wherein a diameter of the first through hole is smaller than a diameter of the head portion,
wherein a diameter of the second through hole is smaller than the diameter of the first through hole, and
wherein the screw member couples the sheet metal member and the control board in a state the first conductive portion and the second conductive portion are pressed with each other by the screw portion being screwed into the second through hole without the seat surface penetrating through the first through hole.

16. The coupling structure according to claim 15, wherein the first conductive portion is formed around the second through hole and the second conductive portion is formed around the first through hole.

17. The coupling structure according to claim 15, wherein the control board includes a third conductive portion contacting the head portion of the screw member,
the second through hole of the sheet metal member contacts the screw portion of the screw member, and
the control board and the sheet metal member are made to conducted by the screw member.

18. The coupling structure according to claim 13, wherein the coupling portion is a holding portion provided on the sheet metal member and constituted to hold the control board in a state of being positioned to the coupling portion.

19. The coupling structure according to claim 13,
wherein the image forming apparatus has an electric component box constituted to accommodate a control board that controls the image forming apparatus, and an attaching member to which the electric component box is attached,
wherein the electric component box includes a casing and a cover,
wherein the sheet metal member is the casing.

* * * * *